(12) United States Patent
Yuda et al.

(10) Patent No.: US 9,525,480 B2
(45) Date of Patent: Dec. 20, 2016

(54) OPTICAL COMMUNICATION MODULE, OPTICAL NETWORK UNIT, AND METHOD OF CONTROLLING LIGHT-EMITTING ELEMENT

(71) Applicant: SUMITOMO ELECTRIC INDUSTRIES, LTD., Osaka-shi, Osaka (JP)

(72) Inventors: Shuitsu Yuda, Osaka (JP); Naruto Tanaka, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 12 days.

(21) Appl. No.: 14/423,451

(22) PCT Filed: Aug. 7, 2013

(86) PCT No.: PCT/JP2013/071362
§ 371 (c)(1),
(2) Date: Feb. 24, 2015

(87) PCT Pub. No.: WO2014/038338
PCT Pub. Date: Mar. 13, 2014

(65) Prior Publication Data
US 2015/0188627 A1 Jul. 2, 2015

(30) Foreign Application Priority Data

Sep. 6, 2012 (JP) .................................. 2012-195934
Apr. 19, 2013 (WO) .................. PCT/JP2013/061598

(51) Int. Cl.
*H04B 10/077* (2013.01)
*H04B 10/50* (2013.01)
(Continued)

(52) U.S. Cl.
CPC ...... *H04B 10/0775* (2013.01); *H04B 10/0773* (2013.01); *H04B 10/27* (2013.01);
(Continued)

(58) Field of Classification Search
None
See application file for complete search history.

(56) References Cited

U.S. PATENT DOCUMENTS 4,718,118 A 1/1988 Viola
4,736,155 A * 4/1988 McBrien ................ G01D 3/036
323/367

(Continued)

FOREIGN PATENT DOCUMENTS

JP S62-200929 A 9/1987
JP H09-18054 A 1/1997
(Continued)

OTHER PUBLICATIONS

IEEE Standards, "802.3ah™, IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment: Media Access Control Parameters, Physical Layers, and Management Parameters for Subscriber Access Networks", IEEE Std 802.3ah™-2004 (Amendment to IEEE Std 802.3™-2002 as amended by IEEE Stds 802.3ae™-2002, 802.3af™-2002, 802.3aj™-2003 and 802.3ak™-2004), IEEE Computer Society, Sep. 7, 2004, pp. 1-623.

*Primary Examiner* — Darren E Wolf
(74) *Attorney, Agent, or Firm* — Drinker Biddle & Reath LLP

(57) ABSTRACT

An optical communication module includes a modulation current supply circuit for supplying to a light-emitting element for transmitting a burst optical signal, a modulation
(Continued)

current having magnitude in accordance with a logical value of data to be transmitted, a light-receiving element for monitoring, for outputting a current in accordance with intensity of light received from the light-emitting element, a measurement unit for measuring an output current from the light-receiving element for monitoring at set measurement timing, an adjustment unit for adjusting magnitude of the modulation current based on a result of measurement of the output current by the measurement unit, and a measurement timing setting unit for setting measurement timing based on a control signal for controlling transmission of the burst optical signal.

47 Claims, 33 Drawing Sheets

(51) Int. Cl.
*H04B 10/54* (2013.01)
*H04B 10/27* (2013.01)
*H01S 5/042* (2006.01)
*H01S 5/0683* (2006.01)

(52) U.S. Cl.
CPC ..... *H04B 10/502* (2013.01); *H04B 10/50572* (2013.01); *H04B 10/541* (2013.01); *H01S 5/0427* (2013.01); *H01S 5/06832* (2013.01)

(56) References Cited

U.S. PATENT DOCUMENTS

| | | |
|---|---|---|
| 5,978,124 A | 11/1999 | Maekawa et al. |
| 7,174,099 B1 | 2/2007 | Chinn et al. |
| 2006/0126683 A1 | 6/2006 | Kang et al. |
| 2012/0033980 A1* | 2/2012 | Dong .................. H04B 10/693 398/202 |

FOREIGN PATENT DOCUMENTS

| | | |
|---|---|---|
| JP | 2002-141606 A | 5/2002 |
| JP | 2005-123350 A | 5/2005 |
| JP | 2006-174403 A | 6/2006 |
| WO | WO-98/43330 A1 | 10/1998 |
| WO | WO 98/43330 A1 | 10/1998 |
| WO | WO-2007103803 A2 | 9/2007 |

* cited by examiner

OPTICAL COMMUNICATION MODULE, OPTICAL NETWORK UNIT, AND METHOD OF CONTROLLING LIGHT-EMITTING ELEMENT

TECHNICAL FIELD

The present invention relates to an optical communication module, an optical network unit, and a method of controlling a light-emitting element. In particular, the present invention relates to an optical communication module monitoring a transmitted optical signal, an optical network unit, and a method of controlling a light-emitting element.

BACKGROUND ART

The Internet has widely been used in recent years and users can access various types of information on sites operated all over the world and can obtain such information. Use of devices adapted to broadband access such as asymmetric digital subscriber line (ADSL) and fiber to the home (FTTH) has also rapidly spread accordingly.

IEEE Std 802.3ah™-2004 (NPD 1) discloses one scheme for a passive optical network (PON). The passive optical network realizes medium-sharing-type communication in which a plurality of optical network units (ONUs) share an optical communication line and transmit data with an optical line terminal (OLT). Namely, NPD 1 defines Ethernet® PON (EPON), under which all information including user information passing through a PON and control information for administering and operating a PON is communicated in a form of an Ethernet® frame as well as an access control protocol (multi-point control protocol (MPCP)) and an operations, administration and maintenance (OAM) protocol for EPON. By exchanging MPCP frames between an optical line terminal and an optical network unit, joining, leaving, upstream multiple access control, or the like of an optical network unit is carried out. NPD 1 describes a method of registering a new optical network unit, a report showing a request for allocation of a band, and a gate indicating a transmission instruction based on an MPCP message.

A gigabit Ethernet® passive optical network (GE-PON) is an EPON realizing a communication rate of 1 gigabit/second. A next-generation technique for the GE-PON includes 10 G-EPON standardized as IEEE802.3av™-2009. 10 G-EPON is an EPON in which a communication rate is adapted to 10 gigabits/second. In 10 G-EPON as well, an access control protocol is premised on the MPCP.

A light-emitting element generally used as a light emitter for transmission in an optical communication device such as an ONU and an optical line terminal has optical characteristics as follows. Namely, light emission efficiency representing relation between an injected current and output light has strong temperature dependency. Aging of a light-emitting element also deteriorates characteristics of light emission efficiency. Therefore, it is important to control the light-emitting element in order to adapt to an environmental temperature in a wide range and aging and to obtain desired optical output power, that is, DC characteristics, and a desired extinction ratio, that is, AC characteristics.

For an ONU adapted to 10 G-EPON, for example, a direct modulation scheme in which a bias current and a modulation current supplied to a light-emitting element are directly controlled has been adopted. Here, the modulation current is a current having magnitude in accordance with a logical value of data to be transmitted.

In this direct modulation scheme, for a bias current, for example, such a method that a light-receiving element for monitoring receives backward light in proportion to forward light from a light-emitting element and feedback of a quantity of received light is given to a bias current supply circuit has been adopted.

For a modulation current, a method of feedforward control with the use of a look-up table showing correspondence between an ambient temperature of a device and a control value for a modulation current is possible.

Alternatively, as a method of controlling a modulation current, in an optical communication device of a relatively low speed such as 1 Gbps and 2.5 Gbps, a method of feedback control to a modulation current supply circuit by sensing amplitude of a signal output from a light-receiving element for monitoring also for a modulation current is possible (for example, see PTD 1 (WO2007/103803)).

A scheme below is possible for an optical communication device in which optical signals are successively transmitted. Namely, separately from a main signal, for example, with a period of approximately 100 ms, a low-speed and low pilot current having amplitude corresponding to several % of amplitude of the main signal is superimposed on a supply current for a light-emitting element. An amount of change in signal having the period of approximately 100 ms based on backward light is monitored. Then, light emission efficiency is calculated based on a result of monitoring, and feedback of the result of calculation is given to a modulation current supply circuit (see, for example, PTD 2 (WO98/43330)).

CITATION LIST

Patent Document

PTD 1: WO2007/103803
PTD 2: WO98/43330

Non Patent Document

NPD 1: IEEE Std 802.3ah™-2004

SUMMARY OF INVENTION

Technical Problem

With a method of feedforward control of a modulation current as above, an appropriate modulation current can be set so as to adapt to change in environmental temperature. It is difficult, however, to set an appropriate modulation current so as to adapt to aging of a light-emitting element.

In order to create a look-up table for a modulation current as above, for example, a three-point approximate expression including, for example, values for modulation currents at a low temperature, a room temperature, and a high temperature should be used, and hence cost for creation is high.

Then, feedback control using a light-receiving element for monitoring also for a modulation current as in the technique described in PTD 1 is preferred. For example, in 10 G-EPON, a scrambled optical signal of 10 Gbps should be monitored. It is difficult, however, to monitor stable amplitude of the optical signal due to influence by a parasitic capacitance of the light-receiving element for monitoring.

For example, when the light-receiving element for monitoring has a parasitic capacitance of 10 pF and a series resistance of 500Ω, a time constant is 5 ns. With such a time constant, for example, when an optical signal of data, in which a "0" signal and a "1" signal are alternately transmitted, such as "0101", is monitored, the optical signal has a basic frequency of approximately 5 GHz, that is, a period of 200 ps (picosecond). Therefore, a band for monitoring an optical signal will be insufficient.

In order to improve responsiveness of a circuit for monitoring an optical signal, use of a transimpedance amplifier for 10 Gbps is possible, however, cost for parts and cost for mounting are high. It is difficult to adopt this configuration for an ONU required to be low in cost.

With the method of superimposing a pilot current on a supply current for a light-emitting element as in the technique described in PTD 2 as well, it is difficult to satisfy a required time period of several ten us (microsecond) until a desired optical signal level is reached, with a pilot current having a cycle of approximately 100 ms, for example, with burst response of 512 ns required for an ONU of 10 G-EPON or feedback control.

A payload signal of a frame transmitted from an ONU of 10 G-EPON is a signal subjected to scrambling processing of 31 steps of pseudo random bit stream (PRBS). Namely, the maximum number of consecutive bits of the same sign is 31 and a lowest frequency component is at 4.7 Hz. Therefore, if a current higher in rate than the pilot current having a period of approximately 1.00 ms is superimposed on this signal, an amount of change in backward light cannot accurately be monitored.

This invention was made to solve the above-described problems, and an object thereof is to provide an optical communication module capable of satisfactorily monitoring a burst optical signal transmitted from a light-emitting element, appropriately controlling the light-emitting element, and achieving suppression of increase in manufacturing cost, an optical network unit, and a method of controlling a light-emitting element.

Solution to Problem

An optical communication module according to one aspect of this invention includes a modulation current supply circuit for supplying to a light-emitting element for transmitting a burst optical signal, a modulation current having magnitude in accordance with a logical value of data to be transmitted, a light-receiving element for monitoring, for outputting a current in accordance with intensity of light received from the light-emitting element, a measurement unit for measuring an output current from the light-receiving element for monitoring at set measurement timing, an adjustment unit for adjusting magnitude of the modulation current, based on a result of measurement of the output current by the measurement unit, and a measurement timing setting unit for setting the measurement timing based on a control signal for controlling transmission of the burst optical signal. The measurement unit includes a sample-and-hold circuit sampling the output current or a value corresponding to the output current within the measurement timing set by the measurement timing setting unit and holding a sampled value outside the measurement timing. The measurement timing setting unit includes a delay circuit generating the measurement timing from the control signal. The burst optical signal has a bit rate higher than 2.5 gigabits/second.

According to such a configuration, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

Preferably, the optical communication module further includes a bias current supply circuit for supplying a bias current to the light-emitting element, the modulation current supply circuit starts supply of the modulation current after the bias current supply circuit starts supply of the bias current, and the measurement timing is timing after timing of start of supply of the bias current and within a prescribed time period before timing of start of supply of the modulation current.

According to such a configuration, a DC level of the output current from the light-receiving element for monitoring is desirably measured. Therefore, additional circuits can be few and a configuration can be simplified. In addition, for example, an appropriate modulation current can be set in such an early stage that a bias current alone is supplied to the light-emitting element.

More preferably, the measurement timing is first timing after the timing of start of supply of the bias current and within the prescribed time period before the timing of start of supply of the modulation current and second timing after the timing of start of supply of the modulation current.

According to such a configuration, a more appropriate value for a modulation current can be set based on the output current from the light-receiving element for monitoring, which is measured at the timing before start of supply of the modulation current and at the timing after start of supply of the modulation current.

Preferably, the optical communication module further includes a bias current supply circuit for supplying a bias current to the light-emitting element, the bias current supply circuit stops supply of the bias current after the modulation current supply circuit stops supply of the modulation current, and the measurement timing is timing after timing of stop of supply of the modulation current and within a prescribed time period before timing of stop of supply of the bias current.

According to such a configuration, a DC level of the output current from the light-receiving element for monitoring is desirably measured. Therefore, additional circuits can be few and a configuration can be simplified. In addition, for example, an appropriate modulation current can be set in such an early stage that a bias current alone is supplied to the light-emitting element.

More preferably, the measurement timing is first timing after the timing of stop of supply of the modulation current and within the prescribed time period before the timing of stop of supply of the bias current and second timing before the timing of stop of supply of the modulation current.

According to such a configuration, a more appropriate value for a modulation current can be set based on the output current from the light-receiving element for monitoring, which is measured at the timing after stop of supply of the modulation current and at the timing before stop of supply of the modulation current.

More preferably, the measurement unit measures a DC level of the output current, and the adjustment unit adjusts magnitude of the modulation current such that a DC level of the output current measured at the second timing is a prescribed number of times as high as a DC level of the output current measured at the first timing.

According to such a configuration, with the DC level of the output current from the light-receiving element for monitoring before start of supply of the modulation current being defined as the reference, an output current from the light-receiving element for monitoring after start of supply of the modulation current can appropriately be set.

Preferably, the measurement timing is included in a section of a prescribed bit string in the burst optical signal.

According to such a configuration, measurement can be conducted at timing when an output current from the light-receiving element for monitoring is stabilized, and a more appropriate value for a modulation current can be set.

More preferably, the measurement unit measures amplitude of the output current in the section, and the adjustment unit adjusts magnitude of the modulation current such that the amplitude measured by the measurement unit attains to a target value.

According to such a configuration, a set value for a modulation current can appropriately be calculated from amplitude of the output current from the light-receiving element for monitoring which is measured at timing when the output current from the light-receiving element for monitoring is stabilized.

More preferably, the optical communication module further includes a pilot current generation unit for generating a pilot current lower than the modulation current and superimposing the generated pilot current on a point of influence influencing the output current, and the adjustment unit adjusts magnitude of the modulation current based on relation between the point of influence and a result of measurement by the measurement unit.

Thus, with the use of a pilot signal more stable in amplitude than the burst optical signal, more accurate feedback control of the modulation current can be carried out.

More preferably, the optical communication module further includes a bias current supply circuit for supplying a bias current to the light-emitting element, the adjustment unit further adjusts magnitude of the bias current based on a result of measurement of the output current by the measurement unit, the measurement unit further measures the bias current, the pilot current generation unit superimposes the pilot current on the output current as the point of influence, and the adjustment unit adjusts magnitude of the modulation current such that variation in bias current corresponding to variation in output current attains to a target value.

According to such a configuration, a target on which a pilot current is superimposed can appropriately be selected and feedback control of a modulation current can satisfactorily be carried out.

More preferably, the optical communication module further includes a bias current supply circuit for supplying a bias current to the light-emitting element, the pilot current generation unit superimposes the pilot current on the bias current as the point of influence, and the adjustment unit adjusts magnitude of the modulation current such that variation in output current corresponding to variation in pilot current attains to a target value.

According to such a configuration, a target on which a pilot current is superimposed can appropriately be selected and feedback control of a modulation current can satisfactorily be carried out.

More preferably, the pilot current generation unit superimposes the pilot current on the modulation current as the point of influence, and the adjustment unit adjusts magnitude of the modulation current such that variation in output current corresponding to variation in pilot current attains to a target value.

According to such a configuration, a target on which a pilot current is superimposed can appropriately be selected and feedback control of a modulation current can satisfactorily be carried out.

More preferably, the measurement unit measures amplitude of the output current in the section, and the pilot current generation unit generates a pilot current having a frequency lower than a modulation rate of the burst optical signal and having amplitude smaller than amplitude of the modulation current by a prescribed ratio or higher.

According to such a configuration, measurement can be conducted at timing when an output current from the light-receiving element for monitoring is stabilized, and a more appropriate value for a modulation current can be set.

More preferably, the frequency of the pilot current is higher than a reciprocal of a length of the section.

According to such a configuration, change in amplitude of the output current from the light-receiving element for monitoring can be measured at least once in one synchronous pattern section, and setting of the modulation current can be changed. Therefore, a time period required until the modulation current converges to a desired value can be shortened.

More preferably, the measurement unit measures a DC level of the output current in the section, and the pilot current generation unit generates a pilot current having a current value smaller than amplitude of the modulation current and varies a current value of the pilot current supplied to the point of influence, with the burst optical signal being defined as a unit.

According to such a configuration, an output current itself rather than variation in output current from the light-receiving element for monitoring should only be measured. Therefore, the number of times of sampling of the output current can be decreased.

Preferably, the measurement timing is first timing included in a section of a prescribed bit string in the burst optical signal and second timing after timing of start of supply of the modulation current.

According to such a configuration, measurement can be conducted at timing when an output current from the light-receiving element for monitoring is stabilized, and a more appropriate value for a modulation current can be set.

Preferably, the measurement unit measures a peak level of the output current in the section of the prescribed bit string at the first timing and measures a DC level of the output current at the second timing. The adjustment unit adjusts magnitude of the modulation current such that the DC level of the output current measured at the second timing is a prescribed number of times as high as the peak level of the output current measured at the first timing.

According to such a configuration, an output current at the time when an amount of current is large can be monitored. Thus, an output current from the light-receiving element for monitoring after start of supply of the modulation current can appropriately be set. In addition, since a section of a prescribed bit string in a burst optical signal is later than the timing of start of supply of the bias current, a long response time required of the measurement timing setting unit can be set.

Preferably, the optical communication module further includes a bias current supply circuit for supplying a bias current to the light-emitting element and a current/voltage conversion unit converting the output current to a voltage.

The measurement unit measures the output current by measuring an output voltage from the current/voltage conversion unit.

According to such a configuration, since a bias settling section can be shortened, an output current can appropriately be sampled even though a pre-bias section of a burst optical signal is short.

More preferably, the modulation current supply circuit starts supply of the modulation current after the bias current supply circuit starts supply of the bias current. The measurement timing is timing after timing of issuance of an instruction for permitting transmission of the burst optical signal and within a prescribed time period before timing of start of supply of the modulation current.

According to such a configuration, since a bias settling section can be shortened, an output current can appropriately be sampled even though a pre-bias section of a burst optical signal is short.

Preferably, the measurement timing is first timing after timing of start of supply of the bias current and within a prescribed time period before timing of start of supply of the modulation current and second timing after the timing of start of supply of the modulation current.

According to such a configuration, a DC level of an output current can more accurately be measured.

More preferably, the optical communication module further includes a voltage/current conversion unit converting the voltage from the current/voltage conversion unit to a second output current. The adjustment unit adjusts magnitude of the bias current based on the second output current from the voltage/current conversion unit.

According to such a configuration, the current/voltage conversion unit converts an output current from the light-receiving element for monitoring to a voltage. For example, when an output current from the light-receiving element for monitoring is supplied to the adjustment unit by means of a current mirror circuit, a differential resistance value of a transistor forming the current mirror circuit may affect a time constant (responsiveness). According to the configuration above, with the use of the voltage/current conversion unit, adjustment of a bias current by the adjustment unit can be separate from measurement of an output current from the light-receiving element for monitoring by the measurement unit. Therefore, a frequency band for monitoring an output current from the light-receiving element for monitoring can be broadened.

Preferably, the optical communication module further includes a storage unit for storing information representing a ratio between magnitude of the output current and magnitude of the modulation current, and the adjustment unit adjusts magnitude of the modulation current by using the information.

According to such a configuration, an arbitrary extinction ratio can be obtained by rewriting information in the storage unit. In addition, a set value for the modulation current can be calculated from the output current from the light-receiving element for monitoring, through simplified processing.

Preferably, the optical communication module further includes a storage unit for storing correspondence between an ambient temperature of the optical communication module and an initial value for the modulation current and an initial value updating unit for changing the initial value corresponding to the detected ambient temperature of the optical communication module to currently measured amplitude of the output current in the correspondence when an amount of change to currently measured amplitude of the output current from amplitude of the output current previously measured by the measurement unit is smaller than a prescribed value.

According to such a configuration, a time period required until the modulation current converges to a desired value can be shortened. In addition, a look-up table can address not only change in environmental temperature but also aging.

An optical communication module according to another aspect of this invention includes a modulation current supply circuit for supplying to a light-emitting element for transmitting a burst optical signal, a modulation current having magnitude in accordance with a logical value of data to be transmitted, a light-receiving element for monitoring, for outputting a current in accordance with intensity of light received from the light-emitting element, a measurement unit for measuring an output current from the light-receiving element for monitoring at set measurement timing, an adjustment unit for adjusting magnitude of the modulation current based on a result of measurement of the output current by the measurement unit, and a measurement timing setting unit for setting the measurement timing based on a control signal for controlling transmission of the burst optical signal. The measurement unit includes a sample-and-hold circuit sampling the output current or a value corresponding to the output current within the measurement timing set by the measurement timing setting unit and holding a sampled value outside the measurement timing. The measurement timing setting unit includes a delay circuit generating the measurement timing from the control signal. The burst optical signal has a bit rate higher than a speed of response of the measurement unit to the output current.

According to such a configuration, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

An optical network unit according to one aspect of this invention is an optical network unit for transmitting and receiving an optical signal to and from an optical line terminal, and it includes a light-emitting element for transmitting a burst optical signal, a modulation current supply circuit for supplying to the light-emitting element, a modulation current having magnitude in accordance with a logical value of data to be transmitted, a light-receiving element for monitoring, for outputting a current in accordance with intensity of light received from the light-emitting element, a measurement unit for measuring an output current from the light-receiving element for monitoring at set measurement timing, an adjustment unit for adjusting magnitude of the modulation current based on a result of measurement of the output current by the measurement unit, a measurement timing setting unit for setting the measurement timing, and a control unit for controlling an optical communication module including at least the light-emitting element and the light-receiving element for monitoring. The control unit outputs a control signal for controlling transmission of the burst optical signal to the optical communication module. The measurement timing setting unit sets the measurement timing based on the control signal. The measurement unit includes a sample-and-hold circuit sampling the output current or a value corresponding to the output current within the measurement timing set by the measurement timing setting unit and holding a sampled value outside the measurement timing. The measurement timing setting unit includes a delay circuit generating the measurement timing from the control signal. The burst optical signal has a bit rate higher than 2.5 gigabits/second.

According to such a configuration, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

Preferably, the measurement timing includes non-transmission timing at which the burst optical signal is not transmitted.

According to such a configuration, a more appropriate value for a modulation current can be set. For example, a part used for the measurement unit may have temperature dependency of an input/output offset. Such temperature dependency may bring about temperature dependency of an extinction ratio. Then, an output current from the light-receiving element for monitoring is measured at timing when no burst optical signal is transmitted. With such measurement, the adjustment unit can use the measured value for adjusting magnitude of the modulation current. Therefore, a more appropriate value for a modulation current can be set.

More preferably, the adjustment unit obtains an offset value for the light-receiving element for monitoring or the measurement unit based on the output current measured at the non-transmission timing, and adjusts magnitude of the modulation current by using the offset value.

According to such a configuration, a more appropriate value for a modulation current can be set.

An optical network unit according to another aspect of this invention is an optical network unit for transmitting and receiving an optical signal to and from an optical line terminal, and it includes a light-emitting element for transmitting a burst optical signal, a modulation current supply circuit for supplying to the light-emitting element, a modulation current having magnitude in accordance with a logical value of data to be transmitted, a light-receiving element for monitoring, for outputting a current in accordance with intensity of light received from the light-emitting element, a measurement unit for measuring an output current from the light-receiving element for monitoring at set measurement timing, an adjustment unit for adjusting magnitude of the modulation current based on a result of measurement of the output current by the measurement unit, a measurement timing setting unit for setting the measurement timing, and a control unit for controlling an optical communication module including at least the light-emitting element and the light-receiving element for monitoring. The control unit outputs a control signal for controlling transmission of the burst optical signal to the optical communication module. The measurement timing setting unit sets the measurement timing based on the control signal. The measurement unit includes a sample-and-hold circuit sampling the output current or a value corresponding to the output current within the measurement timing set by the measurement timing setting unit and holding a sampled value outside the measurement timing. The measurement timing setting unit includes a delay circuit generating the measurement timing from the control signal. The burst optical signal has a bit rate higher than a speed of response of the measurement unit to the output current.

According to such a configuration, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

A method of controlling a light-emitting element according to one aspect of this invention includes the steps of setting measurement timing to measure an output current from a light-receiving element for monitoring, which outputs a current in accordance with intensity of light received from a light-emitting element for transmitting a burst optical signal based on a delay circuit and a control signal for controlling transmission of the burst optical signal, measuring the output current at the set measurement timing, sampling the output current or a value corresponding to the output current within the set measurement timing and holding a sampled value outside the measurement timing, and adjusting magnitude of a modulation current which is to be supplied to the light-emitting element and has magnitude in accordance with a logical value of data to be transmitted, based on a result of measurement of the output current, and the burst optical signal has a bit rate higher than 2.5 gigabits/second.

Thus, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

A method of controlling a light-emitting element according to another aspect of this invention includes the steps of setting measurement timing to measure an output current from a light-receiving element for monitoring, which outputs a current in accordance with intensity of light received from a light-emitting element for transmitting a burst optical signal, based on a delay circuit and a control signal for controlling transmission of the burst optical signal, measuring the output current at the set measurement timing, sampling the output current or a value corresponding to the output current within the set measurement timing and holding a sampled value outside the measurement timing, and adjusting magnitude of a modulation current which is to be supplied to the light-emitting element and has magnitude in accordance with a logical value of data to be transmitted, based on a result of measurement of the output current, and the burst optical signal has a bit rate higher than a response speed in measurement of the output current.

Thus, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element. Therefore, a burst optical signal transmitted from a light-emitting element can satisfactorily be monitored, the light-emitting element can appropriately be controlled, and increase in manufacturing cost can be suppressed.

Advantageous Effects of Invention

According to the present invention, a burst optical signal transmitted from a light-emitting element can satisfactorily be monitored, the light-emitting element can appropriately be controlled, and increase in manufacturing cost can be suppressed.

DESCRIPTION OF EMBODIMENTS

Figure 1:
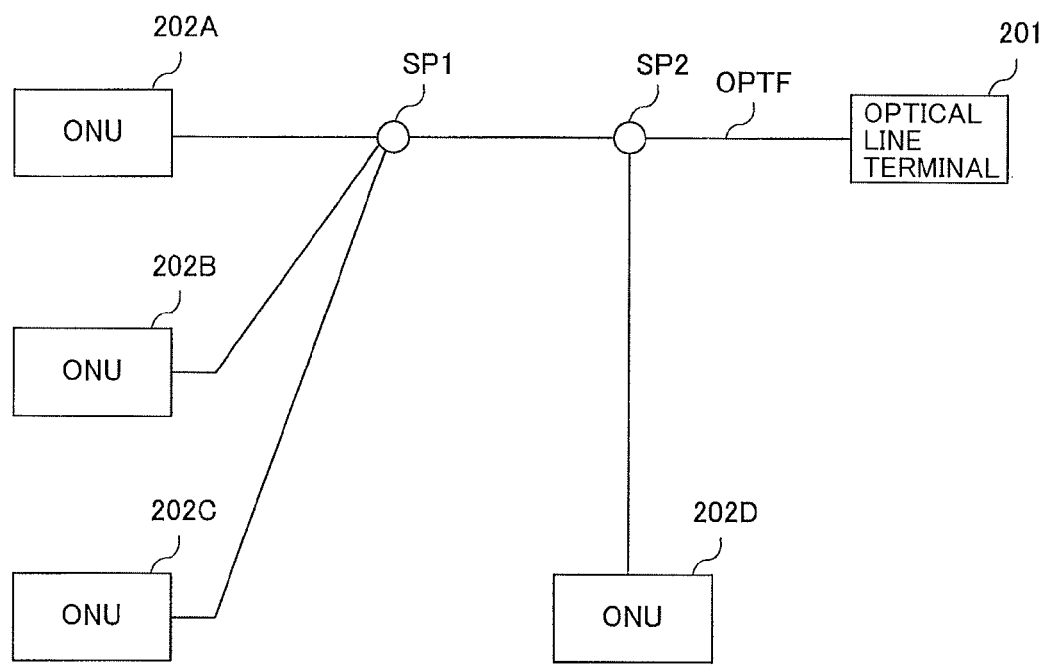
FIG. 1 is a diagram showing a configuration of a PON system according to a first embodiment of the present invention.

An embodiment of the present invention will be described hereinafter with reference to the drawings. The same or corresponding elements in the drawings have the same reference characters allotted and description thereof will not be repeated.

First Embodiment

FIG. 1 is a diagram showing a configuration of a PON system according to a first embodiment of the present invention.

Referring to FIG. 1, a PON system 301 is, for example, a 10 G-EPON, and includes ONUs 202A, 202B, 202C, and 202D, an optical line terminal 201, and splitters SP1 and SP2. Each of ONUs 202A, 202B, and 202C and optical line terminal 201 are connected to each other through splitters SP1 and SP2 and an optical fiber OPTF, and transmit and receive an optical signal to and from each other. ONU 202D and optical line terminal 201 are connected to each other through splitter SP2 and optical fiber OPTF, and transmit and receive an optical signal to and from each other. In PON system 301, optical signals from ONUs 202A, 202B, 202C, and 202D to optical line terminal 201 are time division multiplexed.

Figure 2:
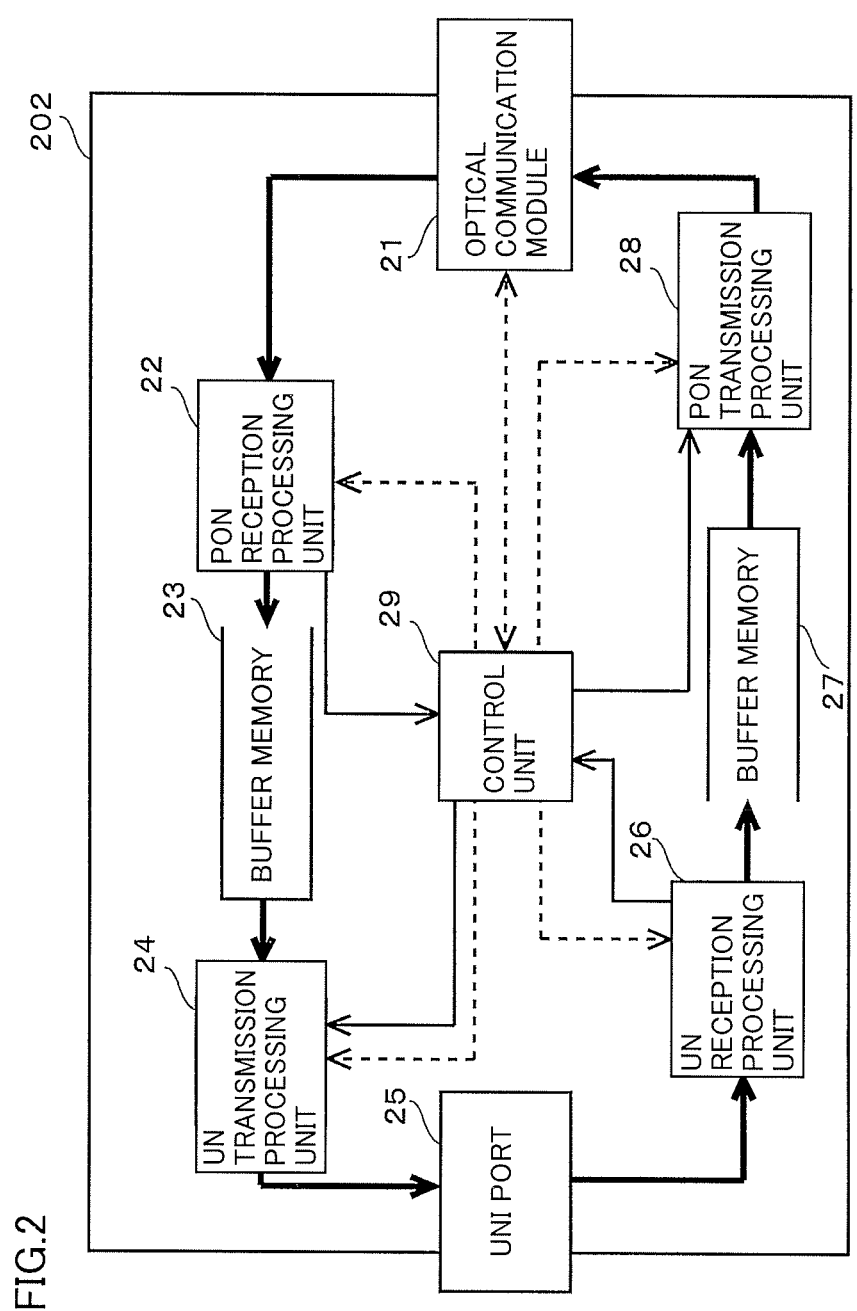
FIG. 2 is a diagram showing a configuration of an optical network unit in the PON system according to the first embodiment of the present invention.

FIG. 2 is a diagram showing a configuration of an optical network unit in the PON system according to the first embodiment of the present invention.

Referring to FIG. 2, ONU 202 includes an optical communication module 21, a PON reception processing unit 22, a buffer memory 23, a UN transmission processing unit 24, a user network interface (UNI) port 25, a UN reception processing unit 26, a buffer memory 27, a PON transmission processing unit 28, and a control unit 29.

Optical communication module 21 is attachable to and removable from ONU 202. Optical communication module 21 receives a downlink optical signal transmitted from optical line terminal 201, and converts the downlink optical signal to an electric signal and outputs the electric signal.

PON reception processing unit 22 reconfigures a frame from the electric signal received from optical communication module 21 and distributes the frame to control unit 29 or UN transmission processing unit 24 in accordance with a type of the frame. Specifically, PON reception processing unit 22 outputs a data frame to UN transmission processing unit 24 through buffer memory 23 and outputs a control frame to control unit 29.

Control unit 29 generates a control frame including various types of control information and outputs the control frame to UN transmission processing unit 24.

UN transmission processing unit 24 transmits a data frame received from PON reception processing unit 22 and a control frame received from control unit 29 to a user terminal such as a not-shown personal computer through UNI port 25.

UN reception processing unit 26 outputs a data frame received from the user terminal through UNI port 25 to PON transmission processing unit 28 through buffer memory 27. UN reception processing unit 26 outputs a control frame received from the user terminal through UNI port 25 to control unit 29.

Control unit 29 performs optical-network-unit-side processing relating to control and administration of a PON line between optical line terminal 201 and ONU 202, such as MPCP and OAM. Namely, control unit 29 carries out various types of control such as access control, by exchanging an MPCP message and an OAM message with optical line terminal 201 connected to the PON line. Control unit 29 generates a control frame including various types of control information and outputs the control frame to PON transmission processing unit 28. Control unit 29 performs various types of processing for setting each unit in ONU 202.

PON transmission processing unit 28 outputs a data frame received from UN reception processing unit 26 and a control frame received from control unit 29 to optical communication module 21.

Optical communication module 21 converts the data frame and the control frame received from PON transmission processing unit 28 to an optical signal and transmits the optical signal to optical line terminal 201.

Figure 3:
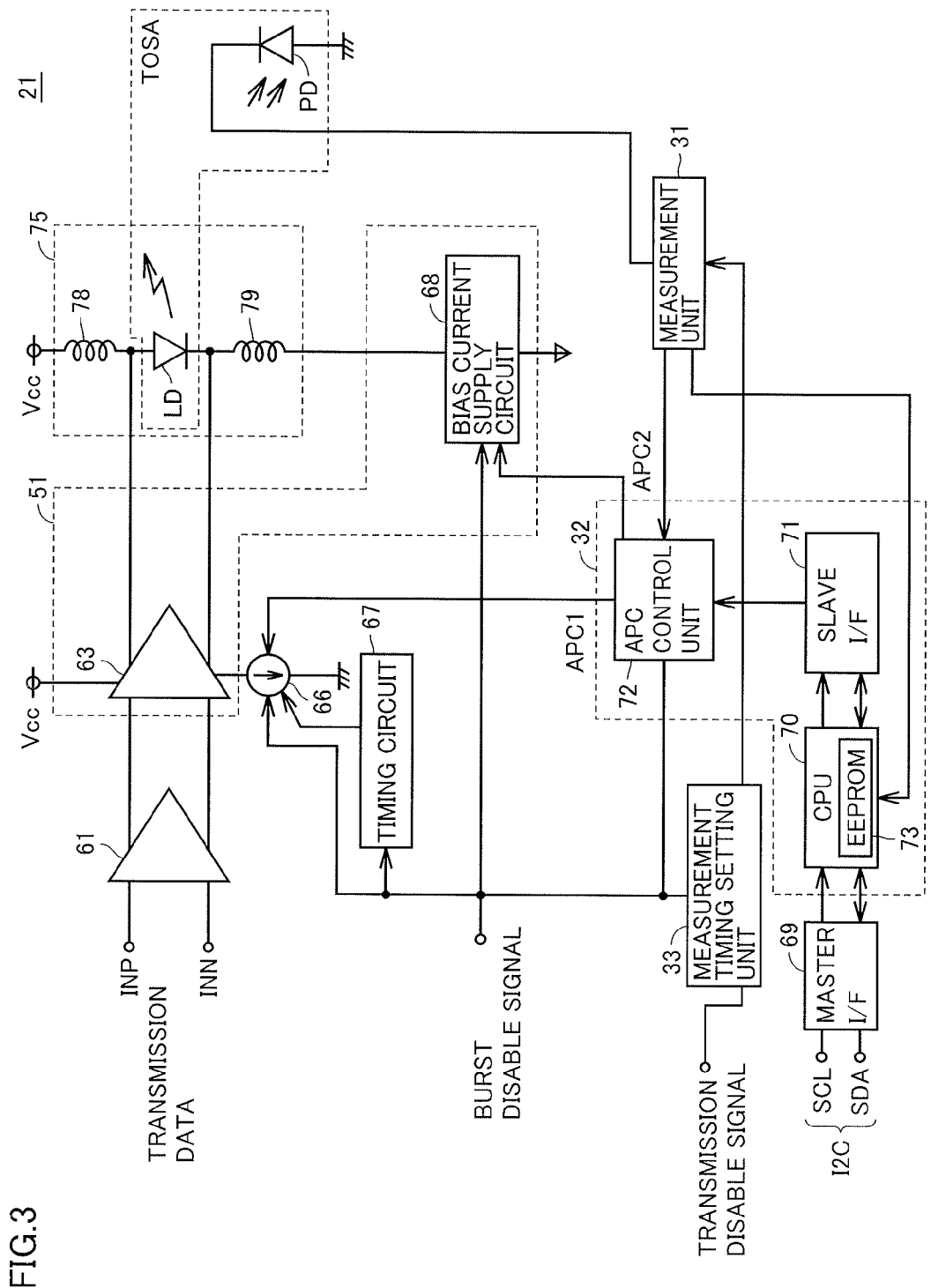
FIG. 3 is a diagram showing a configuration of an optical communication module in the optical network unit according to the first embodiment of the present invention.

FIG. 3 is a diagram showing a configuration of the optical communication module in the optical network unit according to the first embodiment of the present invention.

Referring to FIG. 3, optical communication module 21 includes a measurement unit 31, an adjustment unit 32, a measurement timing setting unit 33, a preamplifier 61, a drive circuit 51, a power supply 66, a timing circuit 67, a light-emitting circuit 75, a light-receiving element for monitoring PD, and a master interface (I/F) 69. Adjustment unit 32 includes a central processing unit (CPU) 70, a slave I/F 71, and an auto power control (APC) control unit 72. Drive circuit 51 includes an output buffer circuit (a modulation current supply circuit) 63 and a bias current supply circuit 68. Light-emitting circuit 75 includes a light-emitting element LD and inductors 78 and 79. CPU 70 includes a storage unit 73 which is implemented, for example, by an electrically erasable programmable read only memory (EEPROM).

For example, preamplifier 61, drive circuit 51, power supply 66, timing circuit 67, measurement unit 31, adjustment unit 32, and measurement timing setting unit 33 are mounted on a print circuit board (PCB). For example, light-emitting element LD and light-receiving element for monitoring PD are contained in an assembled light-emitting module (hereinafter also referred to as a transmitter optical sub-assembly: TOSA). For example, a flexible print circuit board (FPC) connects the print circuit board and the TOSA to each other. Namely, the optical communication module according to the first embodiment of the present invention can be implemented as an optical transmitter having a function to transmit an optical signal.

Light-emitting element LD and light-receiving element for monitoring PD may be contained in a bi-directional optical sub-assembly (BOSA) assembled together with a light-receiving element for receiving a downlink optical signal. In this case, a transmission unit of the BOSA corresponds to the TOSA shown in FIG. 3. The optical communication module according to the first embodiment of the present invention can be implemented as an optical transceiver having a function to transmit and receive an optical signal.

Preamplifier 61 receives transmission data which is a data frame from UN reception processing unit 26 and a control frame from control unit 29 and amplifies and outputs the transmission data. For example, preamplifier 61 receives the transmission data as a balanced signal from signal lines INP and INN.

Drive circuit 51 drives light-emitting element LD in light-emitting circuit 75. More specifically, output buffer circuit 63 includes a differential drive circuit having, for example, two transistors. Output buffer circuit 63 supplies a differential modulation current to light-emitting circuit 75 based on the transmission data received from preamplifier 61. This modulation current is a current having magnitude in accordance with a logical value of data to be transmitted to optical line terminal 201. With a configuration including the differential drive circuit, a speed of response of a modulation current to change in logical value of the transmission data can be improved.

Light-emitting circuit 75 transmits an uplink optical signal to optical line terminal 201. In light-emitting circuit 75, light-emitting element LD is electrically connected to a power supply node supplied with a fixed voltage such as a power supply voltage Vcc and transmits an optical signal. Specifically, light-emitting element LD is connected to the power supply node supplied with power supply voltage Vcc through inductor 78 and connected to bias current supply circuit 68 through inductor 79. Light-emitting element LD emits light and changes intensity of light emission based on a bias current supplied from bias current supply circuit 68 and a modulation current supplied from output buffer circuit 63.

Power supply 66 can supply, for example, a current as electric power to output buffer circuit 63, and can control start and stop of supply of electric power. More specifically, power supply 66 switches whether or not to supply electric power to output buffer circuit 63 based on a burst disable signal received from control unit 29.

Specifically, power supply 66 supplies electric power to output buffer circuit 63 when a burst disable signal is inactivated. Power supply 66 stops supply of electric power when the burst disable signal is activated.

Timing circuit 67 carries out control for forcibly stopping supply of a modulation current from output buffer circuit 63 to light-emitting element LD.

Bias current supply circuit 68 supplies a bias current as electric power to light-emitting circuit 75. Bias current supply circuit 68 switches whether or not to supply a bias current to light-emitting circuit 75 based on a burst disable signal received from control unit 29. Here, in optical communication module 21, a value for a bias current is set such that light-emitting element LD emits light when a bias current is supplied to light-emitting element LD while magnitude of a modulation current to light-emitting element LD is zero. Optical communication module 21 does not have to include bias current supply circuit 68.

Bias current supply circuit 68 and output buffer circuit 63 start supply of a bias current Ibias and a modulation current Imod to light-emitting element LD, respectively, in accordance with timing of start of transmission of a burst optical signal. Bias current supply circuit 68 and output buffer circuit 63 stop supply of bias current Ibias and modulation current Imod to light-emitting element LD, respectively, in accordance with timing of end of transmission of the burst optical signal.

In light-emitting circuit 75, inductor 78 has a first and electrically connected to the power supply node supplied with power supply voltage Vcc and a second end. Light-emitting element LD is implemented, for example, by a laser diode, and has an anode electrically connected to the second end of inductor 78 and a cathode electrically connected to a first end of inductor 79. A modulation current output from output buffer circuit 63 flows from the anode to the cathode of light-emitting element LD.

Light-receiving element for monitoring PD outputs a current in accordance with intensity of light received from light-emitting element LD. Specifically, light-receiving element for monitoring PD is implemented, for example, by a photodiode, and receives backward light in proportion to forward light of light-emitting element LD. Light-receiving element for monitoring PD outputs a current in accordance with intensity of received light, such as a current in proportion to the intensity. Light-receiving element for monitoring PD is electrically connected to a ground node supplied with a fixed voltage such as a ground voltage.

Measurement unit 31 measures output current Imon from light-receiving element for monitoring PD at measurement timing set by measurement timing setting unit 33.

Adjustment unit 32 adjusts magnitude such as amplitude of modulation current Imod based on a result of measurement of output current Imon by measurement unit 31.

Specifically, upon reception of the result of measurement by measurement unit 31, adjustment unit 32 controls an operation of light-emitting element LD in accordance with magnitude of an output current from light-receiving element for monitoring PD. For example, adjustment unit 32 determines magnitude of output current Imon. Adjustment unit 32 carries out feedback control of a modulation current based on the result of determination. Namely, the adjustment unit adjusts magnitude of the modulation current.

Measurement timing setting unit 33 sets timing of measurement by measurement unit 31 based on a control signal for controlling transmission of a burst optical signal. Specifically, measurement timing setting unit 33 measures output current Imon from light-receiving element for monitoring PD, that is, generates a gate signal indicating a period for sampling, and outputs the gate signal to measurement unit 31.

Here, a burst optical signal transmitted by light-emitting element LD has a bit rate higher than 2.5 gigabits/second. The burst optical signal transmitted by light-emitting element LD has a bit rate higher than a speed of response of measurement unit 31 to output current Imon.

Power supply 66 changes an amount of supply current to output buffer circuit 63 based on control data APC1 received from APC control unit 72.

Bias current supply circuit 68 changes an amount of supply current to light-emitting circuit 75 based on control data APC2 received from APC control unit 72.

CPU 70 exchange various types of data with control unit 29, for example, through an I2C bus constituted of a signal line SCL and a signal line SDA.

Master I/F 69 provides a function as an interface between CPU 70 and the I2C bus.

Slave I/F 71 provides a function as an interface between CPU 70 and APC control unit 72.

CPU 70 writes various types of control data into a register (not shown) of APC control unit 72 through slave I/F 71.

Figure 4:
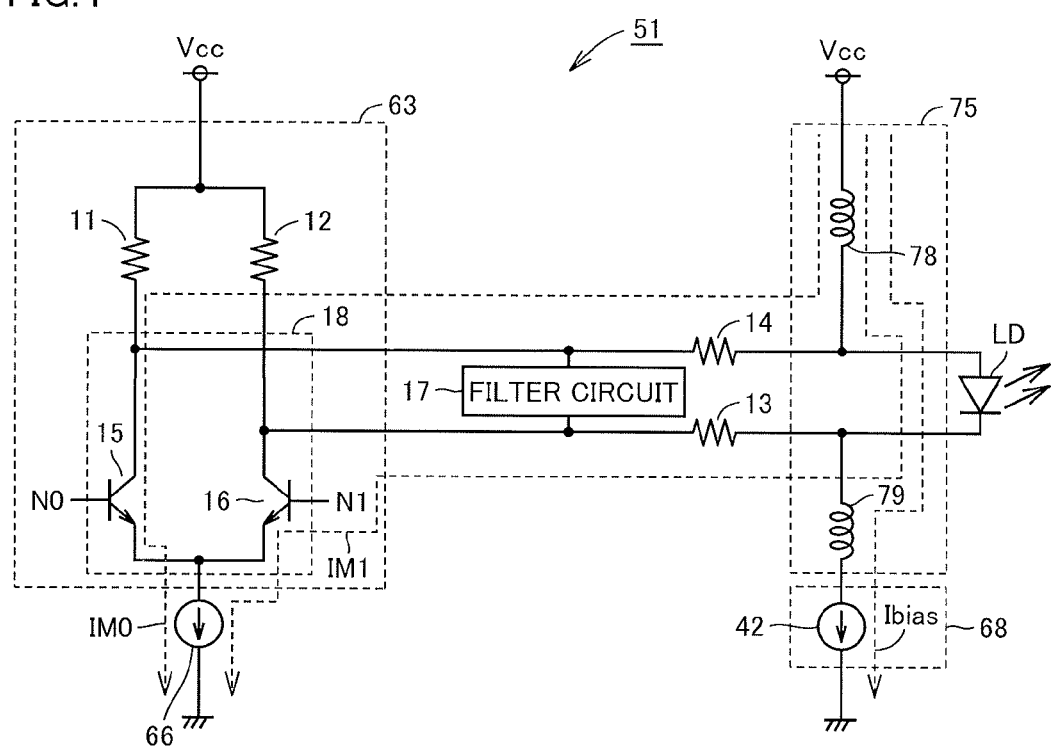
FIG. 4 is a diagram showing a configuration of a drive circuit in the optical communication module in the optical network unit according to the first embodiment of the present invention.

FIG. 4 is a diagram showing a configuration of the drive circuit in the optical communication module in the optical network unit according to the first embodiment of the present invention.

Referring to FIG. 4, drive circuit 51 further includes resistors 13 and 14 and a filter circuit 17. Output buffer circuit 63 includes resistors 11 and 12 and a differential drive circuit 18. Differential drive circuit 18 includes N-type transistors 15 and 16. Bias current supply circuit 68 includes a current source 42.

Differential drive circuit 18 switches whether or not to supply a current to light-emitting element LD, in accordance with a logical value of transmission data.

Resistors 11 and 12 are connected between differential outputs of differential drive circuit 18. Resistor 11 and resistor 12 are connected to a first electrode of N-type transistor 15 and a first electrode of N-type transistor 16, respectively.

More specifically, resistor 11 has a first end connected to a power supply node supplied with power supply voltage Vcc and a second end. Resistor 12 has a first end connected to the power supply node supplied with power supply voltage Vcc and a second end. N-type transistor 15 has the first electrode connected to the second end of resistor 11, a second electrode connected to the first end of power supply 66, and a control electrode connected to a data node N0. N-type transistor 16 has the first electrode connected to the second end of resistor 12, a second electrode connected to the first end of power supply 66, and a control electrode connected to a data node N1. The second end of power supply 66 is connected to a ground node supplied with a ground voltage. Current source 42 in bias current supply circuit 68 is connected between the second end of inductor 79 and a ground node.

Data node N0 is activated when transmission data has a logical value "0". Data node N1 is activated when transmission data has a logical value "1".

Differential drive circuit 18 and light-emitting circuit 75 are DC coupled (direct-current coupled) to each other. Namely, a connection node between N-type transistor 15 and resistor 11 is DC-coupled to a connection node between the anode of light-emitting element LD and a node supplied with power supply voltage Vcc which is a DC power supply voltage. A connection node between N-type transistor 16 and resistor 12 is DC-coupled to a connection node between the cathode of light-emitting element LD and bias current supply circuit 68.

More specifically, the connection node between the second end of resistor 11 and the first electrode of N-type transistor 15 and the connection node between the second end of inductor 78 and the anode of light-emitting element LD are connected to each other through resistor 14. The connection node between the second end of resistor 12 and the first electrode of N-type transistor 16 and the connection node between the first end of inductor 79 and the cathode of light-emitting element LD are connected to each other through resistor 13.

In output buffer circuit 63, resistors 11 and 12 are terminal resistors for impedance matching, which is useful for preventing ringing of a burst optical signal in particular in 10 G-EPON.

A differential output of differential drive circuit 18 in output buffer circuit 63 and light-emitting element LD are connected to each other through a transmission path. More specifically, the connection node between the first electrode of N-type transistor 15 and resistor 11 and the anode of light-emitting element LD are connected to each other through a transmission path such as a microstrip line. The connection node between the first electrode of N-type transistor 16 and resistor 12 and the cathode of light-emitting element LD are connected to each other through a transmission path such as a microstrip line. This transmission path has a length, for example, from 25 mm to 30 mm and a characteristic impedance, for example, of 25Ω.

An impedance of light-emitting circuit 75 and bias current supply circuit 68 does not particularly have to be taken into account. Preferably, light-emitting circuit 75 and bias current supply circuit 68 are low impedance in DC manner and high impedance in AC manner.

Resistors 13 and 14 are damping resistors provided in order to correct frequency characteristics of a burst optical signal and compensate for lowering in impedance due to a parasitic capacitance on the side of output buffer circuit 63.

Filter circuit 17 is provided between resistor 13 and resistor 14 in order to remove a high-frequency component such as a modulation current which flows between differential drive circuit 18 and light-emitting circuit 75.

An operation of drive circuit 51 is as follows. Namely, when transmission data has a logical value "1", N-type transistor 15 is turned off and N-type transistor 16 is turned on. Thus, a current IM1 flows from the power supply node of light-emitting circuit 75 through light-emitting element LD and N-type transistor 16 of differential drive circuit 18 to the ground node of output buffer circuit 63. Namely, a modulation current of magnitude to some extent is supplied to light-emitting element LD.

When transmission data has a logical value "0", N-type transistor 15 is turned on and N-type transistor 16 is turned off. Thus, a current IM0 flows from the power supply node of light-emitting circuit 75 not through light-emitting element LD but through N-type transistor 15 of differential drive circuit 18 to the ground node of output buffer circuit 63. Namely, magnitude of a modulation current to light-emitting element LD is zero.

Regardless of a logical value of transmission data, owing to current source 42, bias current Ibias flows from the power supply node of light-emitting circuit 75 through light-emitting element LD to the ground node of bias current supply circuit 68.

N-type transistors 15 and 16 can each be implemented, for example, by an NPN transistor or an N-channel MOS transistor. When each of N-type transistors 15 and 16 is implemented by an NPN transistor, the "first electrode", the "second electrode", and the "control electrode" correspond to the collector, the emitter, and the base, respectively. When each of N-type transistors 15 and 16 is implemented by an N-channel MOS transistor, the "first electrode", the "second electrode", and the "control electrode" correspond to the drain, the source, and the gate, respectively.

Figure 5:
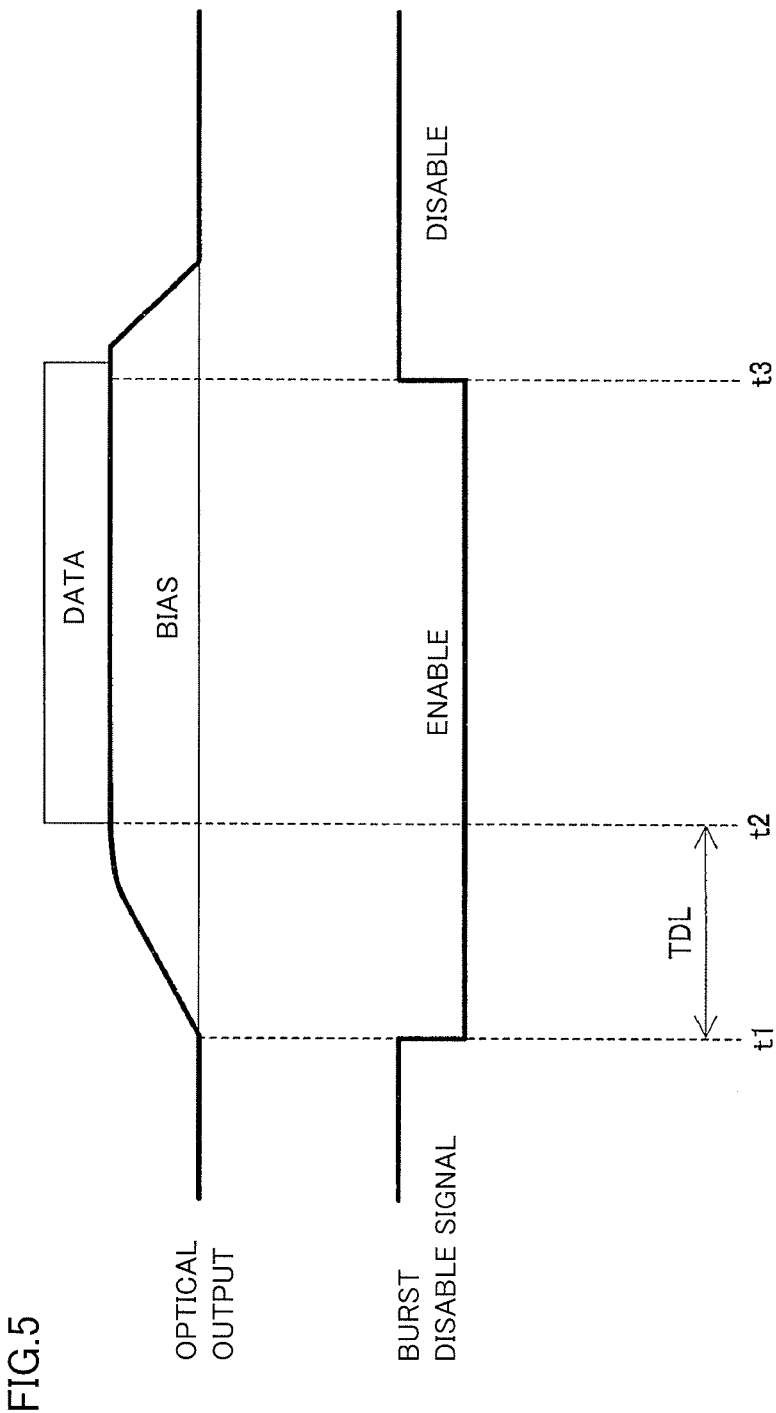
FIG. 5 is a diagram schematically showing an optical output and a burst disable signal in the optical communication module of the optical network unit according to the first embodiment of the present invention.

FIG. 5 is a diagram schematically showing an optical output and a burst disable signal in the optical communication module of the optical network unit according to the first embodiment of the present invention. A portion shown with "data" in a waveform of the optical output actually has a waveform varying between a level only having a "bias" portion and a level having a "bias" portion and a "data" portion as combined, in accordance with a logical value of transmission data.

Referring to FIG. 5, initially, during a period in which optical line terminal 201 does not permit transmission of an uplink optical signal, a burst disable signal is activated. In this case, bias current supply circuit 68 does not operate and no bias current is generated.

Then, when optical line terminal 201 permits transmission of an uplink optical signal, in order to transmit an uplink optical signal from ONU 202, a burst disable signal is inactivated (shown with "enable" in FIG. 5). Then, bias current supply circuit 68 starts to operate. Bias current supply circuit 68 generates a bias current and supplies the bias current to light-emitting element LD.

When the burst disable signal is inactivated, power supply 66 starts to operate and a current is supplied to output buffer circuit 63. A modulation current from output buffer circuit 63, however, is not supplied to light-emitting element LD under the control by timing circuit 67 (timing t1).

Namely, timing circuit 67 forcibly stops supply of a modulation current from output buffer circuit 63 to light-emitting element LD during a period from timing t1 until timing t2 after lapse of a time period TDL. Thus, since occurrence of overshoot resulting from a flow of a modulation current while a level of a bias current is unstable can be prevented, an operation of a circuit can be stabilized.

Then, when time period TDL elapses and supply of a modulation current to light-emitting element LD is started (timing t2), an idle pattern which is invalid data starts to be transmitted. Thereafter, transmission of valid data is started.

Then, in order to stop transmission of an uplink optical signal from ONU 202, a burst disable signal is activated at timing t3 (shown with "disable" in FIG. 5). Output buffer circuit 63 stops the operation and supply of the modulation current is stopped. Thereafter, bias current supply circuit 68 stops the operation and supply of the bias current is stopped.

Figure 6:
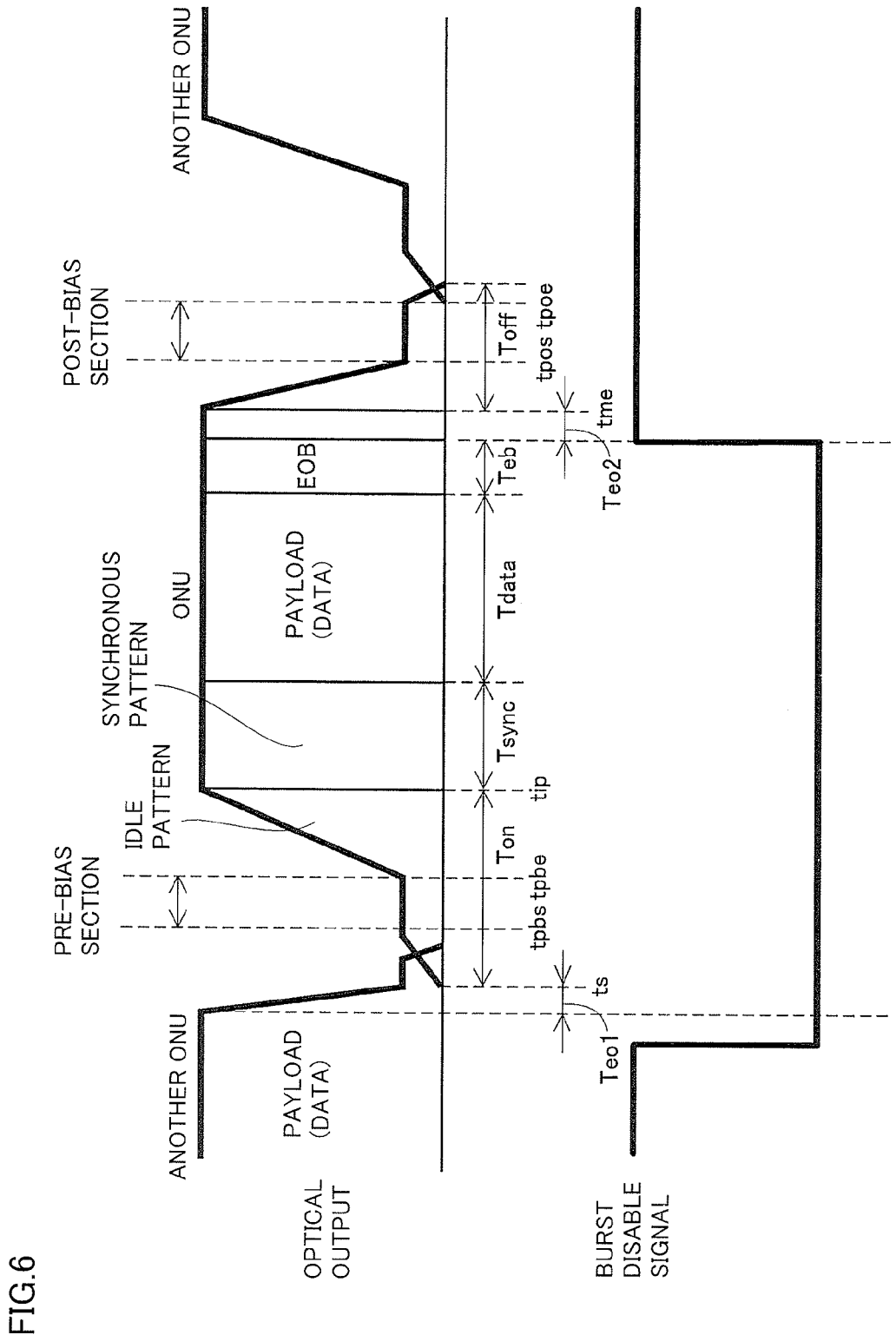
FIG. 6 is a diagram showing one example of a burst optical signal in the PON system according to the first embodiment of the present invention.

FIG. 6 is a diagram showing one example of a burst optical signal in the PON system according to the first embodiment of the present invention.

In 10 G-EPON, as compared with GE-PON, a time period for transmission of a burst optical signal from each ONU is shorter owing to a higher speed of a line, and the number of ONUs which can be connected to the optical line terminal increases. Therefore, in 10 G-EPON, an interval between burst optical signals from ONUs should be made smaller to thereby improve throughput of the PON system. Therefore, a response time required of a circuit for monitoring a burst optical signal is also shorter.

Specifically, referring to FIG. 6, for example, under IEEE 802.3av™-2009, timing of an uplink optical signal transmitted from ONU 202 is defined as follows. Namely, a synchronous pattern has a length Tsync of 1.2 us (microsecond), data, that is, payload, has a length Tdata of 208 nm (nanosecond) at the minimum, end of burst (EOB) indicating end of burst has a length Teb of 20 ns, a rise time Ton of light-emitting circuit 75 is 512 ns or shorter, and a fall time Toff of light-emitting circuit 75 is 512 ns or shorter. Tdata has a maximum value of 1.05 ins (millisecond). Tsync includes a settling time of 800 ns and a locking time of 400 ns in optical line terminal 201. At the end of a section of rise time Ton of light-emitting circuit 75, an idle pattern is transmitted.

A delay time Teo1 from inactivation of a burst disable signal until output of light from light-emitting element LD is, for example, around 2 ns. A delay time Teo2 from activation of the burst disable signal until stop of supply of modulation current Imod is, for example, around 2 ns.

For example, a length of a bias settling section from timing ts when the burst disable signal is inactivated and light-emitting element LD outputs light until timing tpbs when a bias current attains to a prescribed value is 55 ns. A length of a pre-bias section from timing tpbs until timing tpbe when a bias current is stabilized is 10 ns. A length of a section from timing tpbe of transmission of an idle pattern which is invalid data until timing tip is 447 ns.

Fall time Toff of light-emitting, circuit 75 is also referred to as a post-bias section. Fall time Toff of light-emitting circuit 75 is a section from timing tpos until timing tpoe in a section from timing tme after activation of the burst disable signal (rise of the burst disable signal) until stop of an optical output from light-emitting element LD. Timing tme is timing when delay time Teo2 has elapsed since activation of the burst disable signal.

In optical communication module 21, output buffer circuit 63 starts supply of modulation current Imod after bias current supply circuit 68 stars supply of bias current Ibias.

Then, timing to measure output current Imon is timing after timing ts of start of supply of bias current Ibias and within a prescribed time period before timing tpbe of start of supply of modulation current Imod.

Specifically, optical communication module 21 measures a bias level, that is, magnitude of output current Imon from light-receiving element for monitoring PD, during a period from timing t1 until timing t2 shown in FIG. 5. This period is specifically the pre-bias section which is a section with a bias settling section and a section of an idle pattern being excluded from the section corresponding to rise time Ton of light-emitting circuit 75 shown in FIG. 6. Then, optical communication module 21 carries out feedback control of a modulation current to light-emitting element LD by using this result of measurement, such that an extinction ratio of a burst optical signal attains to a desired value.

Here, optical communication module 21 preferably monitors output current Imon at the timing when bias current Ibias is stabilized in the pre-bias section, that is, immediately before end of the pre-bias section.

Optical communication module 21 is not limited to be configured to monitor output current Imon in the pre-bias section and may be configured to monitor output current Imon in the post-bias section.

Namely, in optical communication module 21, bias current supply circuit 68 stops supply of bias current Ibias after output buffer circuit 63 stops supply of modulation current Imod.

Then, timing to measure output current Imon is timing after timing tme of stop of supply of modulation current Imod and within a prescribed time period before timing tpoe of stop of supply of bias current Ibias.

Specifically, optical communication module 21 measures a bias level, that is, magnitude of output current Imon from light-receiving element for monitoring PD during a period from timing t3 or later shown in FIG. 5. This section is specifically the post-bias section, which is a section where a bias current is constant, of the section corresponding to fall time Toff of light-emitting circuit 75 shown in FIG. 6. Then, optical communication module 21 carries out feedback control of a modulation current to light-emitting element LD by using this result of measurement, such that an extinction ratio of a burst optical signal attains to a desired value.

Figure 7:
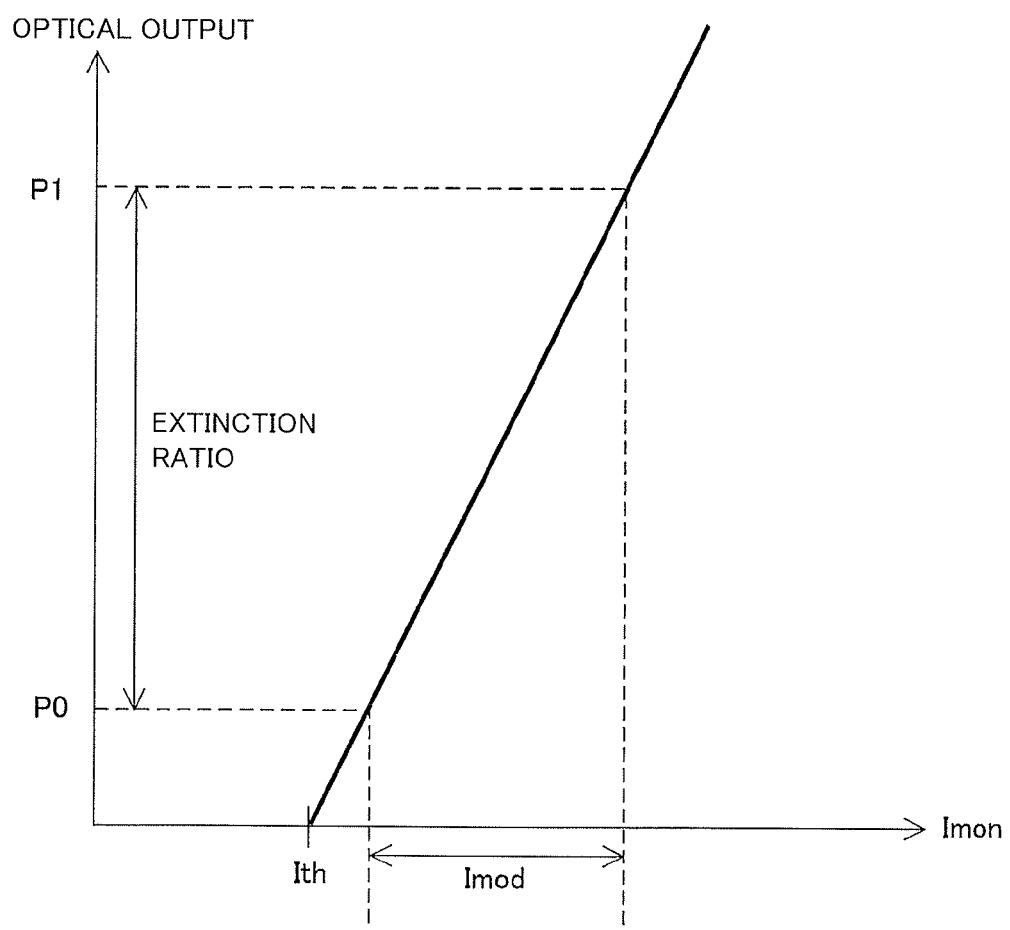
FIG. 7 is a diagram showing relation between an output current from a light-receiving element for monitoring and an extinction ratio.

FIG. 7 is a diagram showing relation between an output current from the light-receiving element for monitoring and an extinction ratio.

Referring to FIG. 7, when output current Imon from light-receiving element for monitoring PD attains to a threshold value Ith or higher, light-emitting element LD starts to emit light. An optical output P0 from light-emitting element LD is an optical output from light-emitting element LD in such a state that bias current Ibias is supplied to light-emitting element LD and magnitude of modulation current Imod to light-emitting element LD is zero. An optical output P1 from light-emitting element LD is optical output P1 from light-emitting element LD in such a state that bias current Ibias and modulation current Imod of magnitude to some extent are supplied to light-emitting element LD. A ratio between optical output P0 and optical output P1 represents an extinction ratio.

It can be seen in FIG. 7 that an extinction ratio of light-emitting element LD can be adjusted by adjusting magnitude of modulation current Imod.

Figure 8:
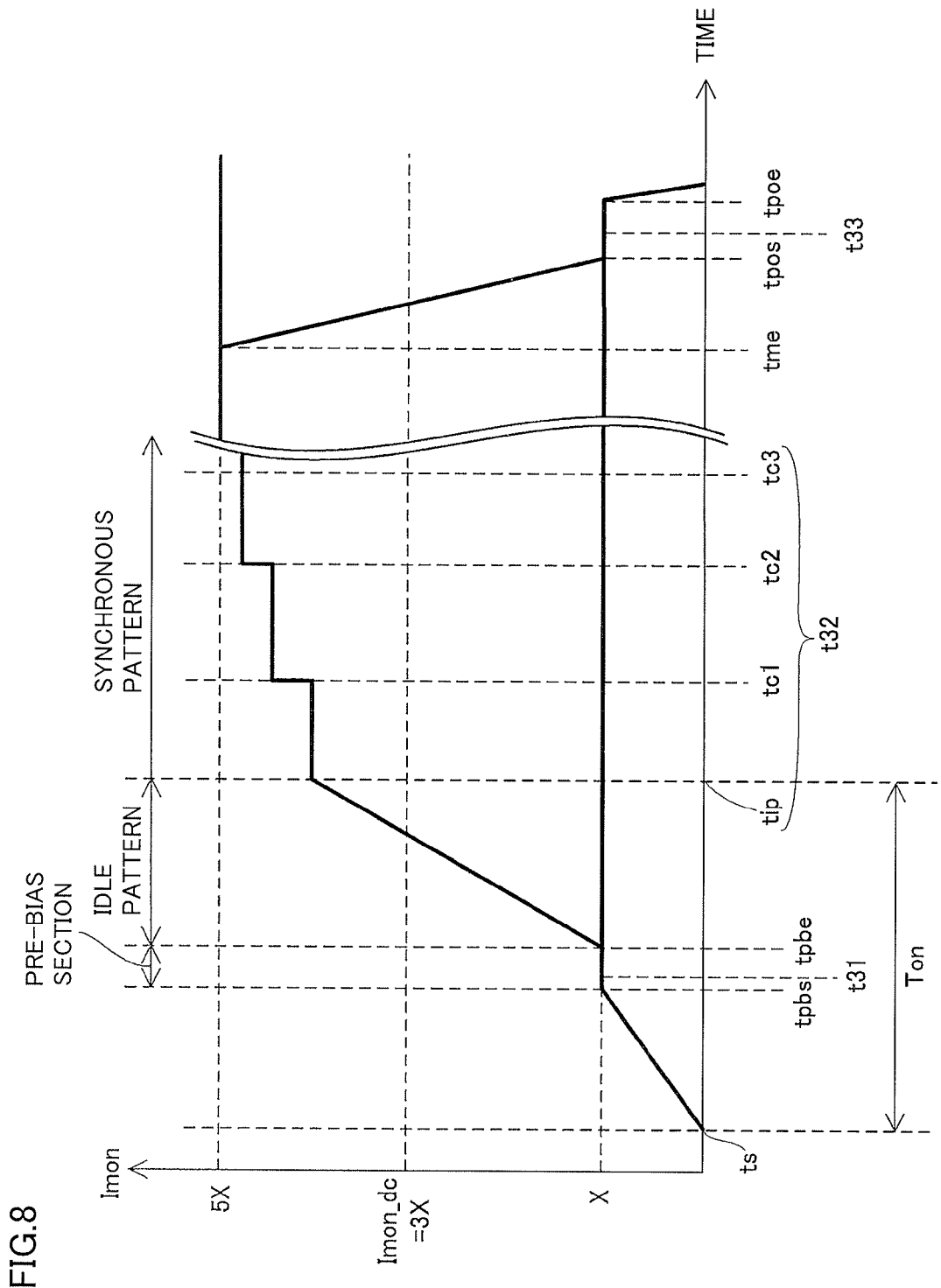
FIG. 8 is a diagram showing a specific example of adjustment of a modulation current in the optical communication module according to the first embodiment of the present invention.

FIG. 8 is a diagram showing a specific example of adjustment of a modulation current in the optical communication module according to the first embodiment of the present invention. In FIG. 8, the abscissa represents time and the ordinate represents output current Imon from light-receiving element for monitoring PD. Imon_dc represents a DC level, that is, an average level, of output current Imon.

Referring to FIG. 8, for example, timing to measure output current Imon is timing t31 and timing t32. Timing t31 is timing after timing is of start of supply of bias current Ibias and within a prescribed time period before timing tpbe of start of supply of modulation current Imod. Timing t32 is timing after timing tpbe of start of supply of modulation current Imod. At timing t31 and t32, measurement unit 31 measures a DC level of output current Imon.

Then, adjustment unit 32 adjusts magnitude of modulation current Imod such that a DC level of output current Imon measured at timing t32 is a prescribed number of times as high as a DC level of output current Imon measured at timing t31.

Specifically, for example, a case that a desired extinction ratio is 7 [dB], that is, a state that a level of a "1" signal is approximately 5 times as high as a level of a "0" signal is aimed, is considered.

In this case, it is assumed that output current Imon in the pre-bias section is monitored as X [mA]. Adjustment unit 32 determines a value for a modulation current such that a DC level Imon_dc of output current Imon after application of a modulation current attains to 3X [mA].

Specifically, when a DC level of output current Imon has not attained to 3×[mA] at timing tip and tc1 to tc3 representing examples of timing t32, modulation current Imod is increased in a stepwise manner. Here, as a DC level of output current Imon is closer to 3X [mA], a control range for modulation current Imod is set to be smaller.

Here, output current Imon in the pre-bias section corresponds to a bias current supplied to light-emitting element LD in the pre-bias section.

Alternatively, for example, timing to measure output current Imon is timing t33 or timing t32 before timing tme of stop of supply of modulation current Imod. Timing t33 is timing after timing tme of stop of supply of modulation current Imod and within a prescribed time period before timing tpoe of stop of supply of bias current Ibias. Timing t32 in this case is, for example, timing in a burst optical signal transmitted from the same optical communication module 21 subsequently to the burst optical signal corresponding to timing t33. At timing t33 and t32, measurement unit 31 measures a DC level of output current Imon.

Then, adjustment unit 32 adjusts magnitude of modulation current Imod such that a DC level of output current Imon measured at timing t32 is a prescribed number of times as high as a DC level of output current Imon measured at timing t33.

Specifically, for example, a case that a desired extinction ratio is 7 [dB], that is, a state that a level of a "1" signal is approximately 5 times as high as a level of a "0" signal is aimed, is considered.

In this case, it is assumed that output current Imon in the post-bias section is monitored as X [mA]. Adjustment unit 32 determines a value for a modulation current such that DC level Imon_dc of output current Imon after application of a modulation current attains to 3X [mA].

Here, output current Imon in the post-bias section corresponds to a bias current supplied to light-emitting element LD in the post-bias section.

In adjustment unit 32, storage unit 73 stores information representing a ratio between magnitude of output current Imon and magnitude of modulation current Imod, such as a proportionality constant. In the example above, the proportionality constant is set to "3". Adjustment unit 32 adjusts magnitude of modulation current Imod with the use of that information.

Figure 9:
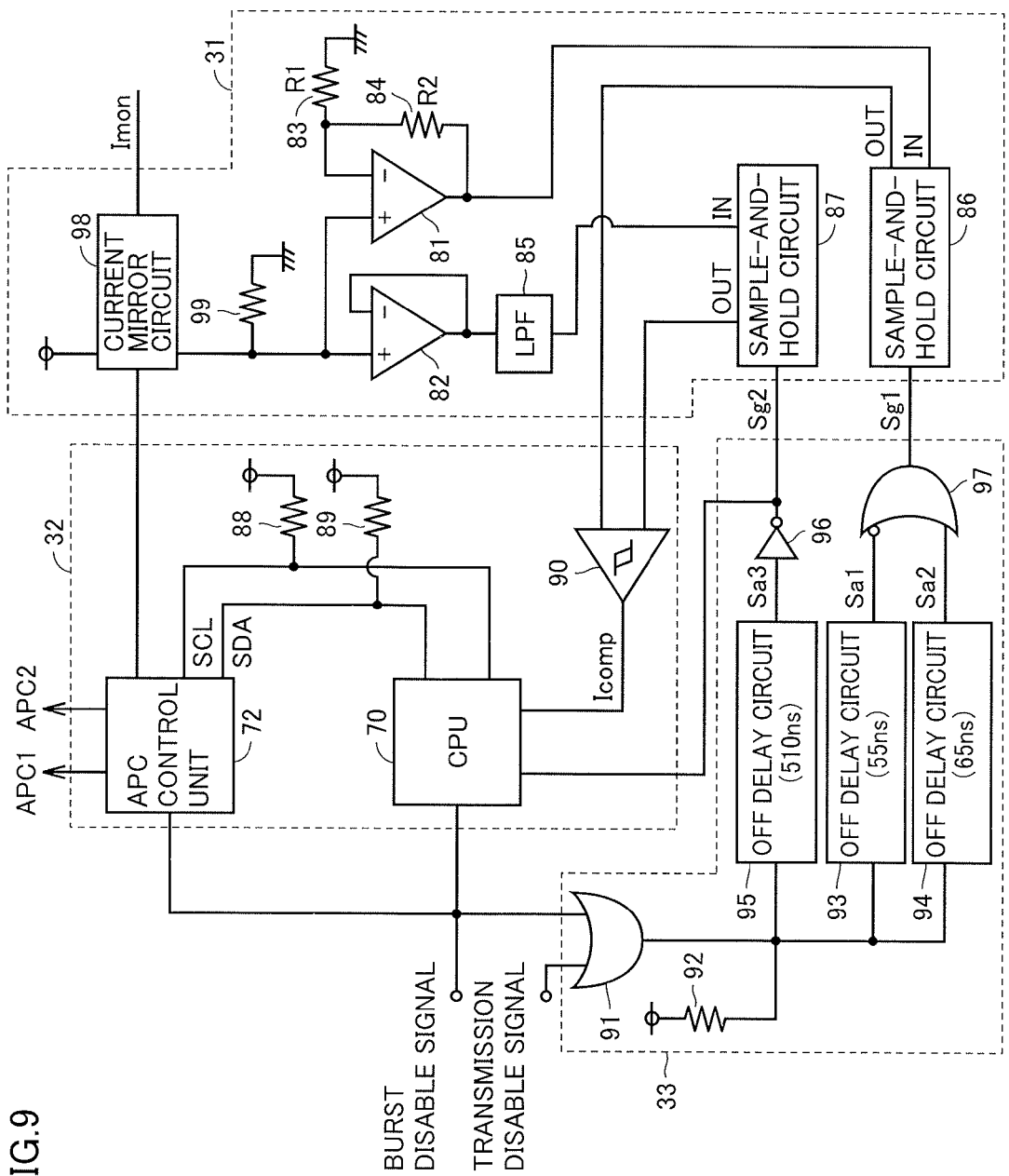
FIG. 9 is a diagram showing one example of a detailed configuration of a measurement unit, an adjustment unit, and a measurement timing setting unit in the optical communication module of the optical network unit according to the first embodiment of the present invention.

FIG. 9 is a diagram showing one example of a detailed configuration of the measurement unit, the adjustment unit, and the measurement timing setting unit in the optical communication module of the optical network unit according to the first embodiment of the present invention.

Referring to FIG. 9, measurement unit 31 includes operational amplifiers 81 and 82, resistors 83, 84, and 99, a low-pass filter (LPF) 85, sample-and-hold circuits 86 and 87, and a current mirror circuit 98. Adjustment unit 32 includes CPU 70, APC control unit 72, resistors 88 and 89, and a comparator 90. Measurement timing setting unit 33 includes OR gates 91 and 97, off delay circuits 93, 94, and 95, a NOT gate 96, and a resistor 92.

In measurement unit 31, current mirror circuit 98 generates and outputs a mirror current corresponding to output current Imon from light-receiving element for monitoring PD. Light-receiving element for monitoring PD is supplied with a bias voltage through current mirror circuit 98.

APC control unit 72 adjusts magnitude of a bias current to light-emitting element LD in accordance with magnitude of an output current from light-receiving element for monitoring PD. APC control unit 72 converts an output current from current mirror circuit 98 to a voltage. APC control unit 72 compares a resultant voltage and a reference voltage written, for example, by CPU 70 into a register (not shown) of APC control unit 72 with each other. APC control unit 72 creates control data APC2 based on that result of comparison. APC control unit 72 creates control data APC2 such that intensity of an optical signal output from light-emitting element LD is constant.

Resistor 99 has a first end receiving a mirror current from current mirror circuit 98 and a second end connected to a node supplied with a ground voltage. Resistor 99 converts a mirror current from current mirror circuit 98 to a light reception voltage.

Resistor 99 may be a variable resistor. In this case, for example, CPU 70 adjusts a resistance value of resistor 99. Thus, individual variation such as a dynamic range of light-receiving element for monitoring PD can be accommodated and an extinction ratio can be adjusted.

Operational amplifier 81 operates as a buffer, and amplifies a light reception voltage converted by resistor 99 with a gain determined by resistance values of resistor 83 and resistor 84 and outputs the light reception voltage. Specifically, with a resistance value of resistor 83 being denoted as R1 and a resistance value of resistor 84 being denoted as R2, operational amplifier 81 outputs a voltage obtained by multiplying a level of the light reception voltage by ((R1+R2)/R1).

Sample-and-hold circuit 86 receives a gate signal Sg1, samples a voltage received from operational amplifier 81, for example, when gate signal Sg1 is at a logic low level, and outputs the sampled voltage to comparator 90. Sample-and-hold circuit 86 holds the sampled voltage during a period in which gate signal Sg1 is at a logic high level, and outputs the held voltage to comparator 90. The period during which gate signal Sg1 is at the logic low level corresponds to a section within measurement timing set by measurement timing setting unit 33. The period during which gate signal Sg1 is at the logic high level is the section outside the measurement timing. Sample-and-hold circuit 86 samples a value corresponding to output current Imon from light-receiving element for monitoring PD, that is, a value for a voltage output from operational amplifier 81 (an amplified light reception voltage). Sample-and-hold circuit 86 may sample a value for output current Imon from light-receiving element for monitoring PD.

Operational amplifier 82 operates as a buffer and outputs a light reception voltage converted by resistor 99 to low-pass filter 85.

Low-pass filter 85 attenuates a component equal to or higher than a prescribed frequency of frequency components of a voltage received from operational amplifier 82. With this low-pass filter 85 cutting off a high-frequency component of output current Imon in a modulation section which is a period corresponding to an idle pattern, a synchronous pattern, and a payload shown in FIG. 6, a DC level of output current Imon in the modulation section can be monitored.

Sample-and-hold circuit 87 receives a gate signal Sg2, samples a voltage which has passed through low-pass filter 85, for example, when gate signal Sg2 is at the logic low level, and outputs the sampled voltage to comparator 90. Sample-and-hold circuit 87 holds the sampled voltage during a period in which gate signal Sg2 is at the logic high level, and outputs the held voltage to comparator 90. The period during which gate signal Sg2 is at the logic low level corresponds to a section within measurement timing set by measurement timing setting unit 33. A period during which gate signal Sg2 is at the logic high level is a section outside the measurement timing. Sample-and-hold circuit 87 samples a value corresponding to output current Imon from light-receiving element for monitoring PD, that is, a value for a voltage which has passed through low-pass filter 85. Sample-and-hold circuit 87 may sample a value for output current Imon from light-receiving element for monitoring PD.

In measurement timing setting unit 33, OR gate 91 outputs, for example, a signal indicating a logical sum of a burst disable signal output from control unit 29 and a transmission disable signal. Here, a transmission disable signal is a control signal for stopping an operation of various circuits for low-power control in ONU 202.

An output signal from OR gate 91 is output to off delay circuits 93 to 95 through signal lines to which a first end of resistor 92 is connected. Resistor 92 has a second end connected to a power supply node supplied with a fixed voltage such as power supply voltage Vcc.

Off delay circuits 93 to 95 are delay circuits generating measurement timing from an output signal from OR gate 91 which is a control signal. Off delay circuits 93 to 95 each output, when the burst disable signal changes from disable (the logic high level) to enable (the logic low level), a signal in which such change is delayed by a prescribed time period. Specifically, off delay circuits 93 to 95 output signals Sa1, Sa2, and Sa3 having a falling edge of an output signal from OR gate 91 delayed by 55 ns, 65 ns, and 510 ns, respectively and having a logical level of the output signal from OR gate 91 inverted.

When the burst disable signal changes from enable (the logic low level) to disable (the logic high level), off delay circuits 93 to 95 change output signals thereof. Each of off delay circuits 93 to 95 does not have to delay change in the output signals thereof. Thus, a measurement timing setting unit in synchronization with a burst disable signal can be configured.

Figure 27:
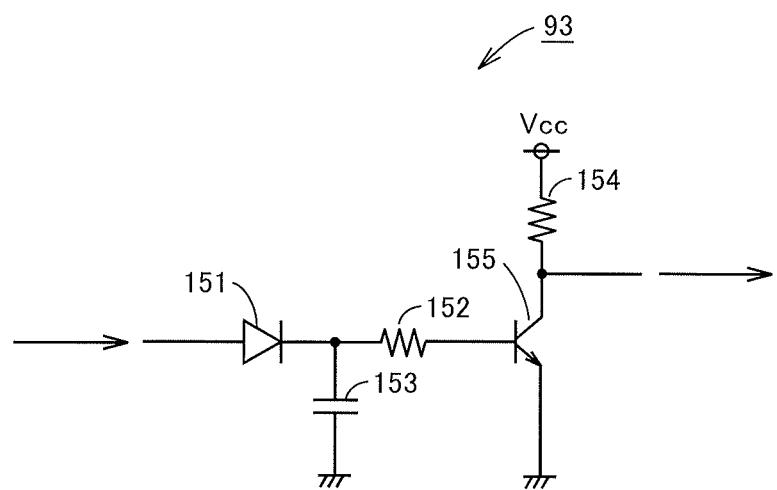
FIG. 27 is a diagram showing one configuration example of an off delay circuit shown in FIG. 9.

FIG. 27 is a diagram showing one configuration example of off delay circuit 93 shown in FIG. 9. Referring to FIG. 27, off delay circuit 93 includes a diode 151, resistors 152 and 154, a capacitor 153, and an N-type transistor 155.

A signal from OR gate 91 is input to an anode of diode 151. Resistor 152 is connected between a cathode of diode 151 and a control electrode of N-type transistor 155. Capacitor 153 is connected between a ground and a point of connection between resistor 152 and diode 151.

Resistor 154 is connected between a power supply node supplied with power supply voltage Vcc and a first electrode of N-type transistor 155. A second electrode of N-type transistor 155 is grounded. A signal having a logical level inverted with respect to a signal input to the anode of diode 151 is output from the first electrode of N-type transistor 155. N-type transistor 155 is implemented, for example, by an NPN transistor. The "first electrode", the "second electrode", and the "control electrode" above correspond to the collector, the emitter, and the base of the NPN transistor, respectively.

When a level of a signal input to the anode of diode 151 is at the logic low level (a burst disable signal is enable), diode 151 has a high impedance (Hi-Z) and hence delay determined by $\tau = R \times C$ is caused. Here, R represents a resistance value of resistor 152 and C represents a capacitance value of capacitor 153. When a level of a signal input to the anode of diode 151 is at the logic high level (a burst disable signal is disable), diode 151 has a low impedance. Therefore, delay by a time constant $\tau$ ($=R \times C$) is not caused.

For off delay circuits 94 and 95 shown in FIG. 9, a configuration the same as the configuration shown in FIG. 27 can be adopted. Off delay circuits 94 and 95 are different from off delay circuit 93 in time constant $\tau$. By adjusting as appropriate a resistance value of resistor 152 and/or a capacitance value of capacitor 153, a time constant of off delay circuits 94 and 95 can appropriately be set.

When a burst enable signal is employed instead of a burst disable signal, an off delay circuit can be replaced with an on delay circuit. In this case, the on delay circuit outputs, when the burst enable signal changes from disable (the logic low level) to enable (the logic high level), a signal having such change delayed by a prescribed time period. When the burst enable signal changes from enable (the logic high level) to disable (the logic low level), the on delay circuit changes an output signal thereof. Change in output signal from the on delay circuit does not have to be delayed.

Referring back to FIG. 9, OR gate 97 outputs to sample-and-hold circuit 86, gate signal Sg1 indicating a logical sum of a signal having a logical level of signal Sa1 received from off delay circuit 93 inverted and signal Sat received from off delay circuit 94.

NOT gate 96 outputs to sample-and-hold circuit 87 and CPU 70, gate signal Sg2 having a logical level of signal Sa3 received from off delay circuit 95 inverted.

In adjustment unit 32, comparator 90 compares a voltage received from sample-and-hold circuit 86 and a voltage received from sample-and-hold circuit 87 with each other. Comparator 90 outputs a signal Icomp indicating that result of comparison to CPU 70.

CPU 70 determines a control value for a modulation current based on signal Icomp received from comparator 90. CPU 70 outputs the control value to APC control unit 72 through the I2C bus constituted of signal line SCL and signal line SDA to which first ends of resistors 88 and 89 are connected, respectively. Immediately after turn-on of power of optical communication module 21, an initial value held by CPU 70 is output to APC control unit 72 as a control value. Resistors 88 and 89 each have a second end connected to a power supply node supplied with a fixed voltage such as power supply voltage Vcc.

APC control unit 72 outputs to power supply 66, control data APC1 based on a control value received from CPU 70.

Specifically, for example, a case that a desired extinction ratio is 7 [dB], that is, a state that a level of a "1" signal is approximately 5 times as high as a level of a "0" signal is aimed, is considered.

In this case, in optical communication module 21, resistance values of resistors 83 and 84 are set such that a voltage 5 times as high as a level of a light reception voltage is output from operational amplifier 81. Then, for example, when a DC level of output current Imon in the modulation section is higher than 5 times as high as output current Imon in the pre-bias section, an output signal from comparator 90 is at the logic high level, and when the DC level is lower than the same, the output signal is at the logic low level.

For example, in a case that a standard value for an output current from power supply 66 is set to 40 mA, CPU 70 determines a control value such that a modulation current is lower by 2 mA when an output signal from comparator 90 is at the logic high level. When the output signal from comparator 90 is at the logic low level, CPU 70 determines a control value such that a modulation current is higher by 2 mA.

Thus, since a modulation current having a DC level which is a certain number of times as high as a bias level in the pre-bias section, that is, a DC level of output current Imon from light-receiving element for monitoring PD, can be generated, an extinction ratio of light-emitting element LD can be set to a desired value.

Measurement of output current Imon from light-receiving element for monitoring PD and determination of a control value for a modulation current may be made only once or a plurality of times in the modulation section.

An operational amplifier may be employed instead of comparator 90. In this case, CPU 70 receives signal Icomp indicating a difference between an output voltage from sample-and-hold circuit 86 and an output voltage from sample-and-hold circuit 87 from that operational amplifier.

Here, for example, when an absolute value of a difference between a level of signal Icomp and a prescribed reference value is large, a control range, that is, an amount of change, for a modulation current in feedback control is increased. When an absolute value of a difference between a level of signal Icomp and a prescribed reference value is small, a control range, that is, an amount of change, for a modulation current in feedback control is decreased.

Thus, a time period for convergence in feedback control of a modulation current can be shortened and stable convergence can be achieved. In a configuration including a comparator, as compared with a configuration including an operational amplifier, a response speed can be improved.

Specifically, in a case that the prescribed reference value is set to 1.65 V, CPU 70 sets a control range for a modulation current to a −2 mA step when a level of signal Icomp is at 2.9 V.

Alternatively, CPU 70 sets a control range for a modulation current to a −0.1 mA step when a level of signal Icomp is at 1.8 V.

Alternatively, CPU 70 sets a control range for a modulation current to a +0.1 mA step when a level of signal Icomp is at 1.5 V.

Alternatively, CPU 70 sets a control range for a modulation current to a +2 mA step when a level of signal Icomp is at 0.4 V.

Optical communication module 21 is not limited to a configuration in which a value for a modulation current is determined based on a bias level of output current Imon in the pre-bias section or the post-bias section and a DC level of output current Imon in the modulation section. Optical communication module 21 may be configured to determine a value for a modulation current based on a bias level of output current Imon in the pre-bias section or the post-bias section. Alternatively, optical communication module 21 may be configured such that a value for a modulation current is determined based on a result of measurement of output current Imon in the pre-bias section or the post-bias section and thereafter the value is corrected based on a result of measurement of output current Imon in the modulation section.

When CPU 70 can stop an operation to change a modulation current based on an output signal from comparator 90 while a burst disable signal or a transmission disable signal is activated, optical communication module 21 can set a control signal provided to sample-and-hold circuit 86 to a logical level corresponding to a sample mode even when transmission of a burst optical signal has been stopped. In this case, it is not necessary to provide off delay circuit 94 and OR gate 97. Sample-and-hold circuit 86, however, is operated in a sample mode when a control signal at the logic high level is provided.

Figure 10:
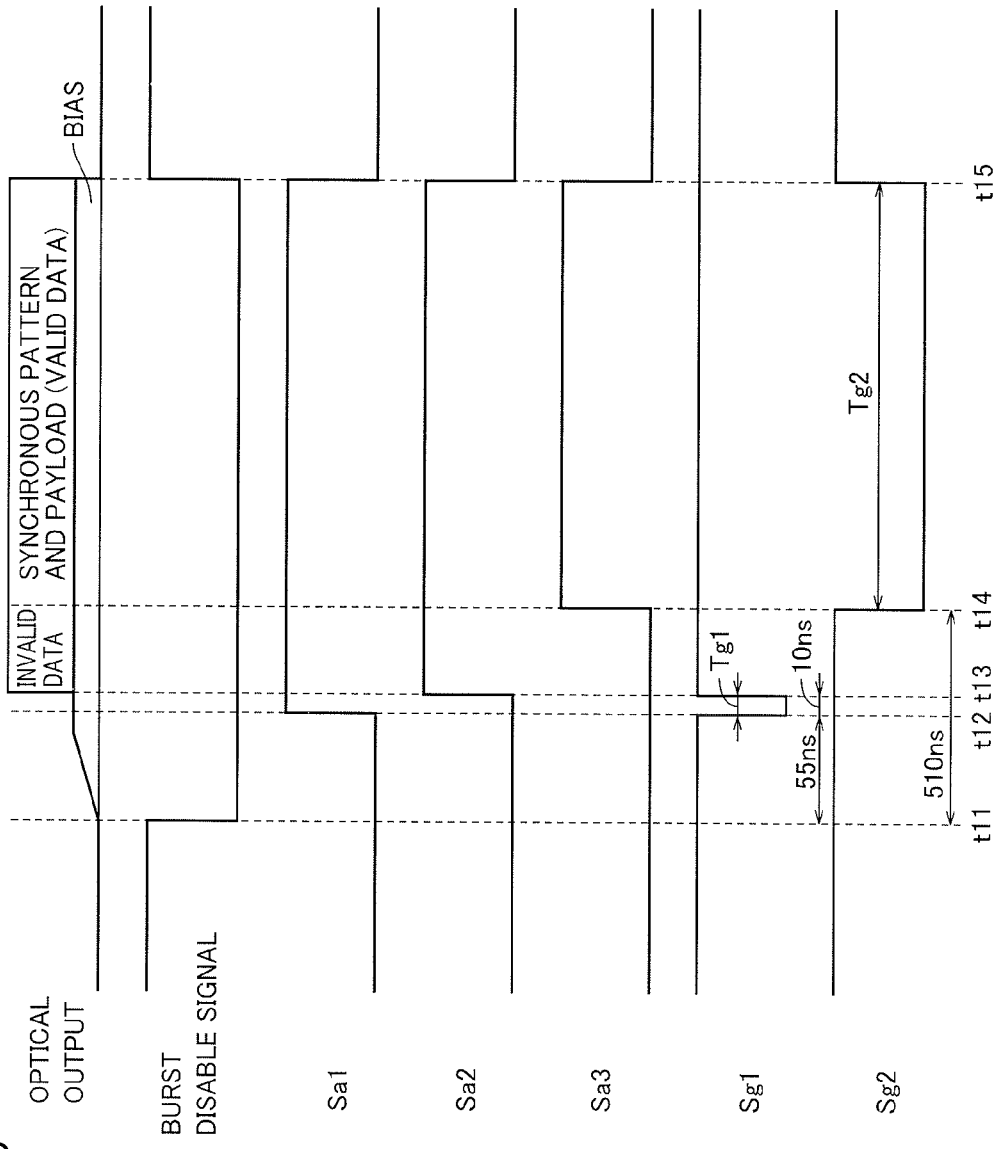
FIG. 10 is a diagram showing one example of a control signal for monitoring in the optical communication module of the optical network unit according to the first embodiment of the present invention.

FIG. 10 is a diagram showing one example of a control signal for monitoring in the optical communication module of the optical network unit according to the first embodiment of the present invention.

Referring to FIG. 10, a period from timing t11 until timing t13 corresponds to the pre-bias section. A period from t13 until timing t14 corresponds to a section in which an idle pattern which is invalid data is transmitted. A period from timing t14 until timing t15 (Tg2) corresponds to a section in which a synchronous pattern and a payload which are valid data are transmitted.

Initially, at timing t11, a burst disable signal makes transition from the logic high level to the logic low level. Here, gate signals Sg1 and Sg2 are at the logic high level.

Then, at timing t12 55 ns after timing t11, output signal Sa1 from off delay circuit 93 makes transition from the logic low level to the logic high level. Thus, gate signal Sg1 makes transition from the logic high level to the logic low level.

Then, at timing t13 65 ns after timing t11, output signal Sa2 from off delay circuit 94 makes transition from the logic low level to the logic high level. Thus, gate signal Sg1 makes transition from the logic low level to the logic high level.

At timing t14 510 ns after timing t11, output signal Sa3 from off delay circuit 95 makes transition from the logic low level to the logic high level. Thus, gate signal Sg2 makes transition from the logic high level to the logic low level.

Then, at timing t15 after timing t14, the burst disable signal makes transition from the logic low level to the logic high level. Thus, output signals Sa1 to Sa3 from off delay circuits 93 to 95 make transition from the logic high level to the logic low level. As a result of transition of output signal Sa3, gate signal Sg2 makes transition from the logic low level to the logic high level.

Thus, gate signal Sg1 is at the logic high level until timing t12, it is at the logic low level during a period from timing t12 until timing t13 (Tg1), and it is again at the logic high level at timing t13 or later.

Namely, measurement timing setting unit 33 generates gate signal Sg1 indicating timing in the pre-bias section.

Gate signal Sg2 is at the logic high level until timing t14, it is at the logic low level during a period from timing t14 until timing t15, and it is again at the logic high level at timing t15 or later.

Namely, measurement timing setting unit 33 generates gate signal Sg2 indicating timing in a section in which valid data is transmitted.

Figure 11:
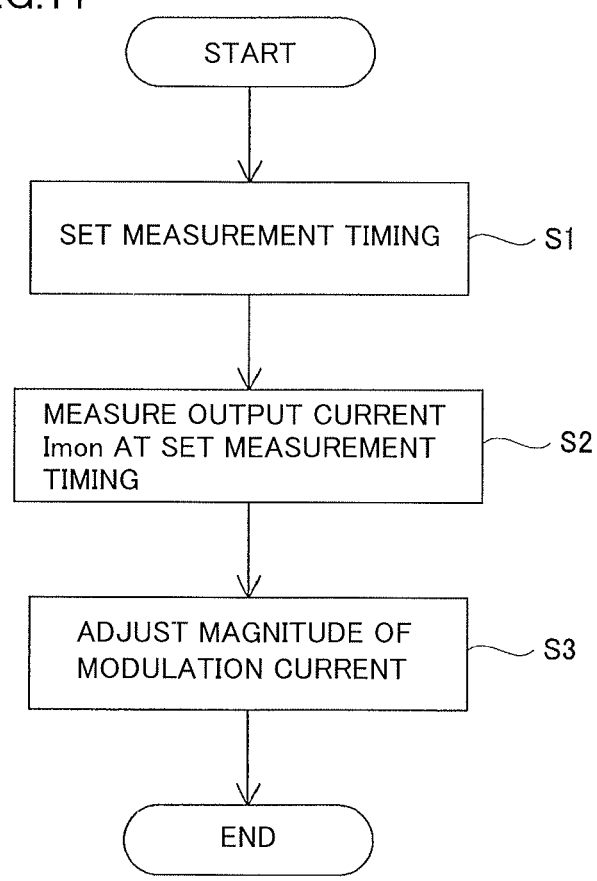
FIG. 11 is a flowchart showing a procedure in a method of controlling a light-emitting element according to the first embodiment of the present invention.

FIG. 11 is a flowchart showing a procedure in a method of controlling a light-emitting element according to the first embodiment of the present invention.

Referring to FIG. 11, initially, measurement timing for measuring output current Imon from light-receiving element for monitoring PD is set based on a control signal for controlling transmission of a burst optical signal, such as a burst disable signal and a transmission disable signal (step S1).

Then, output current Imon is measured at the set measurement timing (step S2).

Then, magnitude of modulation current Imod is adjusted based on a result of measurement of output current Imon (step S3).

With the method of feedforward control of a modulation current as described previously, an appropriate modulation current can be set for adapting to change in environmental temperature. It is difficult, however, to set an appropriate modulation current for adapting to aging of a light-emitting element. Creation of a look-up table as described previously for a modulation current leads to increase in creation cost.

In feedback control of a modulation current by using a light-receiving element for monitoring, for example, in 10 G-EPON, a scrambled optical signal of 10 Gbps should be monitored. It is difficult, however, to monitor stable amplitude of the optical signal due to influence by a parasitic capacitance of the light-receiving element for monitoring.

In a configuration in which a transimpedance amplifier for 10 Gbps is employed in order to improve responsiveness of a circuit for monitoring an optical signal, costs for parts and costs for mounting are high. It is difficult to adopt this configuration for an ONU required to be low in cost.

With a method of superimposing a pilot current on a supply current to a light-emitting element as well, it is difficult to satisfy, for example, with burst response required for an ONU of 10 G-EPON or feedback control, a required time period until a desired optical signal level is reached.

If a current higher in speed than the pilot current having a period of approximately 100 ms is superimposed on a payload signal of a frame transmitted from an ONU of 10 G-EPON, an amount of change in backward light cannot accurately be monitored.

In contrast, in the optical communication module according to the first embodiment of the present invention, measurement unit 31 measures output current Imon from light-receiving element for monitoring PD at the set measurement timing. Adjustment unit 32 adjusts magnitude of modulation current Imod based on a result of measurement of output current Imon by measurement unit 31. Then, measurement timing setting unit 33 sets the measurement timing based on a control signal for controlling transmission of a burst optical signal.

According to such a configuration, stable amplitude of a high-speed burst optical signal can be monitored without particularly significant addition of a circuit. In addition, without creation of a look-up table leading to increase in creation cost or without use of parts leading to higher cost such as a transimpedance amplifier for 10 Gbps, feedback control of a modulation current can be achieved with low cost. Feedback control of this modulation current can allow setting of an appropriate modulation current for adapting to aging of a light-emitting element.

Therefore, with the optical communication module according to the first embodiment of the present invention, a burst optical signal transmitted from a light-emitting element can satisfactorily be monitored, the light-emitting element can appropriately be controlled, and increase in manufacturing cost can be suppressed.

In the optical communication module according to the first embodiment of the present invention, output buffer circuit 63 starts supply of modulation current Imod after bias current supply circuit 68 starts supply of bias current Ibias. Then, timing to measure output current Imon is timing after the timing of start of supply of bias current Ibias and within a prescribed time period before the timing of start of supply of modulation current Imod.

According to such a configuration, a DC level of output current Imon from light-receiving element for monitoring PD is desirably measured. Therefore, additional circuits can be few and a configuration can be simplified. In addition, for example, an appropriate modulation current can be set in such an early stage that a bias current alone is supplied to light-emitting element LD.

In the optical communication module according to the first embodiment of the present invention, timing to measure output current Imon is first timing after the timing of start of supply of bias current Ibias and within a prescribed time period before the timing of start of supply of modulation current Imod and second timing after the timing of start of supply of modulation current Imod.

According to such a configuration, a more appropriate value for a modulation current can be set based on output current Imon from light-receiving element for monitoring PD measured at the timing before start of supply of the modulation current and at the timing after start of supply of the modulation current.

In the optical communication module according to the first embodiment of the present invention, bias current supply circuit 68 stops supply of bias current Ibias after output buffer circuit 63 stops supply of modulation current Imod. Then, timing to measure output current Imon is after the timing of stop of supply of modulation current Imod and within a prescribed time period before the timing of stop of supply of bias current Ibias.

According to such a configuration, a DC level of output current Imon from light-receiving element for monitoring PD is desirably measured. Therefore, additional circuits can be few and a configuration can be simplified. In addition, for example, an appropriate modulation current can be set in such an early stage that a bias current alone is supplied to light-emitting element LD.

In the optical communication module according to the first embodiment of the present invention, timing to measure output current Imon is first timing after the timing of stop of supply of modulation current Imod and within a prescribed time period before the timing of stop of supply of bias current Ibias and second timing before the timing of stop of supply of modulation current Imod.

According to such a configuration, a more appropriate value for a modulation current can be set based on output current Imon from light-receiving element for monitoring PD measured at the timing after stop of supply of the modulation current and at the timing before stop of supply of the modulation current.

In the optical communication module according to the first embodiment of the present invention, measurement unit 31 measures a DC level of output current Imon. Adjustment unit 32 adjusts magnitude of modulation current Imod such that a DC level of output current Imon measured at the second timing is a prescribed number of times as high as a DC level of output current Imon measured at the first timing.

According to such a configuration, with the DC level of output current Imon before start of supply of the modulation current being defined as the reference, output current Imon after start of supply of the modulation current can appropriately be set.

In the optical communication module according to the first embodiment of the present invention, storage unit 73 stores information representing a ratio between magnitude of output current Imon and magnitude of modulation current Imod. Then, adjustment unit 32 adjusts magnitude of modulation current Imod by using that information.

According to such a configuration, an arbitrary extinction ratio can be obtained by rewriting information in storage unit 73. In addition, a set value for the modulation current can be calculated from output current Imon from light-receiving element for monitoring PD with simplified processing.

Another embodiment of the present invention will now be described with reference to the drawings. The same or corresponding elements in the drawings have the same reference characters allotted and description thereof will not be repeated.

Second Embodiment

The present embodiment relates to an optical communication module in which measurement timing is changed as compared with the optical communication module according to the first embodiment. Features other than contents described below are the same as those of the optical communication module according to the first embodiment.

In the optical communication module according to a second embodiment of the present invention, timing to measure output current Imon is included in a section of a prescribed bit string in a burst optical signal, such as a synchronous pattern section. Measurement unit 31 measures amplitude of output current Imon in this synchronous pattern section.

Then, adjustment unit 32 adjusts magnitude of modulation current Imod such that amplitude measured by measurement unit 31 attains to a target value.

Figure 12:
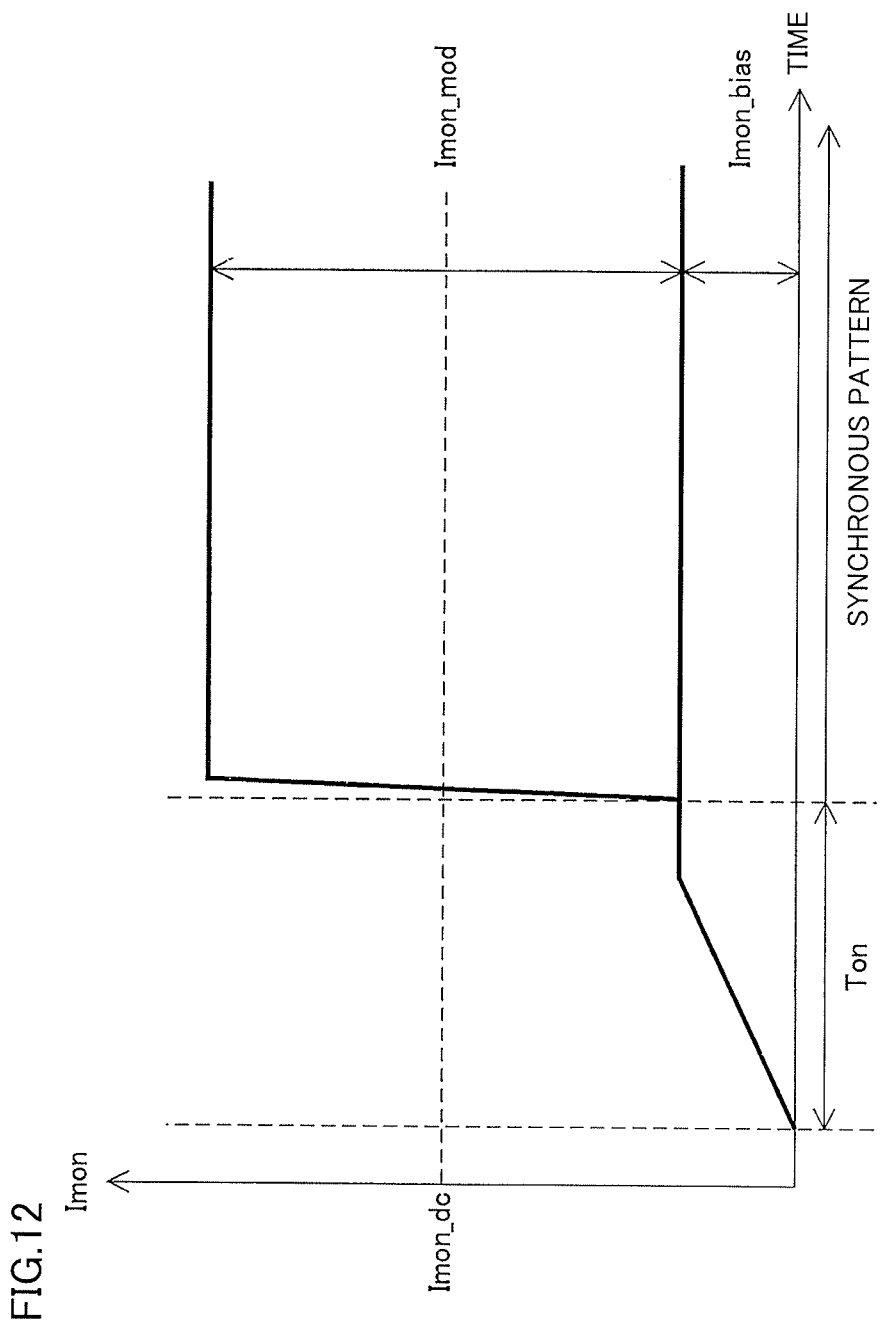
FIG. 12 is a diagram for illustrating timing to measure an output current from the light-receiving element for monitoring in the optical communication module according to a second embodiment of the present invention.

FIG. 12 is a diagram for illustrating timing to measure an output current from the light-receiving element for monitoring in the optical communication module according to the second embodiment of the present invention. In FIG. 12, the abscissa represents time and the ordinate represents output current Imon from light-receiving element for monitoring PD. Imon_bias represents a bias current component included in output current Imon and Imon_mod represents a modulation current component included in output current Imon.

Referring to FIG. 12, optical communication module 21 monitors amplitude in a synchronous pattern section of a burst optical signal and carries out feedback control of a modulation current such that a desired extinction ratio is obtained. Specifically, measurement unit 31 monitors bias current component Imon_mod included in output current Imon as amplitude of a burst optical signal.

As described previously, when a band for monitoring an optical signal is insufficient, it becomes difficult to monitor in a payload section, a scrambled signal of 10 Gbps, in particular, an optical signal of data in which a "0" signal and a "1" signal are alternately transmitted. In contrast, a synchronous pattern is a data pattern which is always fixed in each burst optical signal and the maximum number of consecutive bits of the same sign is 6. Therefore, amplitude of a burst optical signal can be monitored in a stable manner.

Figure 13:
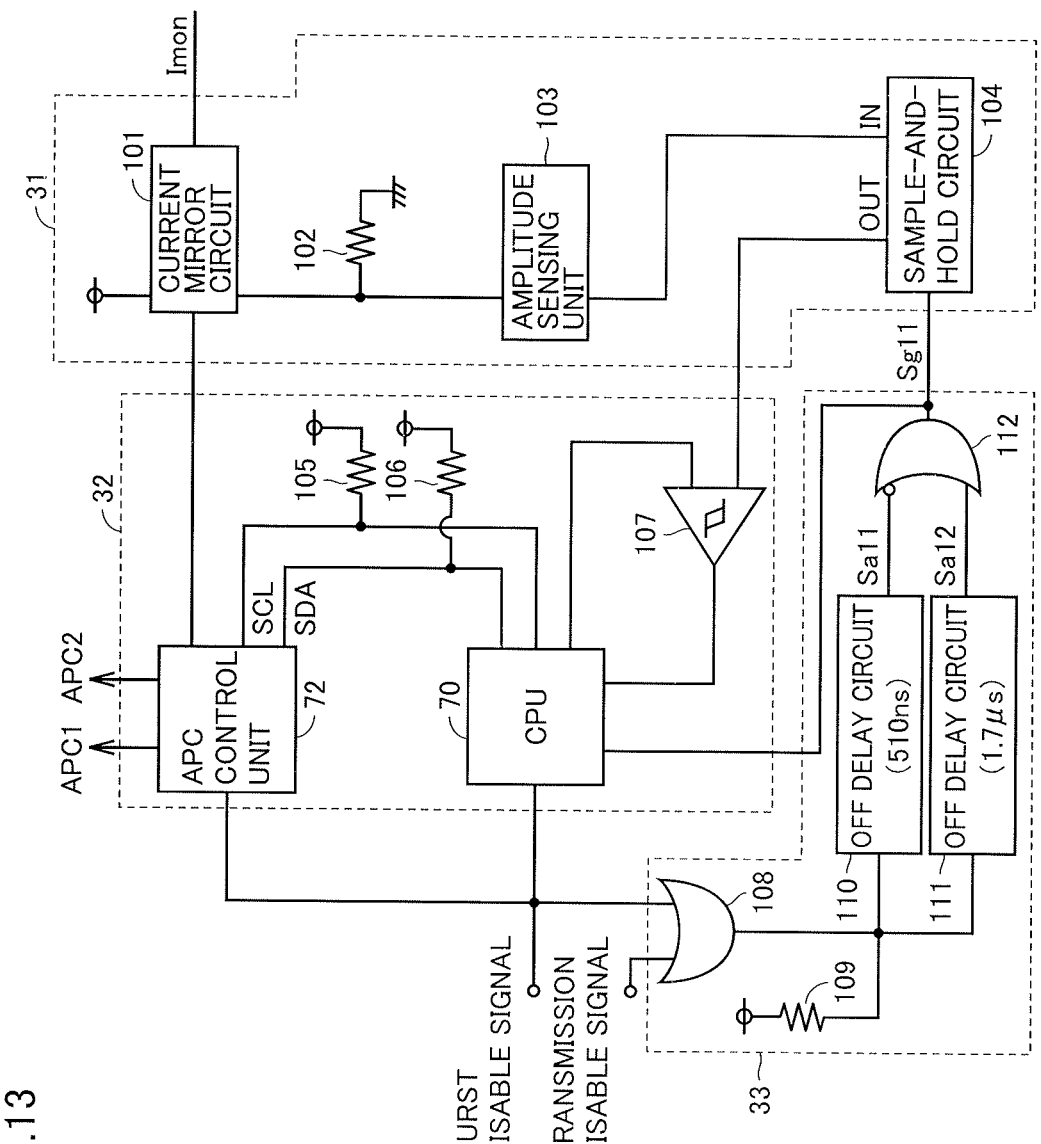
FIG. 13 is a diagram showing one example of a detailed configuration of the measurement unit, the adjustment unit, and the measurement timing setting unit in the optical communication module of the optical network unit according to the second embodiment of the present invention.

FIG. 13 is a diagram showing one example of a detailed configuration of the measurement unit, the adjustment unit, and the measurement timing setting unit in the optical communication module of the optical network unit according to the second embodiment of the present invention.

Referring to FIG. 13, measurement unit 31 includes a current mirror circuit 101, a resistor 102, an amplitude sensing unit 103, and a sample-and-hold circuit 104. Adjustment unit 32 includes CPU 70, APC control unit 72, a comparator 107, and resistors 105 and 106. Measurement timing setting unit 33 includes OR gates 108 and 112, off delay circuits 110 and 111, and a resistor 109.

In measurement unit 31, current mirror circuit 101 generates and outputs a mirror current corresponding to output current Imon from light-receiving element for monitoring PD. A bias voltage is supplied to light-receiving element for monitoring PD through current mirror circuit 101.

APC control unit 72 adjusts magnitude of a bias current to light-emitting element LD in accordance with magnitude of an output current from light-receiving element for monitoring PD. APC control unit 72 converts an output current from current mirror circuit 101 to a voltage. APC control unit 72 compares a resultant voltage and a reference voltage written, for example, by CPU 70 into a register (not shown) of APC control unit 72 itself. APC control unit 72 creates control data APC2 based on that result of comparison. APC control unit 72 creates control data APC2 such that intensity of an optical signal output from light-emitting element LD is constant.

Resistor 102 has a first end receiving a mirror current from current mirror circuit 101 and a second end connected to a node supplied with a ground voltage. Resistor 102 converts a mirror current from current mirror circuit 101 to a light reception voltage.

Resistor 102 may be a variable resistor. In this case, for example, CPU 70 adjusts a resistance value of resistor 102. Thus, individual variation such as a dynamic range of light-receiving element for monitoring PD can be accommodated and an extinction ratio can be adjusted.

Amplitude sensing unit 103 senses an AC component of a light reception voltage converted by resistor 102, that is, amplitude, and outputs a signal indicating the sensed amplitude. For example, amplitude sensing unit 103 detects a maximum peak and a minimum peak of the light reception voltage and outputs a signal indicating a difference therebetween.

Sample-and-hold circuit 104 receives a gate signal Sg11, samples a signal received from amplitude sensing unit 103, for example, when gate signal Sg11 is at the logic low level, and outputs the sampled voltage to comparator 107. Sample-and-hold circuit 104 holds the sampled signal during a period in which gate signal Sg11 is at the logic high level and outputs the held voltage to comparator 107. As will be described later, gate signal Sg11 indicates timing in a synchronous pattern section of a burst optical signal. Sample-and-hold circuit 104 samples a value of a signal from amplitude sensing unit 103 as a value corresponding to output current Imon from light-receiving element for monitoring PD.

In measurement timing setting unit 33, OR gate 108 outputs, for example, a signal representing a logical sum of a burst disable signal and a transmission disable signal output from control unit 29. Here, the transmission disable signal is a control signal for stopping an operation of various circuits for low-power control in ONU 202.

An output signal from OR gate 108 is output to off delay circuits 110 and 111 through signal lines to which a first end of resistor 109 is connected. Resistor 109 has a second end connected to a power supply node supplied with a fixed voltage such as power supply voltage Vcc.

Of delay circuits 110 and 111 output signals Sa11 and Sa12 having a falling edge of an output signal from OR gate 108 delayed by 510 ns and 1.7 us, respectively and having a logical level thereof inverted. Off delay circuits 110 and 111 are delay circuits generating measurement timing from an output signal from OR gate 108 which is a control signal.

OR gate 112 outputs to sample-and-hold circuit 104 and CPU 70, gate signal Sg11 representing a logical sum of a signal having a logical level of signal Sa11 received from off delay circuit 110 inverted and signal Sa12 received from off delay circuit 111.

In adjustment unit 32, comparator 107 compares a voltage received from sample-and-hold circuit 104 and a reference value for amplitude received from CPU 70 with each other. Comparator 107 outputs signal Icomp representing a result of comparison to CPU 70. This reference value is, for example, at 200 mV.

CPU 70 determines a control value for a modulation current based on signal Icomp received from comparator 107. CPU 70 outputs the control value to APC control unit 72 through the I2C bus constituted of signal line SCL and signal line SDA to which the first ends of resistors 105 and 106 are connected. Immediately after turn-on of power of the optical communication module, an initial value held in CPU 70 is output to APC control unit 72 as the control value. Resistors 105 and 106 have second ends each connected to a power supply node supplied with a fixed voltage such as power supply voltage Vcc.

APC control unit 72 outputs to power supply 66, control data APC1 based on a control value received from CPU 70.

Specifically, for example, a case that a desired extinction ratio is 7 [dB], that is, a state that a level of a "1" signal is approximately 5 times as high as a level of a "0" signal is aimed, is considered. A value corresponding to 7 [dB] is set as the reference value for amplitude.

In this case, for example, an output signal from comparator 107 is at the logic high level when a DC level of output current Imon in the synchronous pattern section is higher than the reference value, and it is at the logic low level when the DC level is lower than the reference value.

For example, in a case that a standard value for an output current from power supply 66 is set to 40 mA, CPU 70 determines a control value such that a modulation current is lower by 2 mA when an output signal from comparator 107 is at the logic high level. When the output signal from comparator 107 is at the logic low level, CPU 70 determines a control value such that a modulation current is higher by 2 mA.

Thus, since a modulation current can be controlled such that amplitude of output current Imon in the synchronous pattern section is constant, an extinction ratio of light-emitting element LD can be set to a desired value.

In the optical communication module according to the second embodiment of the present invention as well, an operational amplifier may be employed instead of comparator 107. Since operation contents in this case are similar to those of the optical communication module according to the first embodiment of the present invention, detailed description will not be repeated here.

Figure 14:
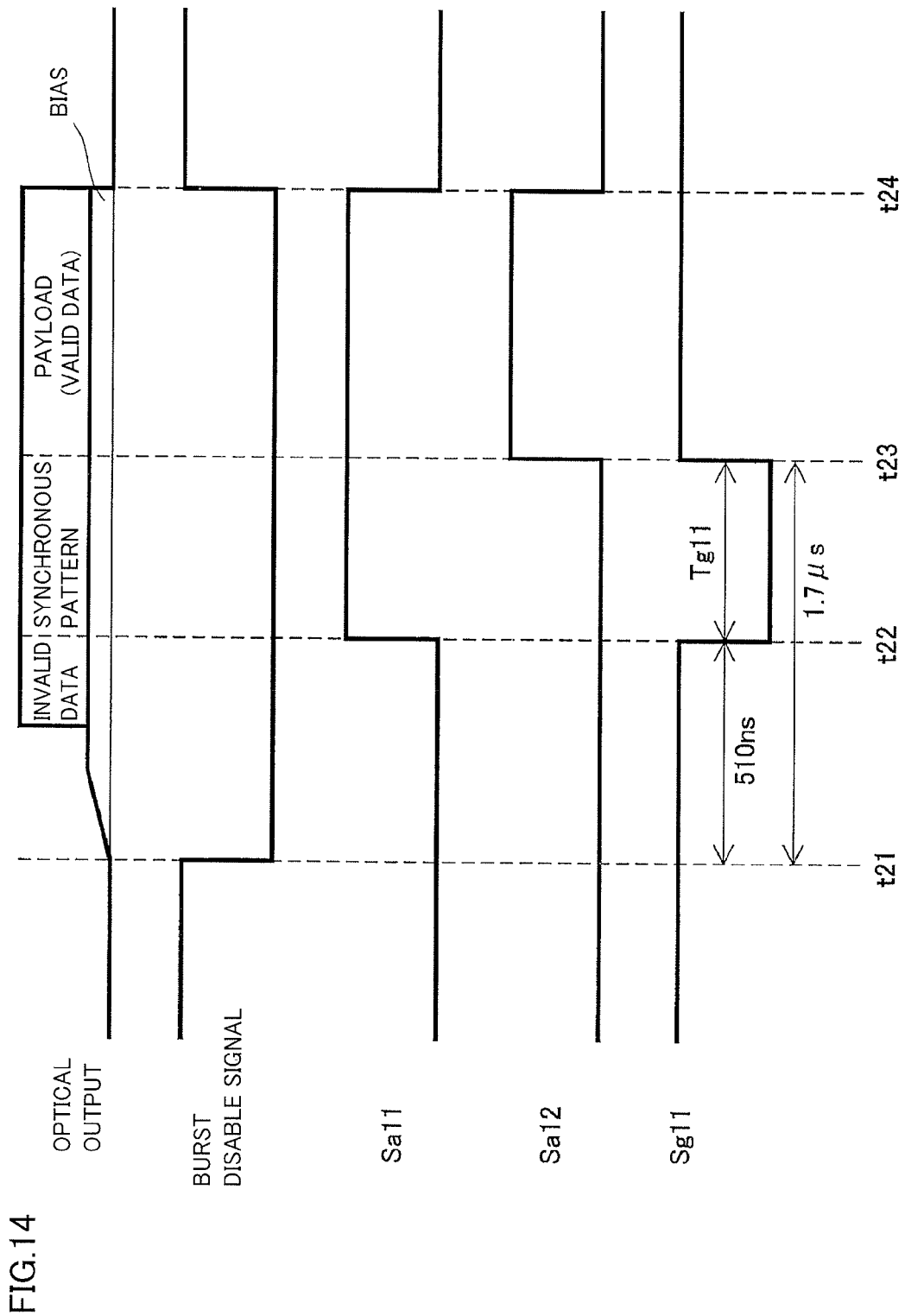
FIG. 14 is a diagram showing one example of a control signal for monitoring in the optical communication module of the optical network unit according to the second embodiment of the present invention.

FIG. 14 is a diagram showing one example of a control signal for monitoring in the optical communication module of the optical network unit according to the second embodiment of the present invention.

Referring to FIG. 14, a period from timing t21 until timing t22 corresponds to the pre-bias section and the idle pattern section. A period from timing t22 until timing t23 (Tg11) corresponds to the synchronous pattern section. A period from timing t23 until timing t24 corresponds to a section in which a payload which is valid data is transmitted.

Initially, at timing t21, a burst disable signal makes transition from the logic high level to the logic low level. Here, gate signal Sg11 is at the logic high level.

Then, at timing t22 510 ns after timing t21, output signal Sa11 from off delay circuit 110 makes transition from the logic low level to the logic high level. Thus, gate signal Sg11 makes transition from the logic high level to the logic low level.

Then, at timing t23 1.7 us after timing t21, output signal Sa12 from off delay circuit 111 makes transition from the logic low level to the logic high level. Thus, gate signal Sg11 makes transition from the logic low level to the logic high level.

Then, at timing t24 after timing t23, the burst disable signal makes transition from the logic low level to the logic high level. Thus, output signals Sa11 and Sa12 from off delay circuits 110 and 111 make transition from the logic high level to the logic low level.

Thus, gate signal Sg11 is at the logic high level until timing t22, it is at the logic low level during a period from timing t22 until timing t23, and it is again at the logic high level at timing t23 or later.

Namely, measurement timing setting unit 33 generates gate signal Sg11 indicating timing in the synchronous pattern section.

As above, in the optical communication module according to the second embodiment of the present invention, timing to measure output current Imon is included in a section of a prescribed bit string in a burst optical signal, such as in the synchronous pattern section.

According to such a configuration, measurement can be conducted at the timing when output current Imon from light-receiving element for monitoring PD is stabilized and a more appropriate value for a modulation current can be set.

In the optical communication module according to the second embodiment of the present invention, measurement unit 31 measures amplitude of output current Imon in the synchronous pattern section. Then, adjustment unit 32 adjusts magnitude of modulation current Imod such that amplitude measured by measurement unit 31 attains to a target value.

According to such a configuration, a set value for the modulation current can appropriately be calculated from amplitude of output current Imon from light-receiving element for monitoring PD measured at the timing when output current Imon from light-receiving element for monitoring FD is stabilized.

Since the configuration and the operation are otherwise the same as those of the optical communication module according to the first embodiment, detailed description will not be repeated here.

Another embodiment of the present invention will now be described with reference to the drawings. The same or corresponding elements in the drawings have the same reference characters allotted and description thereof will not be repeated.

Third Embodiment

The present embodiment relates to an optical communication module in which a pilot current is superimposed, as compared with the optical communication module according to the first embodiment. Features other than contents described below are the same as those of the optical communication module according to the second embodiment.

Figure 15:
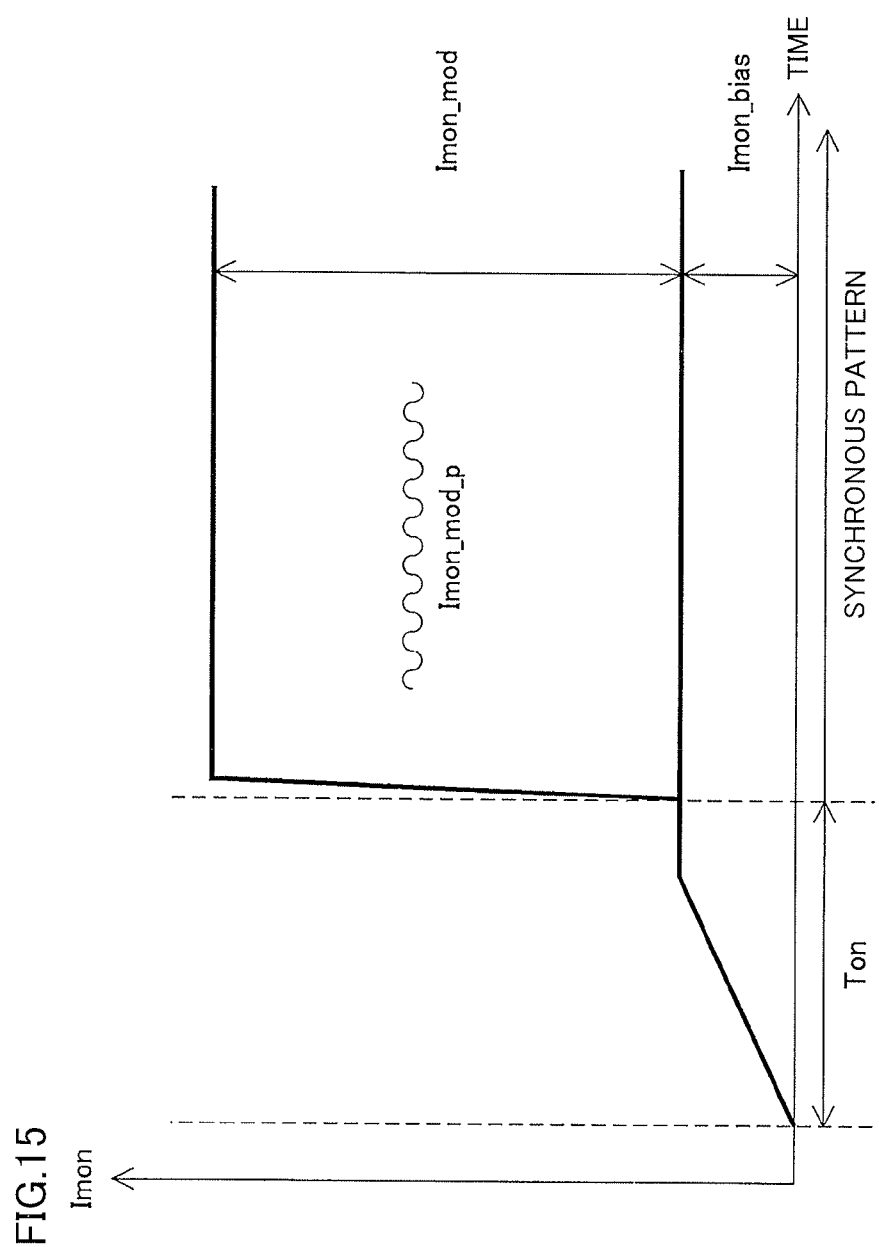
FIG. 15 is a diagram showing a pilot current superimposed in the optical communication module according to a third embodiment of the present invention.

FIG. 15 is a diagram showing a pilot current superimposed in the optical communication module according to a third embodiment of the present invention. In FIG. 15, the abscissa represent time and the ordinate represents output current Imon from light-receiving element for monitoring PD. Imon_bias represents a bias current component included in output current Imon, Imon_mod represents a modulation current component included in output current Imon, and Imon_mod_p represents a pilot current.

Referring to FIG. 15, in the optical communication module according to the third embodiment of the present invention, by supplying a pilot current in a synchronous pattern section in a burst optical signal, a pilot current relatively short in period can be used.

Specifically, since the maximum number of consecutive bits of the same sign in a synchronous pattern is 6, a lowest frequency component of the synchronous pattern is around 156 MHz, which is significantly higher than a lowest frequency component of a payload signal having 31 bits which represent the maximum number of consecutive bits of the same sign.

Attention being paid to such a fact, in the optical communication module according to the third embodiment of the present invention, a pilot current of several ten MHz is used. Thus, a required time period of several ten us (microsecond) until a desired optical signal level is reached can be satisfied, for example, with burst response of 512 ns required for an ONU of 10 G-EPON or feedback control.

In this configuration, a pilot current generator should be added to optical communication module 21. On the other hand, processing for feedback control of a modulation current can be performed by using a pilot current having stable amplitude, after the bias current to light-emitting element LD is sufficiently stabilized. Therefore, amplitude of a burst optical signal can be monitored in a more stable manner.

Specifically, a pilot current is superimposed, for example, on a modulation current in the synchronous pattern section and change in amplitude ΔVmon of output current Imon is monitored. Then, a modulation current is subjected to feedback control such that ΔVmon attains to a constant target value. This target value is set to a value corresponding to a desired extinction ratio. Amplitude of a pilot current is set, for example, to 2% of amplitude of modulation current Imod. In a section other than the synchronous pattern section, supply of the pilot current and monitoring of change in amplitude ΔVmon of output current Imon is stopped.

The synchronous pattern section is a section 0.51 us to 1.7 us after timing of inactivation of a burst disable signal, and with the configuration and the method similar to those for the optical communication module according to the second embodiment of the present invention, gate signal Sg11 can be generated and used.

Immediately after turn-on of power of optical communication module 21, an initial value held by CPU 70 is output to APC control unit 72 as a control value.

Here, the reason why an extinction ratio is maintained constant so long as ΔVmon is constant is as follows. Namely, when efficiency in conversion from (an average current Ild from light-emitting element LD–a threshold current Ith from light-emitting element LD) to light emission intensity of light-emitting element LD and from the light emission intensity to output current Imon is constant, output current Imon is in proportion to (average current Ild–threshold current Ith).

In this case, when modulation current Imod is changed while bias current Ibias to light-emitting element LD is constant, such change is monitored as change in amplitude Vmon of output current Imon, with conversion efficiency being constant.

Since modulation current Imod can be determined by (bias current Ibias–threshold current Ith) and by an extinction ratio, the extinction ratio and ΔVmon correspond to each other on the one-to-one basis when ΔVmon is set to x % of modulation current Imod with the use of a pilot current. Therefore, when ΔVmon is constant, the extinction ratio is maintained constant.

Figure 16:
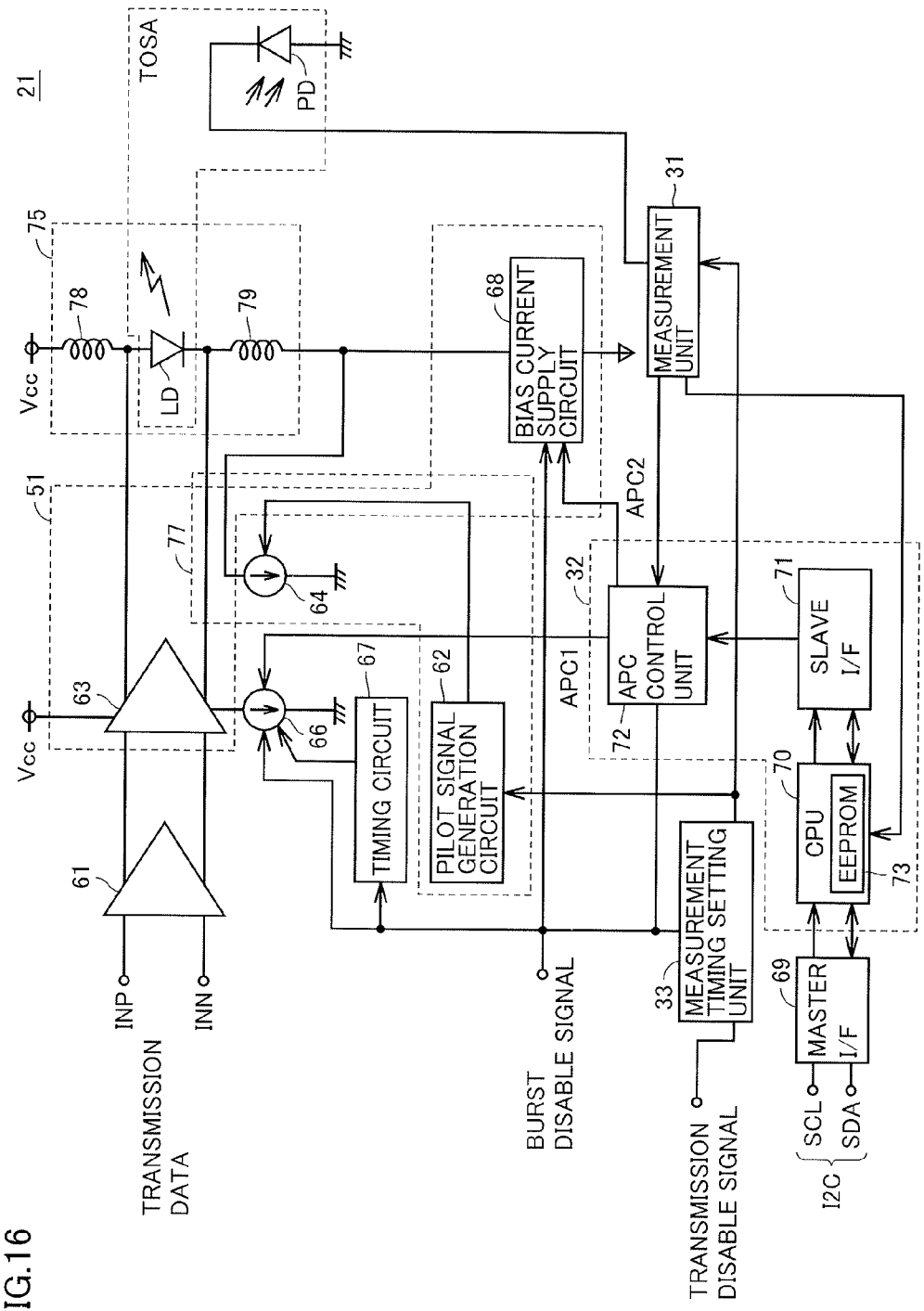
FIG. 16 is a diagram showing a configuration of the optical communication module in the optical network unit according to the third embodiment of the present invention.

FIG. 16 is a diagram showing a configuration of the optical communication module in the optical network unit according to the third embodiment of the present invention.

Referring to FIG. 16, optical communication module 21 further includes a pilot current generation unit 77 as compared with the optical communication module according to the second embodiment of the present invention. Pilot current generation unit 77 includes a pilot signal generation circuit 62 and a power supply 64.

Pilot current generation unit 77 generates a pilot current having a frequency lower than a modulation rate of a burst optical signal and having amplitude smaller than amplitude of modulation current Imod by a prescribed ratio or higher. Pilot current generation unit 77 superimposes the generated pilot current on modulation current Imod. For example, a pilot current has a frequency higher than a reciprocal of a length of the synchronous pattern section.

More specifically, power supply 64 generates a pilot current based on a pilot control signal received from pilot signal generation circuit 62 and supplies the pilot current to output buffer circuit 63.

Pilot signal generation circuit 62 outputs a pilot control signal to power supply 64 based on gate signal Sg11 received from measurement timing setting unit 33. Specifically, by outputting a pilot control signal, pilot signal generation circuit 62 repeats start and stop of output of a current from power supply 64 in the synchronous pattern section and stops output of a current from power supply 64 at other timing.

Measurement unit 31 measures amplitude of output current Imon in the synchronous pattern section. Then, adjustment unit 32 adjusts magnitude of modulation current Imod such that variation in output current Imon corresponding to variation in pilot current attains to a target value.

Figure 17:
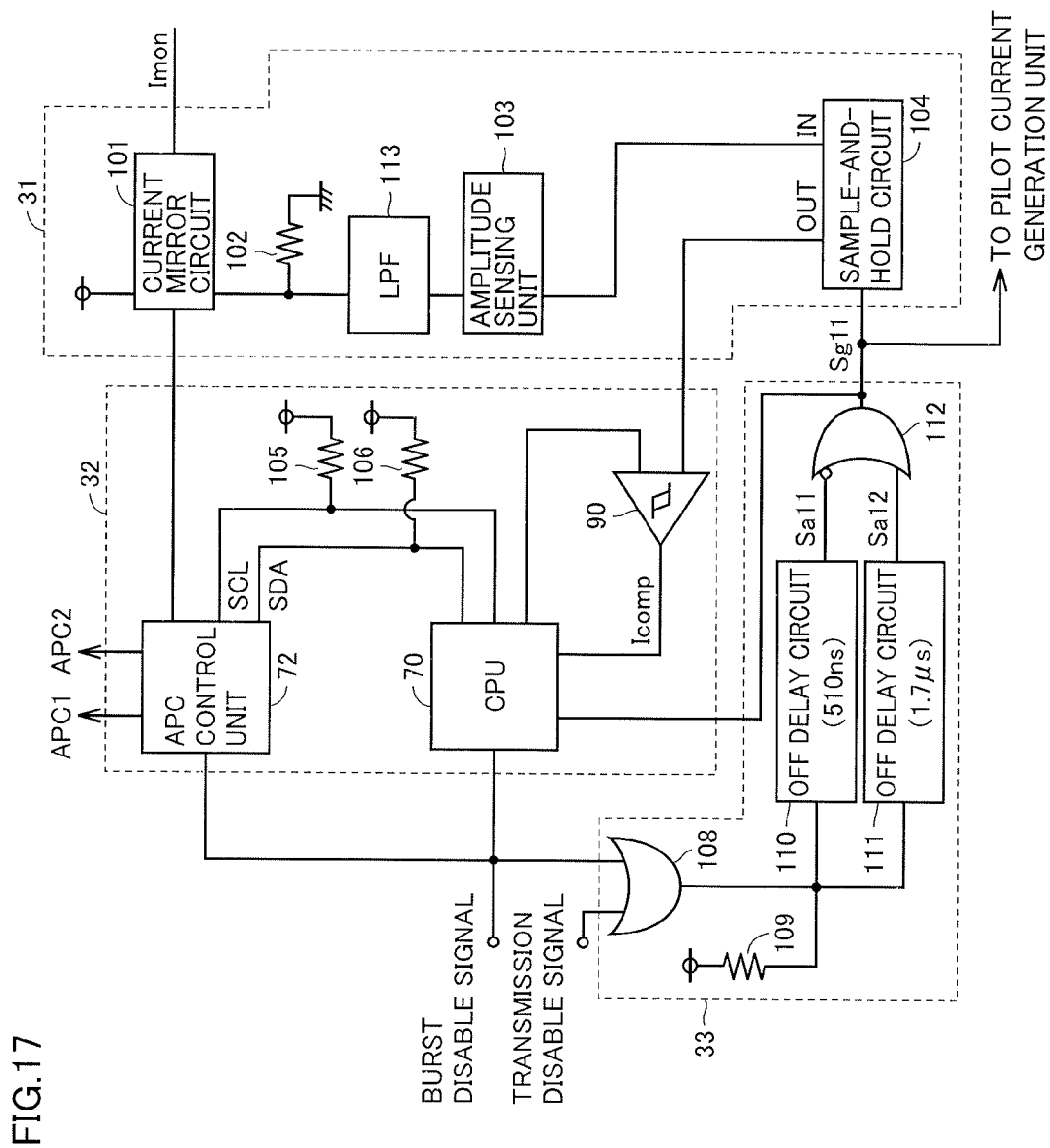
FIG. 17 is a diagram showing one example of a detailed configuration of the measurement unit, the adjustment unit, and the measurement timing setting unit in the optical communication module of the optical network unit according to the third embodiment of the present invention.

FIG. 17 is a diagram showing one example of a detailed configuration of the measurement unit, the adjustment unit, and the measurement timing setting unit in the optical communication module of the optical network unit according to the third embodiment of the present invention.

Referring to FIG. 17, measurement unit 31 further includes a low-pass filter (LPF) 113 as compared with measurement unit 31 shown in FIG. 13.

Low-pass filter 113 attenuates a component at a prescribed frequency or higher, of frequency components of a light reception voltage converted by resistor 102. This low-pass filter 113 cuts off a high-frequency component of output current Imon and prevents, for example, amplitude sensing unit 103 from sensing a component higher than a lowest frequency of a synchronous pattern.

Amplitude sensing unit 103 senses amplitude of a light reception voltage which has passed through low-pass filter 113 and outputs a signal indicating the sensed amplitude. For example, amplitude sensing unit 103 detects a maximum peak and a minimum peak of the light reception voltage and outputs a signal indicating a difference therebetween.

In measurement timing setting unit 33, OR gate 112 outputs to sample-and-hold circuit 104, pilot signal generation circuit 62, and CPU 70, gate signal Sg11 representing a logical sum of a signal having a logical level of signal Sa11 received from off delay circuit 110 inverted and signal Sa12 received from off delay circuit 111.

Pilot current generation unit 77 may be configured to change a value for amplitude of a pilot current by referring to an external environment such as a temperature by using a temperature sensor.

Here, when a pilot current is constant at each temperature, for example, in an environment at a low temperature in which light emission efficiency of light-emitting element LD is high, a ratio of a pilot signal to a burst optical signal is high. According to such a configuration that a value for amplitude of a pilot current is changed by referring to a temperature as above, amplitude of a pilot current can appropriately be set in accordance with an external environment.

As set forth above, in the optical communication module according to the third embodiment of the present invention, pilot current generation unit 77 generates a pilot current lower than modulation current Imod and superimposes the generated pilot current on a point of influence influencing output current Imon. Then, adjustment unit 32 adjusts magnitude of modulation current Imod based on relation between the point of influence and a result of measurement by measurement unit 31.

Thus, according to the configuration in which a pilot signal more stable in amplitude than a burst optical signal is used, more accurate feedback control of a modulation current can be achieved.

In the optical communication module according to the third embodiment of the present invention, pilot current generation unit 77 superimposes a pilot current on modulation current Imod as the point of influence. Then, adjustment unit 32 adjusts magnitude of modulation current Imod such that variation in output current Imon corresponding to variation in pilot current attains to a target value.

According to such a configuration, a target on which a pilot current is to be superimposed can appropriately be selected and feedback control of a modulation current can satisfactorily be achieved.

In the optical communication module according to the third embodiment of the present invention, measurement unit 31 measures amplitude of output current Imon in the synchronous pattern section. Then, pilot current generation unit 77 generates a pilot current having a frequency lower than a modulation rate of a burst optical signal and having amplitude smaller than amplitude of modulation current Imod by a prescribed ratio or higher.

According to such a configuration, measurement can be conducted at timing when output current Imod from light-receiving element for monitoring PD is stabilized, and a more appropriate value for a modulation current can be set.

In the optical communication module according to the third embodiment of the present invention, a pilot current has a frequency higher than a reciprocal of a length of the synchronous pattern section.

According to such a configuration, change in amplitude ΔVmon of output current Imon can be measured at least once in one synchronous pattern section, and setting of the modulation current can be changed. Therefore, a time period required until the modulation current converges to a desired value can be shortened.

In optical communication module 21, as described with reference to FIG. 4, a bit rate and a modulation rate of a burst optical signal are equal to each other. Without being limited to such a configuration, however, for example, multi-value amplitude modulation may be carried out in transmission of a burst optical signal by optical communication module 21. In this case, a bit rate of a burst optical signal is higher than a modulation rate.

[Modification]

Figure 18:
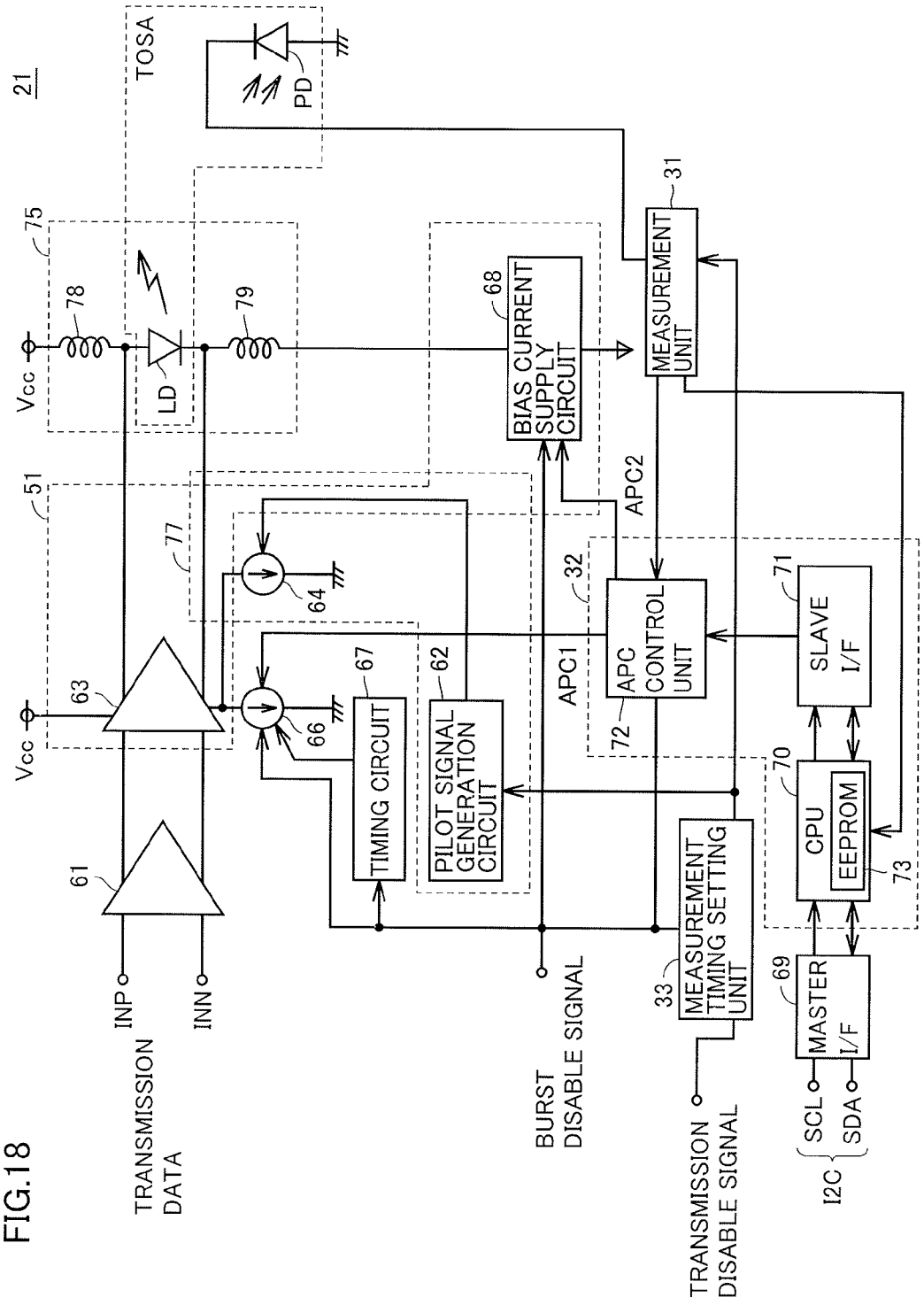
FIG. 18 is a diagram showing a configuration of a first modification of the optical communication module in the optical network unit according to the third embodiment of the present invention.

FIG. 18 is a diagram showing a configuration of a first modification of the optical communication module in the optical network unit according to the third embodiment of the present invention.

Referring to FIG. 18, in the first modification, measurement unit 31 measures amplitude of output current Imon in the synchronous pattern section.

Pilot current generation unit 77 generates a pilot current having a frequency lower than a modulation rate of a burst optical signal and having amplitude smaller than amplitude of modulation current Imod by a prescribed ratio or higher. Pilot current generation unit 77 superimposes the generated pilot current on bias current Ibias.

Adjustment unit 32 adjusts magnitude of modulation current Imod such that variation in output current Imon corresponding to variation in pilot current attains to a target value.

Power supply 64 generates a pilot current based on a pilot control signal received from pilot signal generation circuit 62 and supplies the pilot current to light-emitting circuit 75. Amplitude of a pilot current is set to a value in consideration of a threshold current of light-emitting element LD.

Pilot signal generation circuit 62 outputs a pilot control signal to power supply 64 based on gate signal Sg11 received from measurement timing setting unit 33. Specifically, by outputting a pilot control signal, pilot signal generation circuit 62 repeats start and stop of output of a current from power supply 64 in the synchronous pattern section and stops output of a current from power supply 64 at other timing.

Namely, in the first modification, pilot current generation unit 77 superimposes a pilot current on bias current Ibias as the point of influence. Then, adjustment unit 32 adjusts magnitude of modulation current Imod such that variation in output current Imon corresponding to variation in pilot current attains to a target value.

With such a configuration as well, according to the configuration in which a pilot signal more stable in amplitude than a burst optical signal is used, more accurate feedback control of a modulation current can be achieved. In addition, a target on which a pilot current is to be superimposed can appropriately be selected and feedback control of a modulation current can satisfactorily be achieved.

Figure 19:
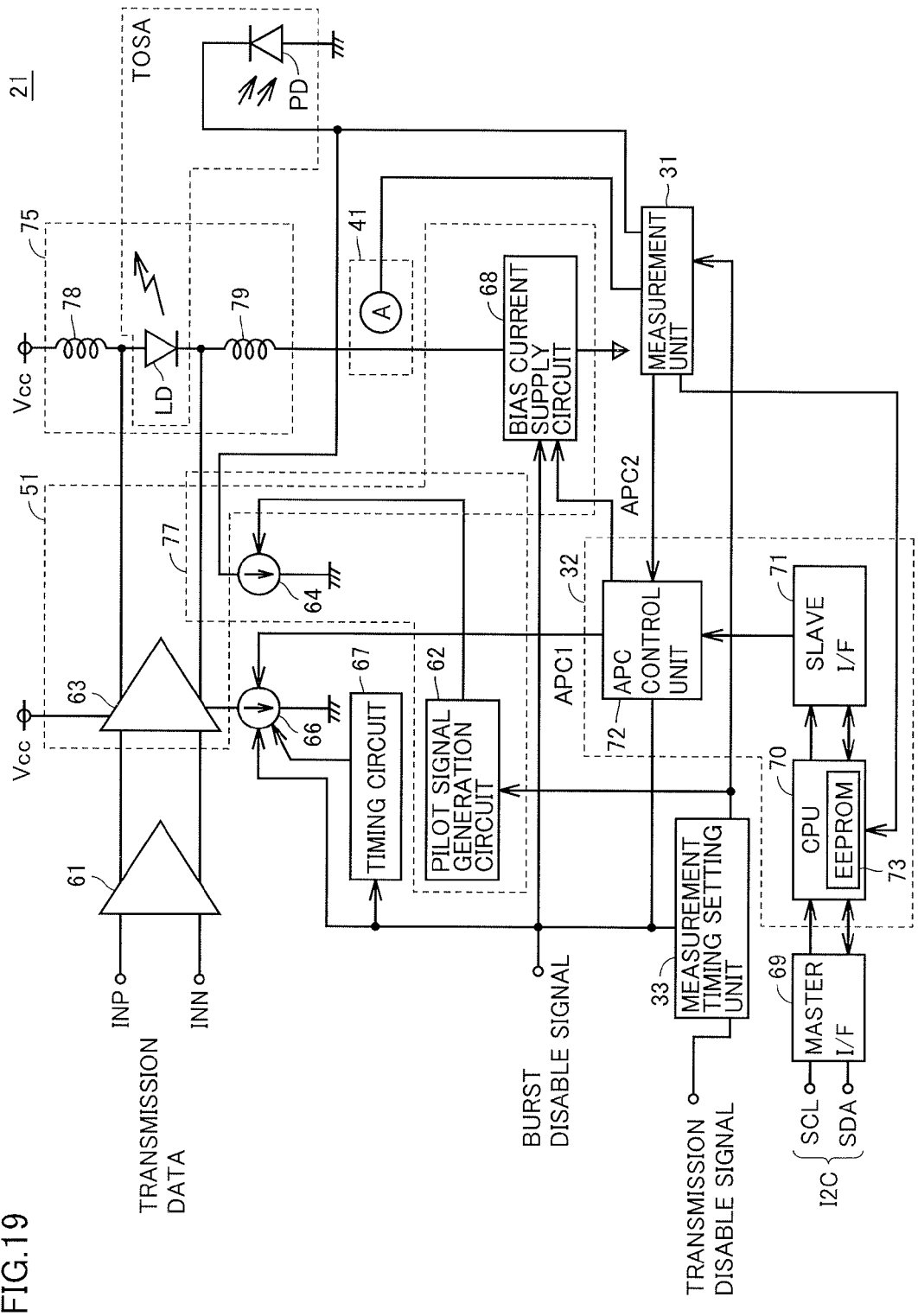
FIG. 19 is a diagram showing a configuration of a second modification of the optical communication module in the optical network unit according to the third embodiment of the present invention.

FIG. 19 is a diagram showing a configuration of a second modification of the optical communication module in the optical network unit according to the third embodiment of the present invention.

Referring to FIG. 19, in the second modification, measurement unit 31 measures amplitude of output current Imon in the synchronous pattern section.

Pilot current generation unit 77 generates a pilot current having a frequency lower than a modulation rate of a burst optical signal and having amplitude smaller than amplitude of output current Imon by a prescribed ratio or higher. Pilot current generation unit 77 superimposes the pilot current on output current Imon.

Adjustment unit 32 adjusts magnitude of modulation current Imod such that variation in bias current Ibias corresponding to variation in output current Imon attains to a target value.

More specifically, measurement unit 31 further includes a current measurement circuit 41 as compared with measurement unit 31 shown in FIG. 16.

Current measurement circuit 41 measures an AC component in bias current Ibias supplied to light-emitting circuit 75 and outputs a signal representing a result of measurement.

Power supply 64 generates a pilot current based on a pilot control signal received from pilot signal generation circuit 62. Power supply 64 superimposes the pilot current on output current Imon from light-receiving element for monitoring PD.

Pilot signal generation circuit 62 outputs a pilot control signal to power supply 64 based on gate signal Sg11 received from measurement timing setting unit 33. Specifically, by outputting a pilot control signal, pilot signal generation circuit 62 repeats start and stop of output of a current from power supply 64 in the synchronous pattern section and stops output of a current from power supply 64 at other timing.

Figure 20:
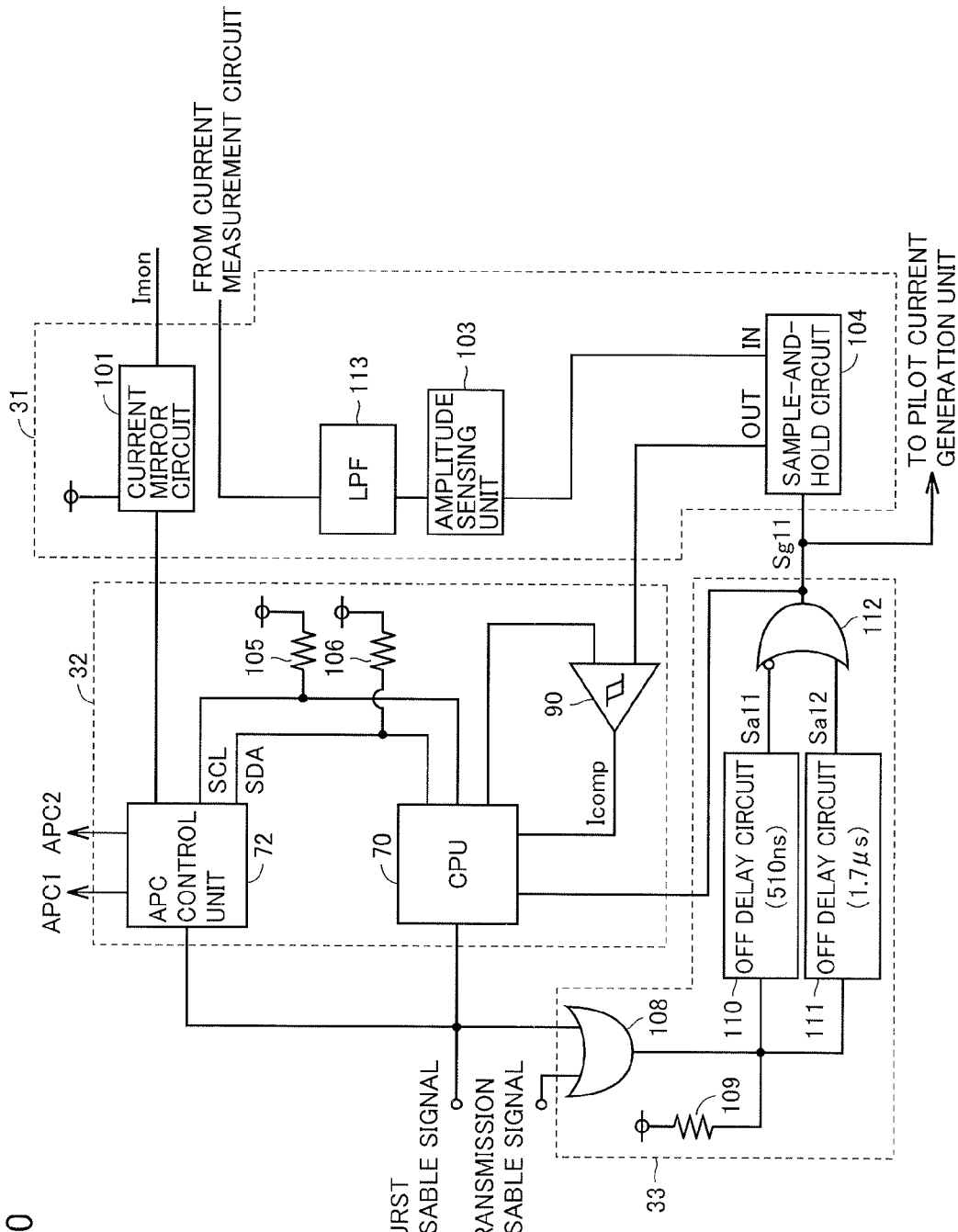
FIG. 20 is a diagram showing one example of a detailed configuration of the measurement unit, the adjustment unit, and the measurement timing setting unit in the second modification of the optical communication module of the optical network unit according to the third embodiment of the present invention.

FIG. 20 is a diagram showing one example of a detailed configuration of the measurement unit, the adjustment unit, and the measurement timing setting unit in the second modification of the optical communication module of the optical network unit according to the third embodiment of the present invention.

Referring to FIG. 20, measurement unit 31 does not include resistor 102, as compared with measurement unit 31 shown in FIG. 17. Low-pass filter 113 receives a signal from current measurement circuit 41, rather than a mirror current from current mirror circuit 101.

Low-pass filter 113 attenuates a component at a prescribed frequency or higher, of frequency components of a signal representing a result of measurement of a bias current from current measurement circuit 41. This low-pass filter 113 cuts off a high-frequency component of bias current Ibias and prevents, for example, amplitude sensing unit 103 from sensing a component higher than a lowest frequency of a synchronous pattern.

Amplitude sensing unit 103 senses amplitude of a signal which has passed through low-pass filter 113 and outputs a signal indicating the sensed amplitude. For example, amplitude sensing unit 103 detects a maximum peak and a minimum peak of a light reception voltage and outputs a signal indicating a difference therebetween.

In the second modification, variation in amplitude of a pilot current is reflected on a bias current and a modulation current is controlled based on change in amplitude $\Delta Vmon$ of the bias current.

Namely, in the second modification, adjustment unit 32 further adjusts magnitude of bias current Ibias based on a result of measurement of output current Imon by measurement unit 31. Measurement unit 31 further measures bias current Ibias. Pilot current generation unit 77 superimposes a pilot current on output current Imon as the point of influence. Then, adjustment unit 32 adjusts magnitude of modulation current Imod such that variation in bias current Ibias corresponding to variation in output current Imon attains to a target value.

With such a configuration as well, according to the configuration in which a pilot signal more stable in amplitude than a burst optical signal is used, more accurate feedback control of a modulation current can be achieved. In addition, a target on which a pilot current is to be superimposed can appropriately be selected and feedback control of a modulation current can satisfactorily be achieved.

Optical communication module 21 monitors once or a plurality of times, change in amplitude $\Delta Vmon$ of output current Imon in the synchronous pattern section, however, limitation to such a configuration is not intended.

Optical communication module 21 may be configured to use a pilot current as below. Namely, measurement unit 31 measures a DC level of output current Imon in the synchronous pattern section.

Pilot current generation unit 77 superimposes a pilot current having a current value smaller than amplitude of modulation current Imod on modulation current Imod or bias current Ibias. Pilot current generation unit 77 switches between supply and stop of a pilot current, with a burst optical signal being defined as a unit, for example, for each burst optical signal.

Then, adjustment unit 32 adjusts magnitude of modulation current Imod such that variation in output current Imon corresponding to variation in pilot current attains to a target value.

More specifically, adjustment unit 32 can set a difference between output current Imon at the time when a pilot current is superimposed and output current Imon at the time when a pilot current is not superimposed to $\Delta Vmon$. Magnitude of a pilot current superimposed in one synchronous pattern section is constant.

Namely, in this modification, measurement unit 31 measures a DC level of output current Imon in the synchronous pattern section. Then, pilot current generation unit 77 generates a pilot current having a current value smaller than amplitude of modulation current Imod and switches between supply and stop of a pilot current to a point of influence, with a burst optical signal being defined as a unit.

According to such a configuration, output current Imon itself should only be measured, instead of variation in output current Imon from light-receiving element for monitoring PD, and hence the number of times of sampling of output current Imon can be decreased.

Pilot current generation unit 77 is not limited to such a configuration that switching between supply and stop of a pilot current to a point of influence is made, and it may be configured such that a pilot current to be supplied to a point of influence is varied, specifically, such that a current value for a pilot current to be supplied to a point of influence is increased or decreased, with a burst optical signal being defined as a unit.

A target on which a pilot current is superimposed may be output current Imon. Namely, pilot current generation unit 77 superimposes a pilot current having a current value smaller than amplitude of modulation current Imod on output current Imon. Pilot current generation unit 77 switches between supply and stop of a pilot current, with a burst optical signal being defined as a unit, for example, for each burst optical signal.

Adjustment unit 32 adjusts magnitude of modulation current Imod such that variation in bias current Ibias corresponding to variation in pilot current attains to a target value.

According to such a configuration as well, output current Imon itself should only be measured, instead of variation in output current Imon from light-receiving element for monitoring PD, and hence the number of times of sampling of output current Imon can be decreased.

Since the configuration and the operation are otherwise the same as those of the optical communication module according to the second embodiment, detailed description will not be repeated here.

Another embodiment of the present invention will now be described with reference to the drawings. The same or corresponding elements in the drawings have the same reference characters allotted and description thereof will not be repeated.

Fourth Embodiment

The present embodiment relates to an optical communication module in which an initial value for a modulation current is changed, as compared with the optical communication module according to the first to third embodiments. Features other than contents described below are the same as those of the optical communication module according to the first to third embodiments.

In the optical communication module according to a fourth embodiment of the present invention, feedforward control of an initial value for a modulation current with the use of a look-up table is carried out. Then, when variation in modulation current is made smaller through feedback control of a modulation current as described previously and the modulation current is determined as being stabilized, the look-up table is overwritten with a currently set value for a modulation current as an initial value for a modulation current to be used at a current ambient temperature.

More specifically, for example, CPU 70 contains a temperature sensor for detecting an ambient temperature.

Storage unit 73 stores correspondence between an ambient temperature of optical communication module 21 detected by the temperature sensor and an initial value for modulation current Imod. Specifically, storage unit 73 stores a look-up table showing correspondence between an ambient temperature of optical communication module 21 and an initial value for a modulation current.

APC control unit (initial value updating unit) 72 changes the initial value corresponding to a detected ambient temperature of optical communication module 21 to presently measured amplitude of output current Imon in the correspondence, when an amount of change to presently measured amplitude of output current Imon from amplitude of output current Imon previously measured by measurement unit 31 is smaller than a prescribed value. The amount of change may be defined by a difference or a ratio.

Specifically, while a modulation current is being subjected to feedback control, APC control unit 72 defines a result of measurement of amplitude of output current Imon received from measurement unit 31 as x1, defines a result of measurement of amplitude of output current Imon previously received from measurement unit 31 as x2, and defines a threshold value at which a modulation current is determined as being stabilized as Δx. Then, when relation of Δx>|x1−x2| is satisfied, APC control unit 72 overwrites a look-up table with a control value for a modulation current corresponding to x1 as an initial value for a modulation current to be used at a current ambient temperature. For example, with Δx being set to 0.1 mA, APC control unit 72 rewrites an initial value when a difference in measured value of amplitude of output current Imon is 0.05 mA. Here, threshold value Δx is stored, for example, in storage unit 73.

Thus, in the optical communication module according to the fourth embodiment of the present invention, storage unit 73 stores correspondence between an ambient temperature of optical communication module 21 and an initial value for modulation current Imod. Then, APC control unit 72 changes the initial value corresponding to a detected ambient temperature of optical communication module 21 to presently measured amplitude of output current Imon in the correspondence, when an amount of change to presently measured amplitude of output current Imon from amplitude of output current Imon previously measured by measurement unit 31 is smaller than a prescribed value.

According to such a configuration, a time period required until the modulation current converges to a desired value can be shortened. In addition, a look-up table can address not only change in environmental temperature but also aging.

Since the configuration and the operation are otherwise the same as those of the optical communication module according to the first to third embodiments, detailed description will not be repeated here.

Another embodiment of the present invention will now be described with reference to the drawings. The same or corresponding elements in the drawings have the same reference characters allotted and description thereof will not be repeated.

Fifth Embodiment

The present embodiment relates to an optical communication module in which measurement timing is changed as compared with the optical communication module according to the first to fourth embodiments. Features other than contents described below are the same as those of the optical communication module according to the first to fourth embodiments.

In the optical communication module according to a fifth embodiment of the present invention, timing to measure output current Imon is in a synchronous pattern section (first timing) and in a section in which a modulation current is supplied (second timing).

Figure 21:
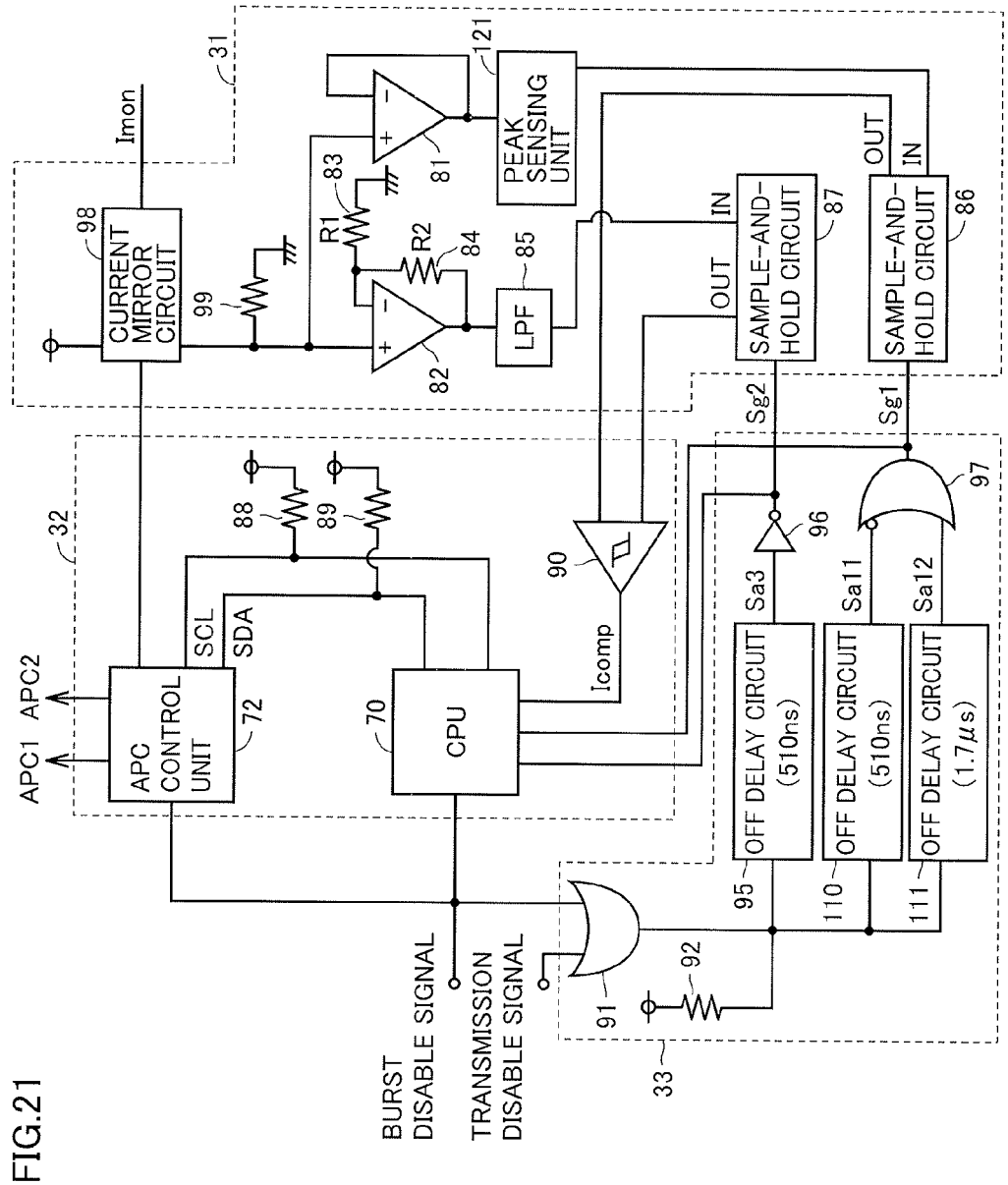
FIG. 21 is a diagram showing one example of a detailed configuration of the measurement unit, the adjustment unit, and the measurement timing setting unit in the optical communication module of the optical network unit according to a fifth embodiment of the present invention.

FIG. 21 is a diagram showing one example of a detailed configuration of the measurement unit, the adjustment unit, and the measurement timing setting unit in the optical communication module of the optical network unit according to the fifth embodiment of the present invention.

Referring to FIG. 21, measurement unit 31 is different from measurement unit 31 shown in FIG. 9 in the configuration of operational amplifiers 81 and 82. In the configuration shown in FIG. 21, operational amplifier 81 operates as a buffer and outputs a light reception voltage converted by resistor 99. Operational amplifier 82 operates as a buffer and amplifies a light reception voltage converted by resistor 99 with a gain determined by resistance values of resistor 83 and resistor 84 and outputs a resultant light reception voltage. Specifically, with a resistance value of resistor 83 being defined as R1 and a resistance value of resistor 84 being defined as R2, operational amplifier 82 outputs a voltage obtained by multiplying a level of the light reception voltage by ((R1+R2)/R1).

Measurement unit 31 is further different from measurement unit 31 shown in FIG. 9 in including a peak sensing unit 121. Peak sensing unit 121 senses a peak level of an output from operational amplifier 81, that is, a light reception voltage. Peak sensing unit 121 outputs a signal indicating the sensed peak level to sample-and-hold circuit 86.

Furthermore, measurement timing setting unit 33 is different from measurement timing setting unit 33 shown in FIG. 9 in including off delay circuits 110 and 111 instead of off delay circuits 93 and 94. Off delay circuits 110 and 111 output signals Sa11 and Sa12 having a falling edge of an output signal from OR gate 91 delayed by 510 ns and 1.7 us and having a logical level thereof inverted. Namely, off delay circuits 110 and 111 are the same in function as off delay circuits 110 and 111 shown in FIG. 13.

OR gate 97 outputs to sample-and-hold circuit 86 and CPU 70, gate signal Sg1 indicating a logical sum of a signal having a logical level of signal Sa11 received from off delay circuit 110 inverted and signal Sa12 received from off delay circuit 111.

Figure 22:
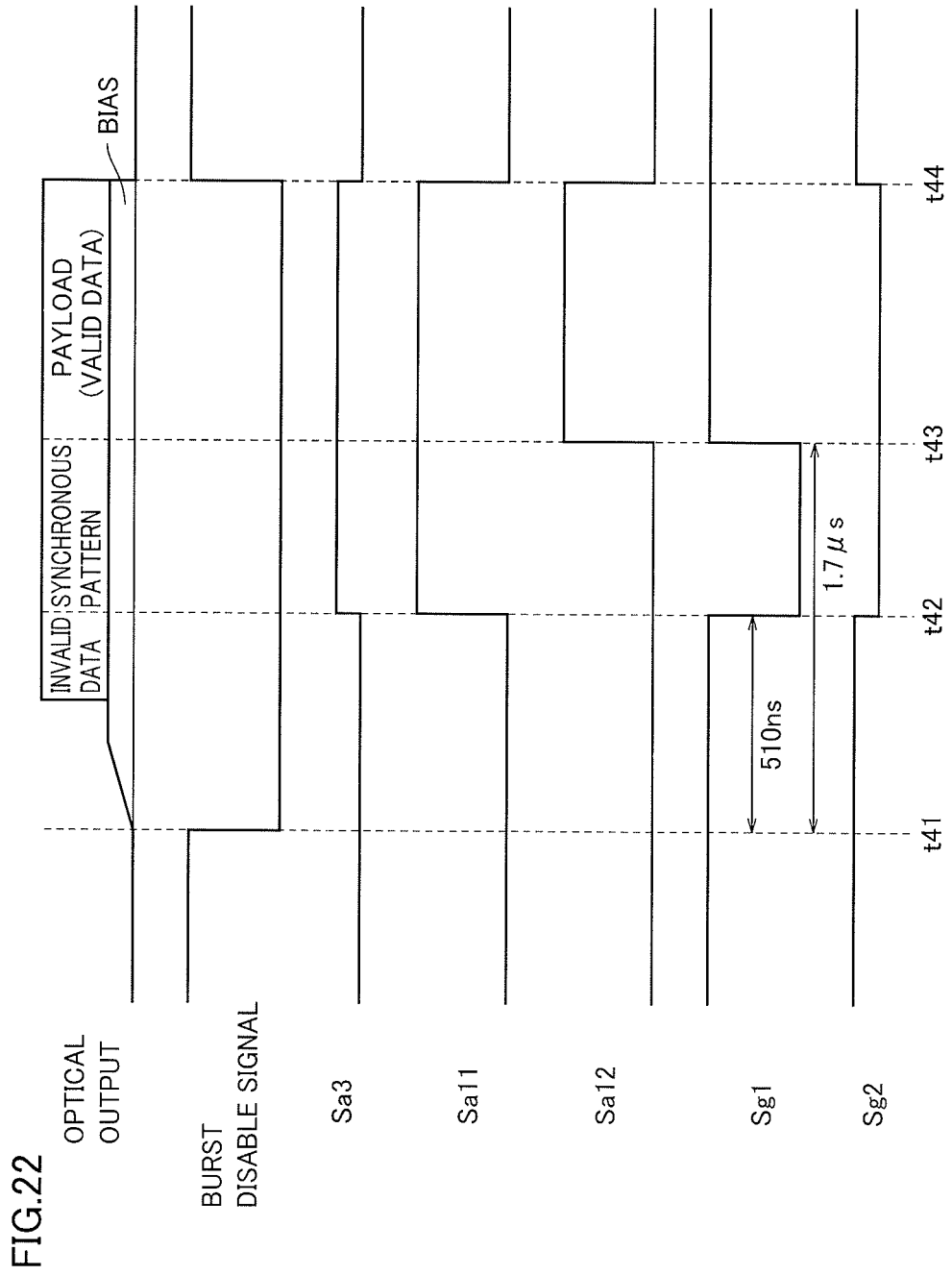
FIG. 22 is a diagram showing one example of a control signal for monitoring in the optical communication module of the optical network unit according to the fifth embodiment of the present invention.

FIG. 22 is a diagram showing one example of a control signal for monitoring in the optical communication module of the optical network unit according to the fifth embodiment of the present invention.

Referring to FIG. 22, a period from timing t41 until timing t42 corresponds to the pre-bias section and the idle pattern section. A period from timing t42 until timing t43 corresponds to the synchronous pattern section. A period from timing t43 until timing t44 corresponds to a section in which a payload which is valid data is transmitted.

Initially, at timing t41, a burst disable signal makes transition from the logic high level to the logic low level. Here, gate signal Sg1 is at the logic high level.

Then, at timing t42 510 ns after timing t41, output signal Sa11 from off delay circuit 110 makes transition from the logic low level to the logic high level. Thus, gate signal. Sg1 makes transition from the logic high level to the logic low level.

Then, at timing t43 1.7 us after timing t41, output signal Sa12 from off delay circuit 111 makes transition from the logic low level to the logic high level. Thus, gate signal Sg1 makes transition from the logic low level to the logic high level.

Then, at timing t44 after timing t43, the burst disable signal makes transition from the logic low level to the logic high level. Thus, output signals Sa11 and Sa12 from off delay circuits 110 and 111 make transition from the logic high level to the logic low level.

Thus, gate signal Sg1 is at the logic high level until timing t42, it is at the logic low level during a period from timing t42 until timing t43, and it is again at the logic high level at timing t43 or later.

Namely, measurement timing setting unit 33 generates gate signal Sg1 indicating timing in the synchronous pattern section.

At timing t42, output signal Sa3 from off delay circuit 95 makes transition from the logic low level to the logic high level. Thus, gate signal Sg2 makes transition from the logic high level to the logic low level.

Then, at timing t44, the burst disable signal makes transition from the logic low level to the logic high level. Thus, output signal Sa3 from off delay circuit 95 makes transition from the logic high level to the logic low level. With transition of output signal Sa3, gate signal Sg2 makes transition from the logic low level to the logic high level.

Thus, gate signal Sg2 is at the logic high level until timing t42, it is at the logic low level during a period from timing t42 until timing t44, and it is again at the logic high level at timing t44 or later.

Namely, measurement timing setting unit 33 generates gate signal Sg2 indicating timing in a section in which valid data (a synchronous pattern and a payload) is transmitted.

Referring back to FIG. 21, sample-and-hold circuit 86 receives gate signal Sg1. When gate signal Sg1 is at the logic low level, sample-and-hold circuit 86 samples a voltage received from peak sensing unit 121 (a peak level of a light reception voltage) and outputs the sampled voltage to comparator 90. Sample-and-hold circuit 86 holds the sampled voltage during a period in which gate signal Sg1 is at the logic high level and outputs the held voltage to comparator 90. Namely, sample-and-hold circuit 86 obtains a voltage value representing a peak level of output current Imon in the synchronous pattern section.

Sample-and-hold circuit 87 receives gate signal Sg2. When gate signal Sg2 is at the logic low level, sample-and-hold circuit 87 samples a voltage which has passed through low-pass filter 85 and outputs the sampled voltage to comparator 90. Sample-and-hold circuit 87 holds the sampled voltage during a period in which gate signal Sg2 is at the logic high level and outputs the held voltage to comparator 90. Namely, sample-and-hold circuit 87 obtains a voltage value representing a DC level of output current Imon in the payload section.

Since adjustment unit 32 is the same in function as adjustment unit 32 according to the first embodiment, detailed description will not be repeated. Namely, adjustment unit 32 adjusts magnitude of a modulation current such that a DC level of output current Imon at the second timing after start of supply of the modulation current is a prescribed number of times (such as 5 times) as high as a peak level of output current Imon at the first timing included in the synchronous pattern section.

As set forth above, in the optical communication module according to the fifth embodiment, first timing to measure output current Imon is included in the synchronous pattern section. A synchronous pattern is a data pattern which is always fixed in each burst optical signal and the maximum number of consecutive bits of the same sign is 6. Therefore, a peak level of a burst optical signal can be monitored in a stable manner.

In the optical communication module according to the fifth embodiment, second timing to measure output current Imon is timing after start of supply of a modulation current. For example, the second measurement timing is included in the payload section. In the payload section, a scrambled signal of 10 Gbps is generated. Namely, a "0" signal and a "1" signal are randomly generated in the payload section. According to a section "76.3.2.3 Scrambler" in IEEE 802.3av™-2009 as well as a related section "49.2.6 Scrambler." in IEEE 802.3av™-2002 and FIG. 49-8, however, a payload signal is generated in accordance with principles the same as those of a PRBS signal generator using a shift register and exclusive OR.

PRBS is characterized by balance between a "0" signal and a "1" signal. Therefore, a DC level of output current Imon in a payload section (the second timing) is estimated to be substantially the same, regardless of alignment of "0" and "1" Therefore, the second timing can be within the payload section. When scramble in the payload section is not ideal scramble, the second timing may be included in the synchronous pattern section. In this case, a configuration the same as the configuration shown in FIG. 13 can be adopted for measurement timing setting unit 33.

As set forth above, according to the fifth embodiment, a peak level of output current Imon is measured in the synchronous pattern section as a section of a prescribed bit string and a DC level of output current Imon is measured at the second timing after the timing of start of supply of a modulation current. Magnitude of a modulation current is adjusted such that a DC level of output current Imon at the second timing is a prescribed number of times (such as 5 times) as high as a peak level of output current Imon at the first timing.

In the synchronous pattern section and the payload section, output current Imon from light-receiving element for monitoring PD is stabilized. Output current Imon is measured at the timing when output current Imon is stabilized and magnitude of a modulation current is adjusted based on measured output current Imon. Thus, a more appropriate value for a modulation current can be set.

In the first embodiment, a bias current in the pre-bias section is measured. As shown in FIG. 6, however, the pre-bias section is short. In addition, a bias current in the pre-bias section is low. In the fifth embodiment, a peak level of output current Imon is measured in the synchronous pattern section. A peak level of the output current in the synchronous pattern section is higher than a bias current in the pre-bias section.

Therefore, by defining a peak level of an output current in the synchronous pattern section as the reference in adjustment of a modulation current, for example, accuracy in A/D conversion in CPU 70 can be enhanced, and hence output current Imon from light-receiving element for monitoring PD after start of supply of a modulation current can appropriately be set.

Furthermore, as shown in FIG. 6, the pre-bias section is a period not long (from 55 ns to 65 ns) after timing is at which light-emitting element LD outputs light. Namely, in the first embodiment, output current Imon from light-receiving element for monitoring PD is measured at relatively early timing after a burst disable signal is set to enable. In contrast, in the fifth embodiment, output current Imon from light-receiving element for monitoring PD is measured at relatively late timing after the burst disable signal is set to enable. Thus, a long response time required of measurement timing setting unit 33 can be set.

The second timing should only be timing after the timing of start of supply of a modulation current. Therefore, the second timing is not limited to timing included in the payload section. The second timing may be included in the synchronous pattern section.

Since the configuration and the operation are otherwise the same as those of the optical communication module according to the first to fourth embodiments, detailed description will not be repeated here.

Another embodiment of the present invention will now be described with reference to the drawings. The same or corresponding elements in the drawings have the same reference characters allotted and description thereof will not be repeated.

Sixth Embodiment

The present embodiment relates to an optical communication module in which timing to measure output current Imon from light-receiving element for monitoring PD is changed, as compared with the optical communication module according to the first to fifth embodiments. Features other than contents described below are the same as those of the optical communication module according to the first to fifth embodiments.

In a sixth embodiment, timing to measure output current Imon is timing from enable of a burst disable signal until start of supply of a modulation current.

Figure 23:
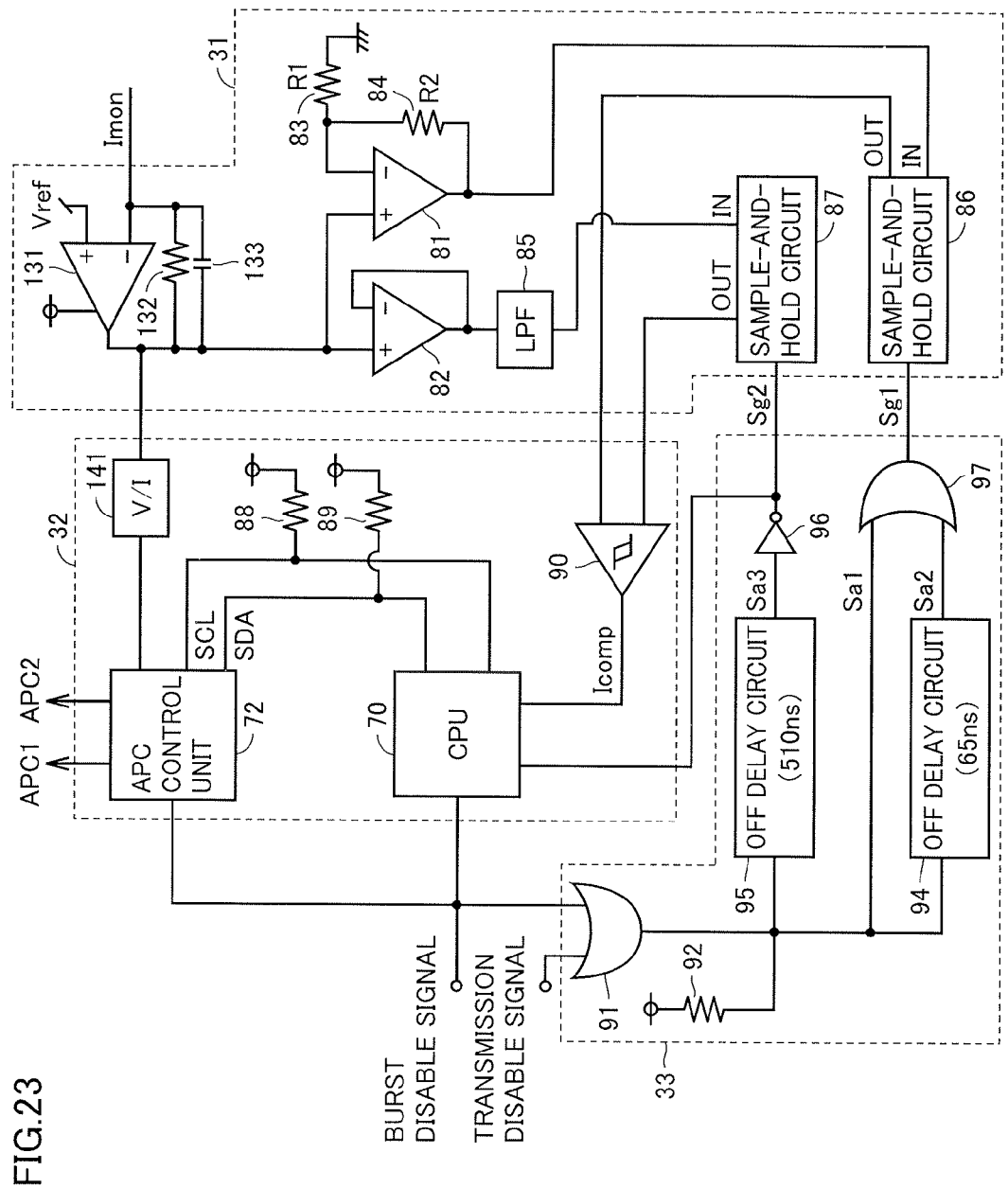
FIG. 23 is a diagram showing one example of a detailed configuration of the measurement unit, the adjustment unit, and the measurement timing setting unit in the optical communication module of the optical network unit according to a sixth embodiment of the present invention.

FIG. 23 is a diagram showing one example of a detailed configuration of the measurement unit, the adjustment unit, and the measurement timing setting unit in the optical communication module of the optical network unit according to the sixth embodiment of the present invention.

Referring to FIG. 23, measurement unit 31 is different from measurement unit 31 shown in FIG. 9 in including an operational amplifier 131, a resistor 132, and a capacitor 133 instead of current mirror circuit 98 and resistor 99.

Operational amplifier 131 is, for example, an operational amplifier of a current feedback type. Operational amplifier 131 has a bandwidth, for example, of 200 MHz.

Resistor 132 is connected between an output terminal of operational amplifier 131 and an inverting input terminal (a − terminal) of operational amplifier 131. Though a resistance value of resistor 132 is not particularly limited, it is set, for example, to 1 kΩ. Resistor 132 is responsible for a function to convert output current Imon from light-receiving element for monitoring PD to a voltage. Namely, resistor 132 implements a current/voltage (I/V) conversion unit.

Capacitor 133 is a capacitor for compensating for a phase, and it is connected to operational amplifier 131 in parallel to resistor 132. Capacitor 133 has a capacitance value, for example, of 0.5 pF.

A non-inverting input terminal (a + terminal) of operational amplifier 131 is connected to a node providing a reference voltage Vref. Though magnitude of reference voltage Vref is not particularly limited, it is set, for example, to 1.3 V. By setting magnitude of reference voltage Vref to 1.3 V, a bias voltage which allows a frequency band of light-receiving element for monitoring PD to sufficiently be ensured can preferably be set.

Operational amplifier 1311, resistor 132, and capacitor 133 have a configuration equivalent to a transimpedance amplifier (TIA).

Measurement timing setting unit 33 is different from measurement timing setting unit 33 shown in FIG. 9 in that off delay circuit 93 is not provided and that signal Sa1 is input to OR gate 97 not through off delay circuit 93.

Adjustment unit 32 is different from adjustment unit 32 shown in FIG. 9 in further including a voltage/current (V/I) conversion unit 141. Voltage/current conversion unit 141 converts an output voltage from operational amplifier 131 (TIA) to a current. Voltage/current conversion unit 141 is not limited to be provided in adjustment unit 32, and it may be provided in measurement unit 31. Voltage/current conversion unit 141 can be implemented, for example, by a constant current circuit.

Figure 24:
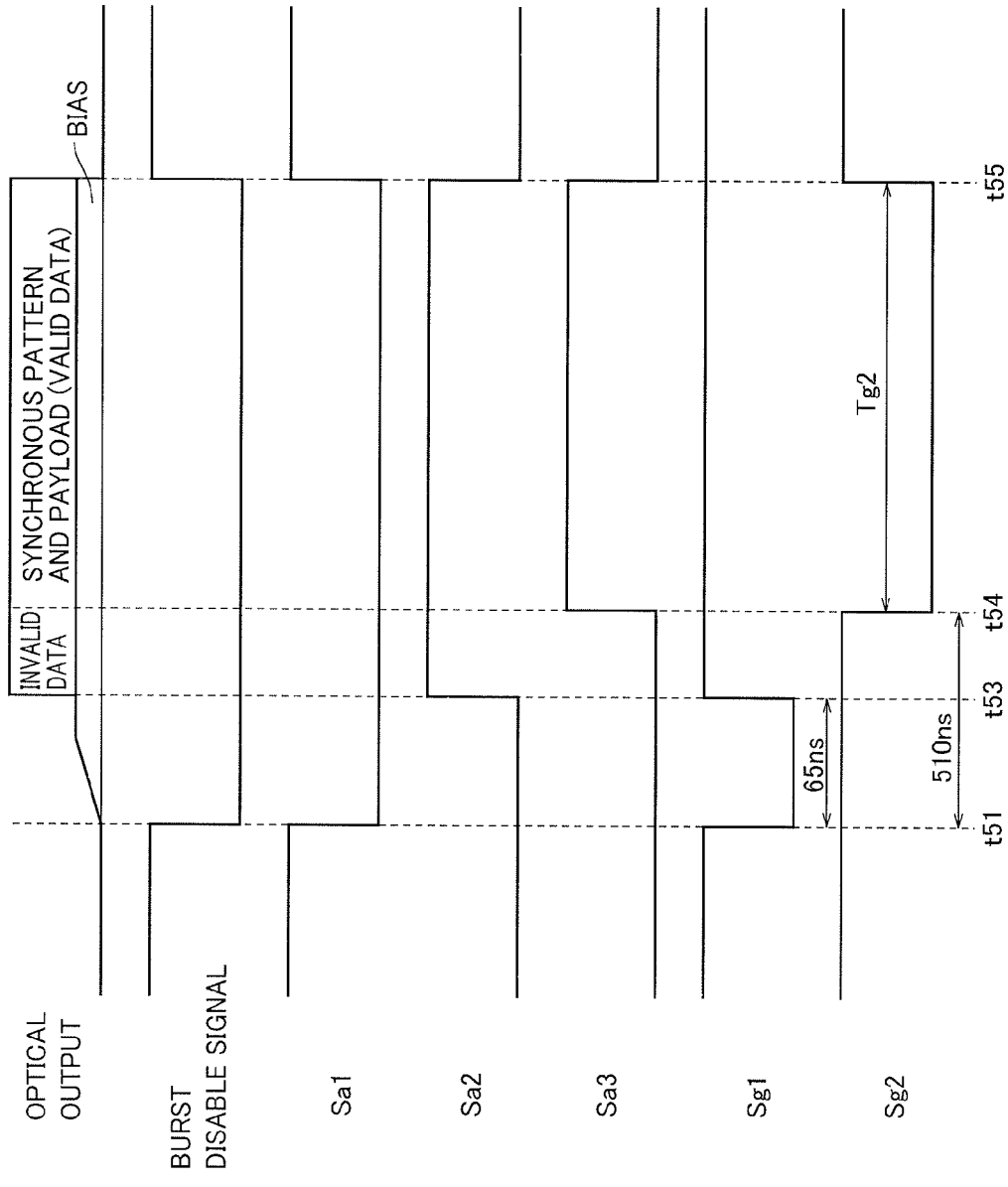
FIG. 24 is a diagram showing one example of a control signal for monitoring in the optical communication module of the optical network unit according to the sixth embodiment of the present invention.

FIG. 24 is a diagram showing one example of a control signal for monitoring in the optical communication module of the optical network unit according to the sixth embodiment of the present invention.

Referring to FIG. 24, a period from timing t51 until timing t53 corresponds to the pre-bias section. A period from timing t53 until timing t54 corresponds to a section in which an idle pattern which is invalid data is transmitted. A period from timing t54 until timing t55 (Tg2) corresponds to a section in which a synchronous pattern and a payload which are valid data are transmitted.

Initially, at timing t51, a burst disable signal makes transition from the logic high level to the logic low level. Similarly, signal Sa1 makes transition from the logic high level to the logic low level. With transition of signal Sa1, gate signal Sg1 makes transition from the logic high level to the logic low level at timing t51.

Then, at timing t53 65 ns after timing t51, output signal Sa2 from off delay circuit 94 makes transition from the logic low level to the logic high level. Thus, gate signal Sg1 makes transition from the logic low level to the logic high level.

At timing t54 510 ns after timing t51, output signal Sa3 from off delay circuit 95 makes transition from the logic low level to the logic high level. Thus, gate signal Sg2 makes transition from the logic high level to the logic low level.

Then, at timing t55 after timing t54, the burst disable signal makes transition from the logic low level to the logic high level. Thus, signal Sa1 makes transition from the logic low level to the logic high level at timing t55. Furthermore, output signals Sat and Sa3 from off delay circuits 94 and 95, respectively, make transition from the logic high level to the logic low level at timing t55.

Thus, gate signal Sg1 is at the logic low level during a period from timing t51 until timing t53 and it is at the logic high level at timing t53 or later. Timing t51 is the timing when the burst disable signal is set to enable, that is, the timing when an instruction for permitting transmission of the burst optical signal is issued. Timing t53 is the timing when supply of a modulation current is started.

Namely, measurement timing setting unit 33 generates gate signal Sg1 indicating timing after an instruction for permitting transmission of the burst optical signal is issued and within a prescribed time period before the timing of start of supply of a modulation current.

Gate signal. Sg2 is at the logic high level until timing t54, it is at the logic low level during a period from timing t54 until timing t55, and it is again at the logic high level at timing t55 or later.

Namely, measurement timing setting unit 33 generates gate signal Sgt indicating timing in a section in which valid data (a synchronous pattern and a payload) is transmitted. This gate signal Sg2 corresponds to a signal indicating timing after start of supply of a modulation current.

Referring back to FIG. 23, in the sixth embodiment, output current Imon from light-receiving element for monitoring PD is converted to a voltage by using the configuration including an operational amplifier (TIA). Thus, even when a pre-bias section of a burst optical signal is short, output current Imon from light-receiving element for monitoring PD can appropriately be sampled.

Figure 25:
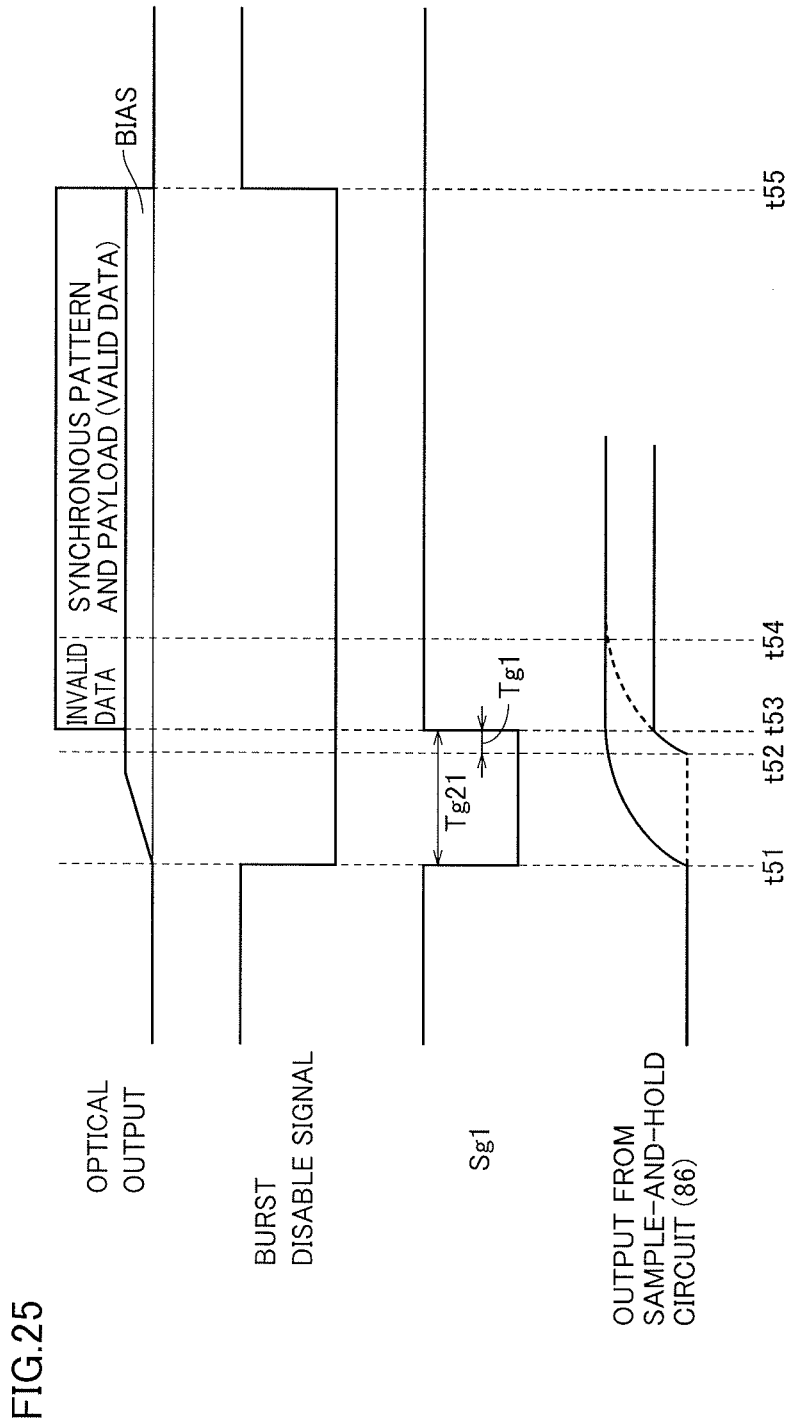
FIG. 25 is a diagram for illustrating relation between a period during which a gate signal is at a logic low level and an output voltage from a sample-and-hold circuit 86.

FIG. 25 is a diagram for illustrating relation between a period during which gate signal Sg1 is at the logic low level and an output voltage from sample-and-hold circuit 86. Referring to FIG. 25, in the sixth embodiment, gate signal Sg1 is at the logic low level during a period from timing t51 until timing t53 (a period Tg21 shown in FIG. 25). In contrast, in the first embodiment, gate signal Sg1 is at the logic low level during period Tg1 from timing t52 until timing t53. Timing t52 corresponds to timing t12 shown in FIG. 10. Therefore, period Tg1 has a length, for example, around 10 ns.

When a period during which gate signal Sg1 is at the logic low level is period Tg1, a time period for an output voltage from sample-and-hold circuit 86 to rise is short. Therefore, as shown in FIG. 25, it is possible that output current Imon from light-receiving element PD is sampled while an output voltage from sample-and-hold circuit 86 has not sufficiently risen.

On the other hand, in the six embodiment, a period during which gate signal Sg1 is at the logic low level is period Tg21. A length of period Tg21 is, for example, around 65 ns, which is longer than a length of period Tg1 (for example, around 10 ns).

From timing t51, voltage Vref is input to operational amplifier 131. Namely, from the time point when transmission of a burst optical signal is permitted, voltage Vref is input to the TIA. At the rise of an output voltage from the TIA, voltage Vref is dominant. Thus, a bias settling section (a period from timing is until timing tpbs shown in FIG. 6) can be shortened. Even when a pre-bias section of a burst optical signal is short, output current Imon from light-receiving element for monitoring PD can appropriately be sampled.

Furthermore, the sixth embodiment is different from the first to fifth embodiments in a configuration for outputting to APC control unit 72, output current Imon from light-receiving element for monitoring PD.

APC control unit 72 converts a current input from voltage/current conversion unit 141 to a voltage. APC control unit 72 compares the resultant voltage and the reference voltage with each other and generates control data APC2. APC control unit 72 creates control data APC2 such that intensity of an optical signal output from light-emitting element LD is constant. Namely, control data APC2 represents average power of light-emitting element LD.

In the first to fifth embodiments, a current from current mirror circuit 98 is input to APC control unit 72. Current mirror circuit 98 generates and outputs a mirror current corresponding to output current Imon from light-receiving element for monitoring PD. In general, a current mirror circuit includes a transistor. According to the first to fifth embodiments, a differential resistance value of a transistor constituting a current mirror circuit may affect a time constant.

Figure 26:
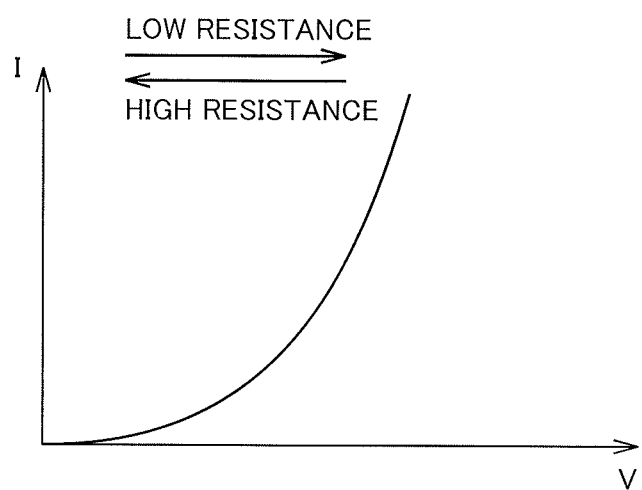
FIG. 26 is a graph for illustrating a differential resistance value of a transistor forming a current mirror.

FIG. 26 is a graph for illustrating a differential resistance value of a transistor forming a current mirror. Referring to FIG. 26, the abscissa in the graph represents a voltage (V) of a transistor constituting a current mirror and the ordinate in the graph represents a current (I) which flows through the transistor.

A differential resistance value Rd is represented by dV/dI. As voltage V increases, a transistor is turned on. Thus, differential resistance value Rd is made smaller. Therefore, response of the transistor becomes faster. When voltage V is lowered, differential resistance value Rd increases and response becomes slower.

According to the sixth embodiment, an output current from light-receiving element for monitoring PD is converted to a voltage by the TIA. Then, the resultant voltage is converted to a current by voltage/current conversion unit 141. Thus, a frequency band for monitoring output current from light-receiving element for monitoring PD can be broadened. Namely, output current Imon having a higher frequency can be monitored.

An output current from voltage/current conversion unit 141 is used for sensing average power of light-emitting element LD and controlling output power from light-emitting element LD in APC control unit 72. For example, a frequency band of voltage/current conversion unit 141 may be narrow. For example, a frequency band of voltage/current conversion unit 141 may be approximately from 10 to 20 MHz, although limitation thereto is not intended.

Since the configuration and the operation are otherwise the same as those of the optical communication module according to the first to fifth embodiments, detailed description will not be repeated here. Therefore, operational amplifier 131, resistor 132, and capacitor 133 shown in FIG. 23 can be applied to the second to fifth embodiments, instead of current mirror circuit 98. Furthermore, in this case, such a configuration that an output voltage from operational amplifier 131 is converted to a current by voltage/current conversion unit 141 and the resultant current is input to APC control unit 72 can be adopted.

Output current Imon from light-receiving element for monitoring PD reflects intensity of backward light from light-emitting element LD, which is sensed by light-receiving element for monitoring PD. Current Imon is susceptible to manufacturing variation. For example, it is assumed that a DC current varies in a range from 100 µA to 1000 µA. Here, for example, when a desired extinction ratio is 7 [dB], an amount of output current corresponding to a level of pre-bias is ⅓ of the DC current above. Therefore, an amount of output current corresponding to a level of pre-bias is from 33 µA to 333 µA.

In consideration of such variation, for example, the following configuration can be adopted. Initially, resistor 132 may be a variable resistor. In this case, for example, CPU 70 adjusts a resistance value of resistor 132 based on output current Imon from light-receiving element for monitoring PD. Thus, individual variation such as a dynamic range of light-receiving element for monitoring PD can be accommodated and an extinction ratio can be adjusted.

In the configuration shown in FIG. 9, operational amplifier 81 amplifies a light reception voltage converted by resistor 99 with a gain determined by resistance values of resistor 83 and resistor 84 and outputs the light reception voltage. Namely, operational amplifier 81 amplifies an input voltage such that an output voltage is a certain number of times as high as an input voltage. Instead of this configuration, operational amplifier 82 may amplify an input voltage such that an output voltage is a certain number of times as high as an input voltage. Depending on a circuit in a subsequent stage, which of two configurations above is to be adopted can be determined.

In the configurations shown in FIGS. 9, 13, 17, and 20, levels of two voltage signals are compared with each other by a comparator or an operational amplifier. A result of comparison is sent to CPU 70. Two voltage signals, however, may be input to CPU 70. In this case, CPU 70 calculates a ratio between two voltage signals and should only control an extinction ratio such that the ratio is constant. According to this configuration, even when a difference in level between two voltage signals is relatively large, an extinction ratio can be controlled.

FIG. 27 illustrates an off delay circuit including an RC circuit constituted of a resistor and a capacitor. The configuration of the off delay circuit, however, is not limited as shown in FIG. 27. For example, a measurement timing setting unit may include an off delay circuit including a digital delay line element.

In the embodiment above, a delay circuit (an off delay circuit) causes delay only when a burst disable signal is turned off. Namely, when a burst disable signal changes from disable to enable, an output signal from the off delay circuit is delayed. When a burst disable signal makes transition from enable to disable, an output signal from the off delay circuit is not delayed. Depending on a method of setting measurement timing, however, delay can be caused also when a burst disable signal is turned on, by combining the burst disable signal and a delay signal thereof with each other.

Figure 28:
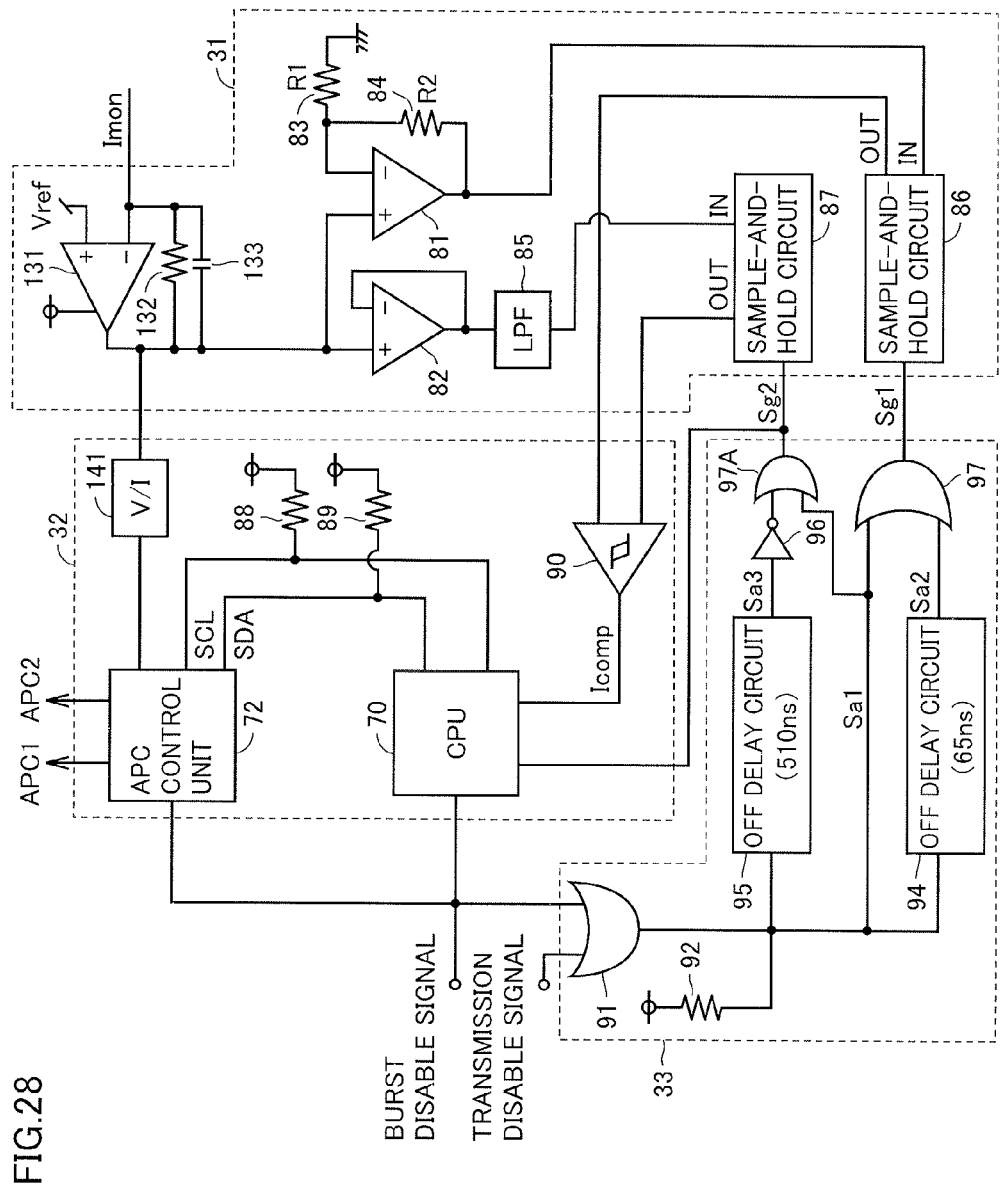
FIG. 28 is a diagram showing a configuration of a first modification of the optical communication module in the optical network unit according to the sixth embodiment of the present invention.

FIG. 28 is a diagram showing a configuration of a first modification of the optical communication module in the optical network unit according to the six embodiment of the present invention. Referring to FIGS. 23 and 28, measurement timing setting unit 33 is different from the configuration shown in FIG. 23 in further including an OR gate 97A in the configuration shown in FIG. 28. OR gate 97A outputs as gate signal Sg2, a signal indicating a logical sum of signal Sa1 and an output signal from NOT gate 96 (a signal having a logical level of signal Sa3 inverted). Gate signal Sg2 is input to sample-and-hold circuit 87 and input to CPU 70.

For the sake of convenience of subsequent description, in the configuration shown in FIG. 28, off delay circuits 94 and 95 cause delay during both of off and on of a burst enable signal.

Figure 29:
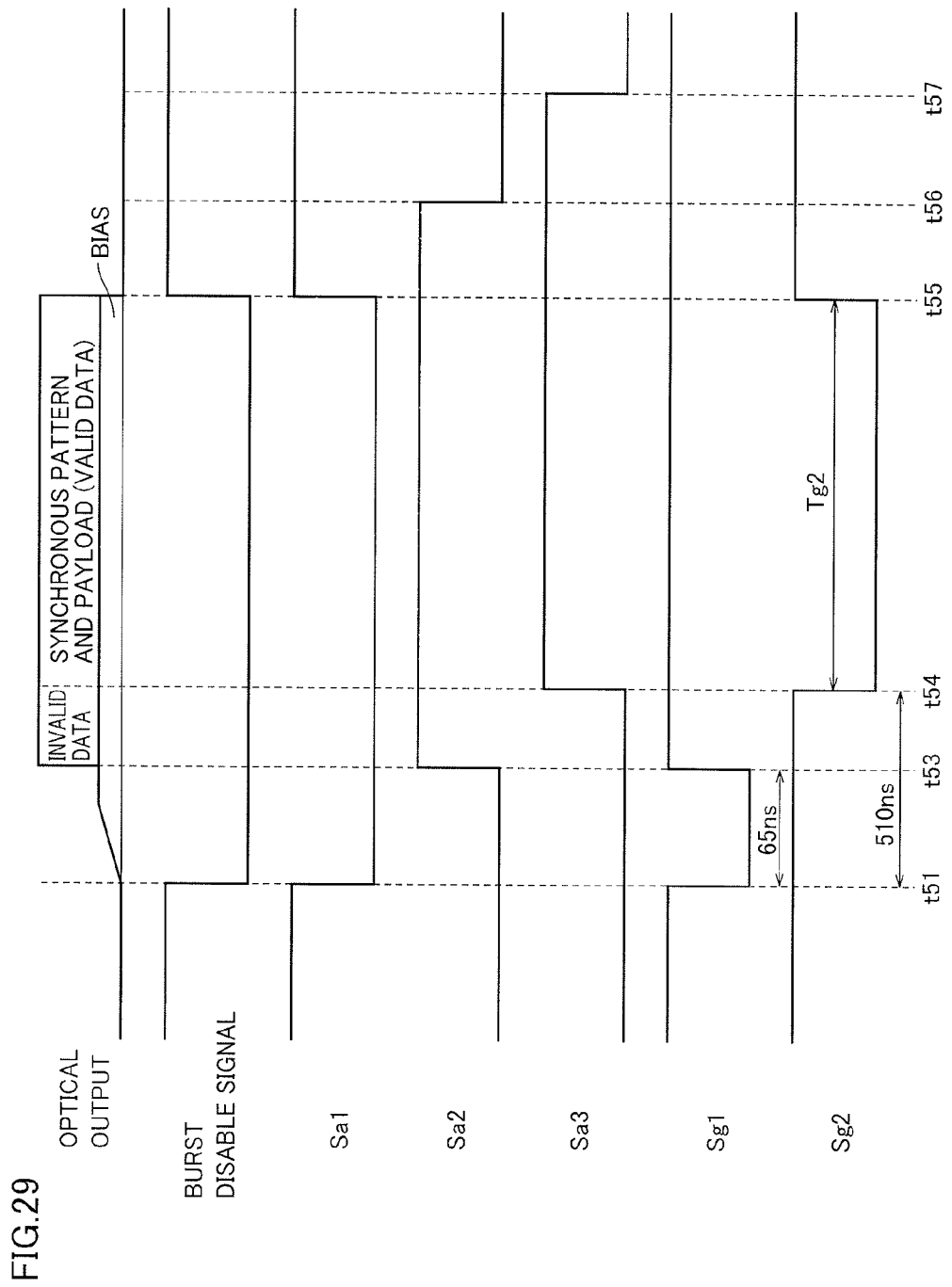
FIG. 29 is a timing chart for illustrating an operation of the measurement timing setting unit shown in FIG. 28.

FIG. 29 is a timing chart for illustrating an operation of the measurement timing setting unit shown in FIG. 28. FIG. 29 is compared with FIG. 24. As shown in FIG. 29, signal Sa2 makes transition from the logic high level to the logic low level at timing t56 later than timing t55. Signal Sa3 makes transition from the logic high level to the logic low level at timing t57 later than timing t56.

A section from timing t55 until timing t56 is a section comparable to a section from timing t51 until timing t53. A section from timing t51 until timing t54 is a section comparable to a section from timing t55 until timing t57.

OR gate 97 outputs gate signal Sg1 indicating a logical sum of signal Sa1 and signal Sa2. At timing t55 or later, signal Sa1 is at the logic high level. Therefore, even when signal Sa2 is at any of the logic high level and the logic low level at timing t55 or later, signal Sg1 is at the logic high level.

OR gate 97A outputs gate signal Sg2 indicating a logical sum of signal Sa1 and a signal having a logical level of signal Sa3 inverted. As set forth above, at timing t55 or later, signal Sa1 is at the logic high level. Therefore, even when signal Sa3 is at any of the logic high level and the logic low level at timing t55 or later, signal Sg2 is at the logic high level.

Namely, FIGS. 24 and 29 are the same in timing of transition of gate signals Sg1 and Sg2. Therefore, according to the configuration of measurement timing setting unit 33 shown in FIG. 28, even when signals Sa2 and Sa3 are delayed at the time when a burst disable signal is turned on, there can be no influence on gate signals Sg1 and Sg2.

Figure 30:
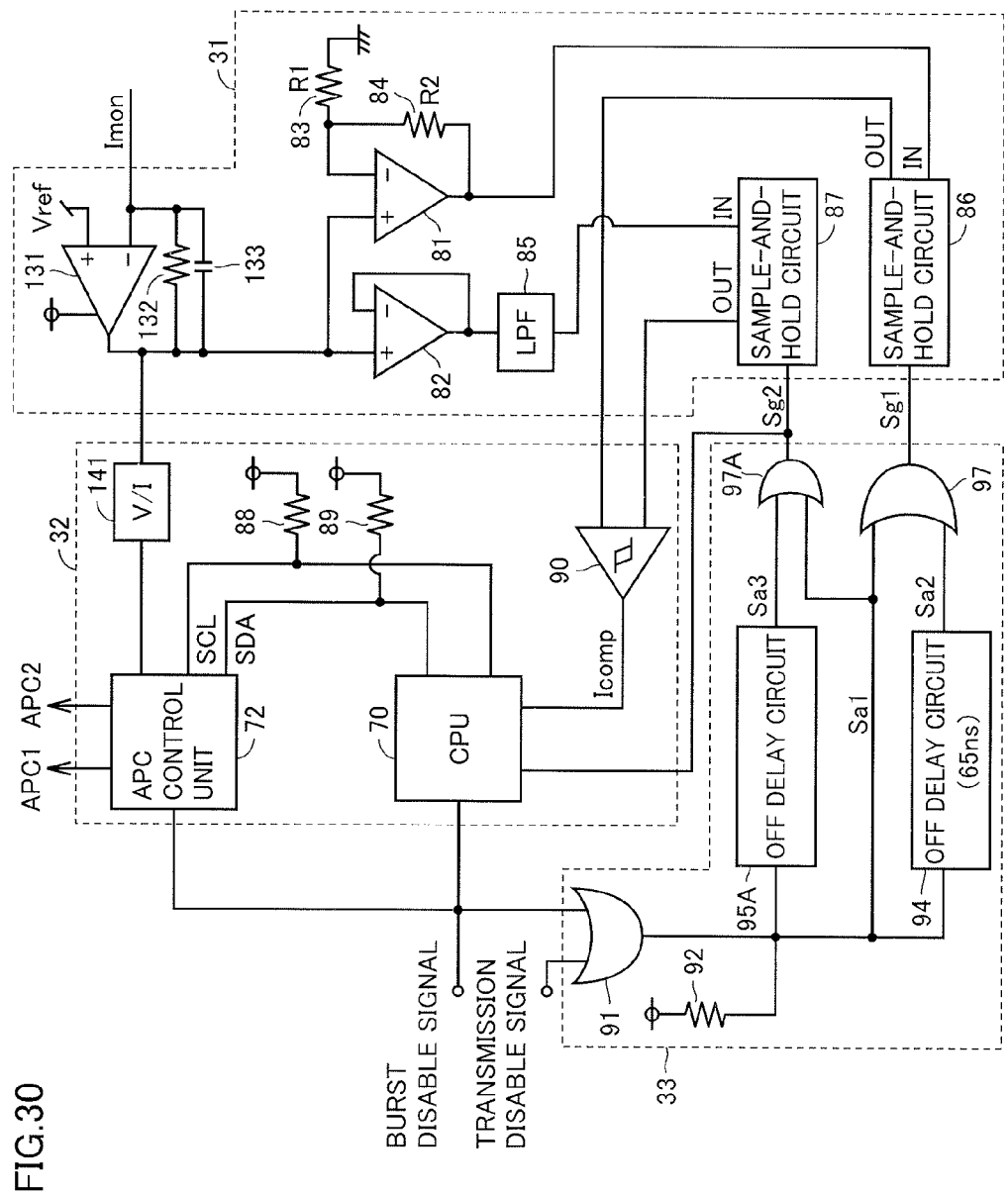
FIG. 30 is a diagram showing a configuration of a second modification of the optical communication module in the optical network unit according to the sixth embodiment of the present invention.

FIG. 30 is a diagram showing a configuration of a second modification of the optical communication module in the optical network unit according to the six embodiment of the present invention. Referring to FIGS. 23 and 30, measurement timing setting unit 33 is different from the configuration shown in FIG. 23 in including an off delay circuit 95A instead of off delay circuit 95, further including OR gate 97A, and not including NOT gate 96 in the configuration shown in FIG. 30. The configuration shown in FIG. 30 is different from the configuration shown in FIG. 28 in not including NOT gate 96. Off delay circuit 95A is a delay circuit generating measurement timing from an output signal from OR gate 91, which is a control signal, similarly to off delay circuit 95.

Figure 31:
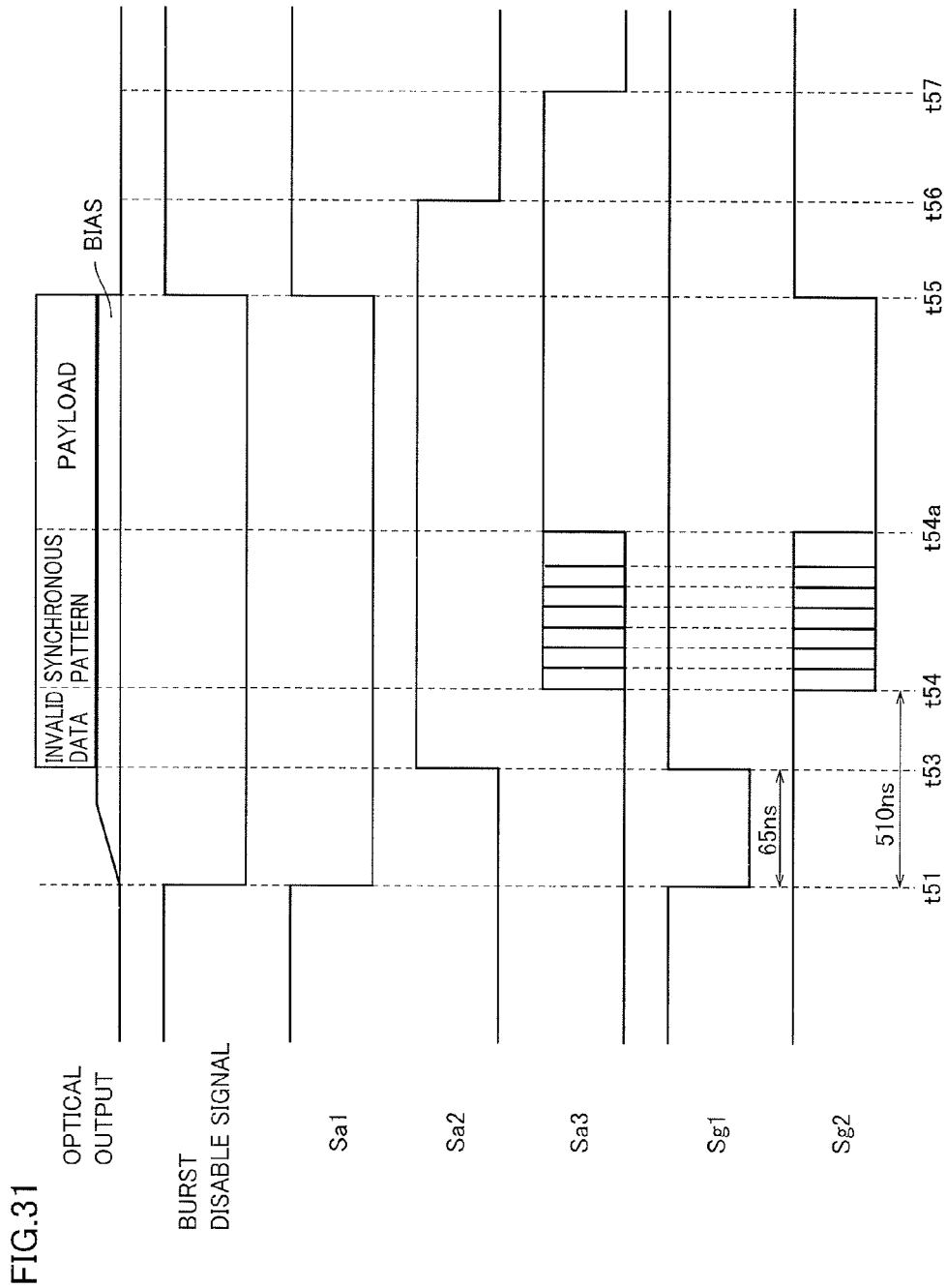
FIG. 31 is a timing chart for illustrating an operation of the measurement timing setting unit shown in FIG. 30.

FIG. 31 is a timing chart for illustrating an operation of the measurement timing setting unit shown in FIG. 30. FIG. 31 is compared with FIG. 29. Therefore, detailed description of a unit common to that in FIG. 29 will not be repeated.

A period from timing t54 until timing t54a corresponds to the synchronous pattern section. A period from timing t54a until timing t55 corresponds to a section in which a payload is transmitted.

OR gate 97 outputs gate signal Sg1 indicating a logical sum of signal Sa1 and signal Sa2. Therefore, during a section from timing t51 until timing t53, gate signal Sg1 is at the logic low level. At timing t51 or earlier and at timing t53 or later, gate signal Sg1 is at the logic high level.

OR gate 97A outputs gate signal Sg2 indicating a logical sum of signal Sa1 and signal Sa3. Signal Sa1 is at the logic low level in a section from timing t51 until timing t55. Signal Sa3 makes transition from the logic low level to the logic high level after a prescribed delay time elapses since a time point of transition of a burst disable signal from the logic high level to the logic low level (timing t51). Therefore, a length of a section in which signal Sa3 is at the logic low level is dependent on a delay time of off delay circuit 95A.

In one example, a delay time of off delay circuit 95A is set such that signal Sa3 makes transition from the logic low level to the logic high level within a section from timing t54 until timing t54a, that is, within the synchronous pattern section. In response to transition of signal Sa3 from the logic low level to the logic high level, gate signal Sg2 makes a transition from the logic low level to the logic high level. Namely, measurement timing setting unit 33 generates gate signal Sg2 indicating timing in the synchronous pattern section.

A delay time of off delay circuit 95A may be set such that signal Sa3 makes transition from the logic low level to the logic high level in a section from timing t54 until timing t55. In this case, measurement timing setting unit 33 generates gate signal Sg2 indicating timing in a section including the synchronous pattern section and the payload section. Namely, measurement timing setting unit 33 generates gate signal Sg2 indicating timing after start of supply of a modulation current. For example, a delay time of off delay circuit 95A may be set such that signal Sa3 makes transition from the logic low level to the logic high level in a period between timing t54a and timing t55. In this case, measurement timing setting unit 33 generates gate signal Sg2 indicating timing in the payload section.

As set forth above, in the sixth embodiment, gate signal Sg2 is at the logic low level in a section from timing t51 until the timing after start of supply of a modulation current (for example, timing within the synchronous pattern section or the timing within the payload section). In this section, an output voltage from sample-and-hold circuit 87 has sufficiently risen. Therefore, a DC level of output current Imon from light-receiving element for monitoring PD can more accurately be monitored.

Another embodiment of the present invention will now be described with reference to the drawings. The same or corresponding elements in the drawings have the same reference characters allotted and description thereof will not be repeated.

Seventh Embodiment

The present embodiment relates to an optical communication module in which timing to measure output current Imon is added, as compared with the optical communication module according to each embodiment above. Features other than contents described below are the same as those of the optical communication module according to each embodiment.

In the present embodiment, timing to measure output current Imon includes non-transmission timing within a period in which a burst disable signal is activated (a period of a disable state), in addition to the measurement timing in each embodiment above. Namely, in this embodiment, output current Imon is measured not only at the measurement timing in each embodiment above but also at non-transmission timing at which no burst optical signal is transmitted. According to such a configuration, a more appropriate value for a modulation current can be set.

Figure 32:
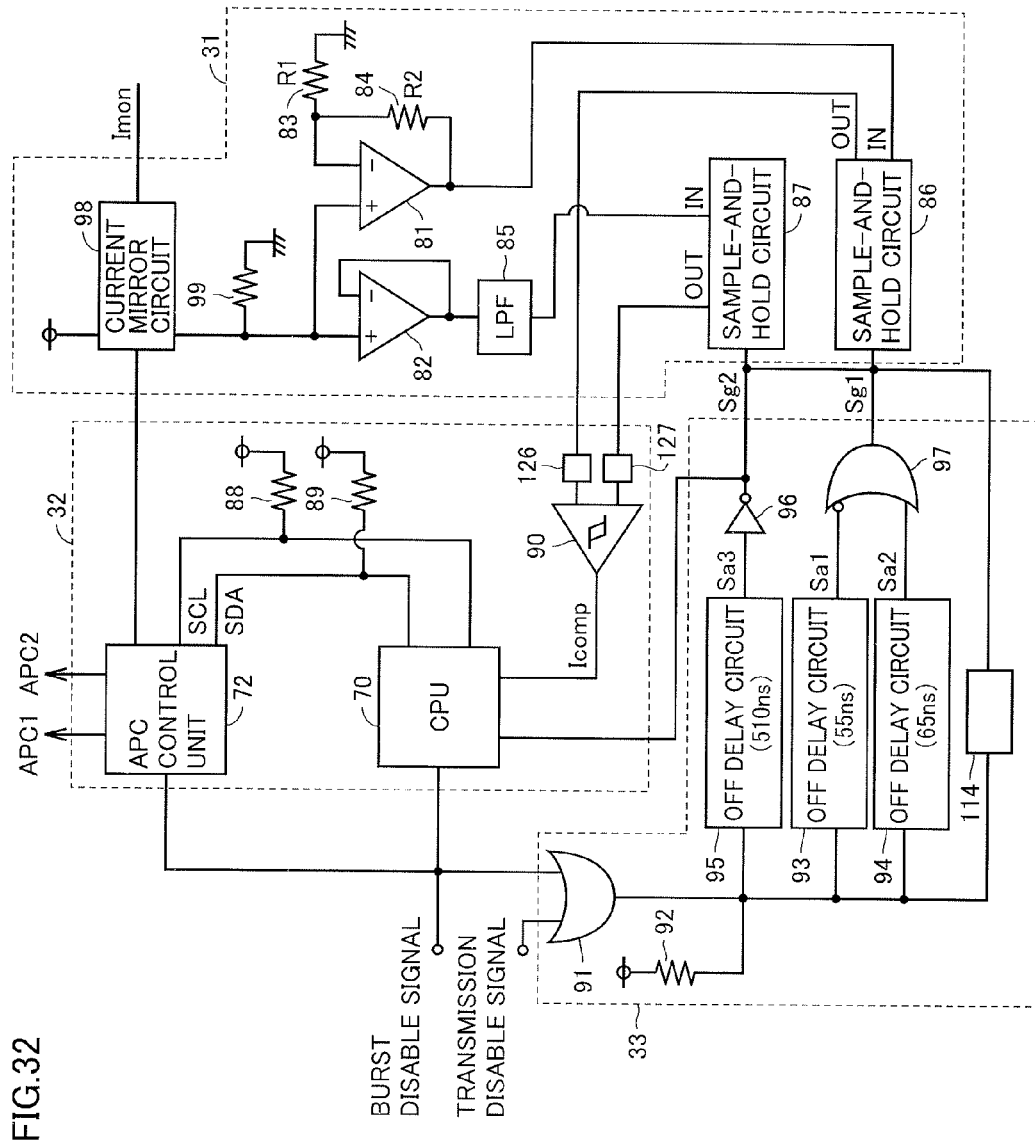
FIG. 32 is a diagram showing one example of a detailed configuration of the measurement unit, the adjustment unit, and the measurement timing setting unit in the optical communication module of the optical network unit according to a seventh embodiment of the present invention.

FIG. 32 is a diagram showing one example of a detailed configuration of the measurement unit, the adjustment unit, and the measurement timing setting unit in the optical communication module of the optical network unit according to a seventh embodiment of the present invention. Referring to FIGS. 9 and 32, measurement timing setting unit 33 further includes a timing generation circuit 114. The seventh embodiment is different in this regard from the first embodiment.

Adjustment unit 32 includes offset adjustment circuits 126 and 127. The seventh embodiment is different in this regard from the first embodiment.

Timing generation circuit 114 sets gate signals Sg1 and Sg2 to the logic low level at prescribed timing within a period in which a burst disable signal is activated. A configuration of timing generation circuit 114 is not particularly limited, and for example, timing generation circuit 114 may set gate signals Sg1 and Sg2 to the logic low level only during a period set by a timer. In another example, timing generation circuit 114 may be configured similarly to a circuit constituted of off delay circuits 93 and 94 and OR gate 97.

When gate signal Sg1 is at the logic low level, sample-and-hold circuit 86 samples a voltage received from operational amplifier 81 and outputs the sampled voltage to offset adjustment circuit 126. Offset adjustment circuit 126 obtains a value for an output voltage from sample-and-hold circuit 86 as an offset value, and holds the offset value. Similarly, when gate signal Sg2 is at the logic low level, sample-and-hold circuit 87 samples a voltage which has passed through low-pass filter 85 and outputs the sampled voltage to offset adjustment circuit 127. Offset adjustment circuit 127 obtains a value for an output voltage from sample-and-hold circuit 87 as an offset value and holds the offset value.

A voltage output from operational amplifier 81 and a voltage which has passed through low-pass filter 85 reflect output current Imon from light-receiving element for monitoring PD. Namely, each of offset adjustment circuits 126 and 127 calculates an offset value based on output current Imon from light-receiving element for monitoring PD measured at timing at which no burst optical signal is transmitted (non-transmission timing).

The offset values held by offset adjustment circuits 126 and 127 are reflected on an operation in feedback control in adjustment unit 32 as offset values for light-receiving element for monitoring PD or measurement unit 31. For example, measurement unit 31 measures output current Imon at first timing after the timing of start of supply of a bias current and within a prescribed time period before the timing of start of supply of a modulation current. Sample-and-hold circuit 86 outputs a voltage corresponding to a measured value of output current Imon. Offset adjustment circuit 126 subtracts an offset value held in advance from this value for a voltage and outputs the resultant voltage value to comparator 90.

Similarly, measurement unit 31 measures output current Imon at second timing after the timing of start of supply of a modulation current. Sample-and-hold circuit 87 outputs a voltage corresponding to a measured value of output current Imon. Offset adjustment circuit 127 subtracts an offset value held in advance from this value for a voltage and outputs the resultant voltage value to comparator 90.

As in the first embodiment, comparator 90 compares a voltage received from sample-and-hold circuit 86 and a voltage received from sample-and-hold circuit 87 with each other. Comparator 90 outputs signal Icomp indicating a result of comparison to CPU 70. CPU 70 controls (adjusts) magnitude of a modulation current based on an output voltage from comparator 90. Since input power of comparator 90 is a voltage from which an offset value has been removed, a more appropriate value for a modulation current can be set.

Figure 33:
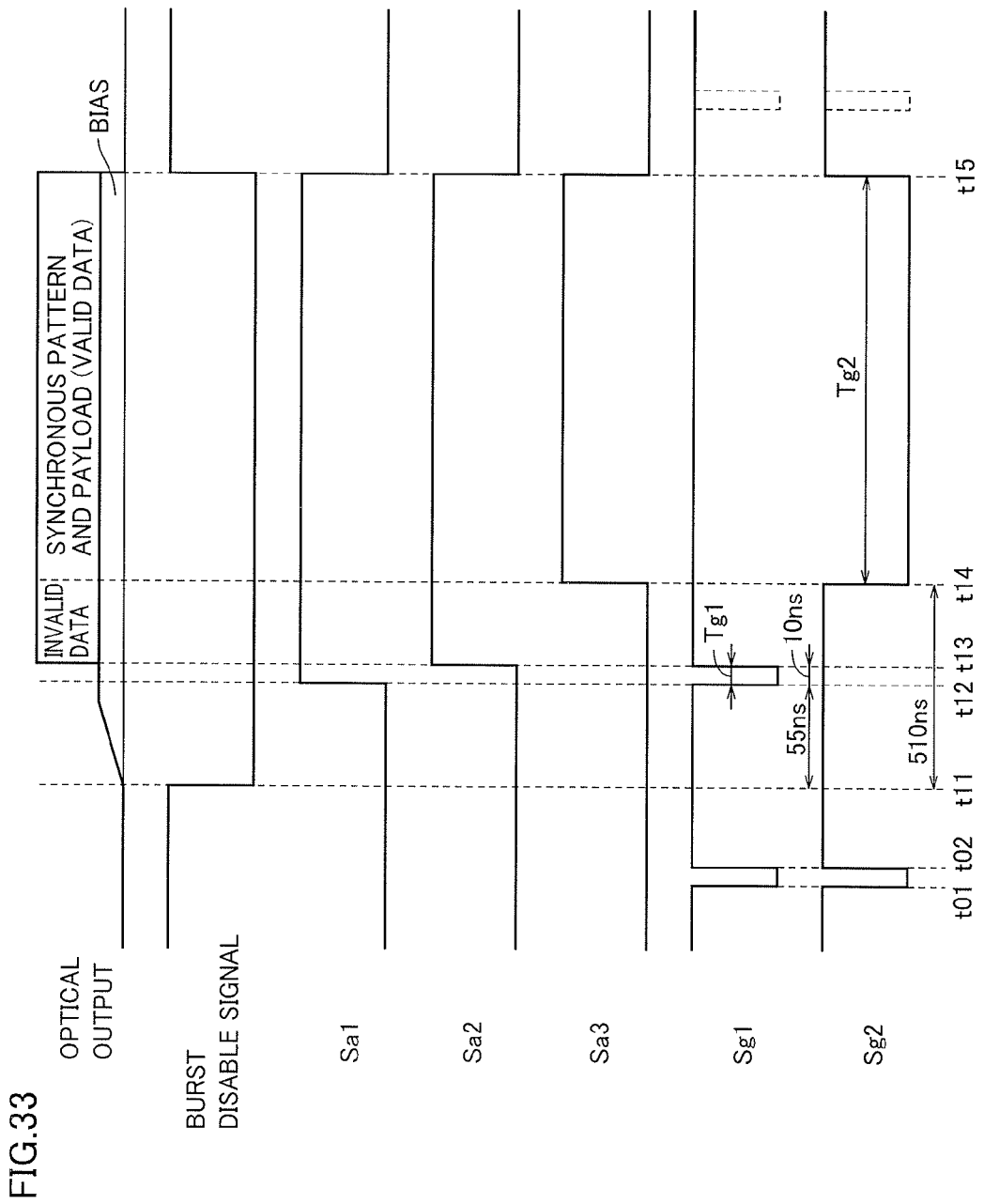
FIG. 33 is a diagram showing one example of a control signal for monitoring in the optical communication module of the optical network unit according to the seventh embodiment of the present invention.

FIG. 33 is a diagram showing one example of a control signal for monitoring in the optical communication module of the optical network unit according to the seventh embodiment of the present invention. Referring to FIG. 33, at timing t11 or earlier and at timing t15 or later, a burst disable signal is activated and set to the logic high level. Namely, the burst disable signal is in a disable state (see FIG. 5). In this case, bias current supply circuit 68 does not operate and no bias current is generated. Therefore, no burst optical signal is transmitted during a non-transmission period at timing t11 or earlier and at timing t15 or later. In FIG. 33, timing at timing t11 or earlier and timing at timing t15 or later correspond to non-transmission timing.

A period from timing t01 until timing t02 is a period before timing t11. Therefore, a burst disable signal is in a disable state. During a period from timing t01 until timing t02, timing generation circuit 114 sets gate signals Sg1 and Sg2 both to the logic low level. Therefore, each of sample-and-hold circuits 86 and 87 samples an input voltage. Offset adjustment circuits 126 and 127 calculate offset values from voltages sampled in sample-and-hold circuits 86 and 87 and hold the offset values, respectively.

Since an operation of measurement unit 31, adjustment unit 32, and measurement timing setting unit 33 at timing t11 or later is the same as each operation in the first embodiment, detailed description will not be repeated. During a period from timing t12 until timing t13, gate signal Sg1 is at the logic low level. During this period, sample-and-hold circuit 86 samples a voltage received from operational amplifier 81 and outputs the sampled voltage to offset adjustment circuit 126. Offset adjustment circuit 126 subtracts an offset value held in advance from an output voltage from sample-and-hold circuit 86 and outputs the resultant voltage value to comparator 90.

During a period from timing t14 until timing t15, gate signal Sg2 is at the logic low level. During this period, sample-and-hold circuit 87 samples a voltage which has passed through low-pass filter 85 and outputs the sampled voltage to offset adjustment circuit 127. Offset adjustment circuit 127 subtracts an offset value held in advance from an output voltage from sample-and-hold circuit 87 and outputs the resultant voltage value to comparator 90.

An offset value is not limited to that obtained before start of supply of a bias current (before "the first measurement timing" above). As shown in FIG. 33, an offset value may be obtained after end of supply of a bias current (at timing t15 or later). In this case as well, offset adjustment circuit 126 can subtract an offset value from a voltage value obtained at the first measurement timing and output the resultant voltage value to comparator 90. Similarly, offset adjustment circuit 127 can subtract an offset value from a voltage value obtained at second measurement timing and output the resultant voltage value to comparator 90.

A part used for measurement unit 31 may have high temperature dependency of an input/output offset. Such high temperature dependency of an input/output offset may bring about temperature dependency of an extinction ratio to be controlled.

As set forth above, according to the seventh embodiment, when a burst disable signal is activated (in a disable state), a value for an output current is sampled and that level is reflected as an offset value on an operation for feedback control in an adjustment unit. According to this embodiment, temperature dependency of an input/output offset of parts used for measurement unit 31 in a measured value for output current Imon can be cancelled. Therefore, temperature dependency of a value for an extinction ratio to be controlled can be mitigated. Thus, a more appropriate value for a modulation current can be set at each temperature.

The configuration of the optical communication module according to the seventh embodiment is not limited to the configuration shown in FIG. 32. For example, in the optical communication module according to each embodiment above, timing generation circuit 114 may be added to measurement timing setting unit 33 and an offset adjustment circuit similar to offset adjustment circuit 126 or 127 may be added to an input side of a comparator of adjustment unit 32.

In each embodiment above, a synchronous pattern section is adopted as a "section of a prescribed bit string." An end of burst (FOB) section (see FIG. 6), however, may be adopted as the "section of a prescribed bit string." Namely, measurement unit 31 may measure a DC level of output current Imon at the first timing included in the EOB section. As described on page 114 of IEEE 802.3av-2009, a signal in the EOB section is a signal in which "1010" is repeated. Therefore, the EOB section can be included in the "section of a prescribed bit string."

Since the pattern of "1010" is repeated in the EOB section, a mark ratio can further be stabilized as compared with the synchronous pattern section. Therefore, a DC level of output current Imon can be obtained in a more stable manner.

It should be understood that the embodiments are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

15, 16, 155 N-type transistor; 17 filter circuit; 18 differential drive circuit; 21 optical communication module; 22 PON reception processing unit; 23 buffer memory; 24 UN transmission processing unit; 25 UNI port; 26 UN reception processing unit; 27 buffer memory; 28 PON transmission processing unit; 29 control unit; 31 measurement unit; 32 adjustment unit; 33 measurement timing setting unit; 42 current source; 51 drive circuit; 61 preamplifier; 62 pilot signal generation circuit; 63 output buffer circuit (modulation current supply circuit); 64, 66 power supply; 67 timing circuit; 68 bias current supply circuit; 69 master I/F (interface); 70 CPU; 71 slave I/F; 72 APC control unit (initial value updating unit); 73 storage unit; 75 light-emitting circuit; 77 pilot current generation unit; 78, 79 inductor; 81, 82, 131 operational amplifier; 11, 12, 13, 14, 83, 84, 88, 89, 92, 99, 102, 105, 106, 109, 132, 152, 154 resistor; 85, 113 low-pass filter; 86, 87, 104 sample-and-hold circuit; 90, 107 comparator; 91, 97, 108, 112 OR gate; 96 NOT gate; 98, 101 current mirror circuit; 93, 94, 95, 95A, 110, 111 off delay circuit; 103 amplitude sensing unit; 114 timing generation circuit; 121 peak sensing unit; 126, 127 offset adjustment circuit; 133, 153 capacitor; 141 voltage/current conversion unit; 151 diode; 201 optical line terminal; 202A, 202B, 202C, 202D ONU; 301 PON system; PD light-receiving element for monitoring; LD light-emitting element; SP1, SP2 splitter; and OPTF optical fiber.

The invention claimed is:

1. An optical communication module, comprising:
a modulation current supply circuit for supplying to a light-emitting element for transmitting a burst optical signal, a modulation current having magnitude in accordance with a logical value of data to be transmitted;
a light-receiving element for monitoring, for outputting an output current in accordance with intensity of light received from said light-emitting element;
a measurement unit for measurement of the output current from said light-receiving element for monitoring at set measurement timing;
an adjustment unit for adjusting magnitude of said modulation current based on a result of the measurement of said output current by said measurement unit; and
a measurement timing setting unit for setting said measurement timing based on a control signal for controlling transmission of said burst optical signal,
said measurement unit including a sample-and-hold circuit sampling said output current or a value corresponding to said output current within said measurement timing set by said measurement timing setting unit and holding a sampled value outside said measurement timing,
said measurement timing setting unit including a delay circuit generating said measurement timing from said control signal, and
said measurement timing being included at least in part in a prescribed section in which said modulation current is not supplied to said light-emitting element.

2. The optical communication module according to claim 1, further comprising a bias current supply circuit for supplying a bias current to said light-emitting element, wherein
said modulation current supply circuit starts supply of said modulation current after said bias current supply circuit starts supply of said bias current, and
said measurement timing is timing after timing of start of supply of said bias current and within a prescribed time period before timing of start of supply of said modulation current.

3. The optical communication module according to claim 2, wherein
said measurement timing is first timing after the timing of start of supply of said bias current and within the prescribed time period before the timing of start of supply of said modulation current and second timing after the timing of start of supply of said modulation current.

4. The optical communication module according to claim 1, further comprising a bias current supply circuit for supplying a bias current to said light-emitting element, wherein
said bias current supply circuit stops supply of said bias current after said modulation current supply circuit stops supply of said modulation current, and
said measurement timing is timing after timing of stop of supply of said modulation current and within a prescribed time period before timing of stop of supply of said bias current.

5. The optical communication module according to claim 4, wherein
said measurement timing is first timing after the timing of stop of supply of said modulation current and within the prescribed time period before the timing of stop of supply of said bias current and second timing before the timing of stop of supply of said modulation current.

6. The optical communication module according to claim 3, wherein
said measurement unit measures a DC level of said output current, and
said adjustment unit adjusts magnitude of said modulation current such that a DC level of said output current measured at said second timing is a prescribed number of times as high as a DC level of said output current measured at said first timing.

7. An optical communication module, comprising:
a modulation current supply circuit for supplying to a light-emitting element for transmitting a burst optical signal, a modulation current having magnitude in accordance with a logical value of data to be transmitted;
a light-receiving element for monitoring, for outputting an output current in accordance with intensity of light received from said light-emitting element;
a measurement unit for measurement of the output current from said light-receiving element for monitoring at set measurement timing;
an adjustment unit for adjusting magnitude of said modulation current based on a result of the measurement of said output current by said measurement unit; and
a measurement timing setting unit for setting said measurement timing based on a control signal for controlling transmission of said burst optical signal,
said measurement unit including a sample-and-hold circuit sampling said output current or a value corresponding to said output current within said measurement timing set by said measurement timing setting unit and holding a sampled value outside said measurement timing,
said measurement timing setting unit including a delay circuit generating said measurement timing from said control signal, and
said measurement timing being included at least in part in a section of a fixed bit string in said burst optical signal.

8. The optical communication module according to claim 7, wherein
said measurement unit measures amplitude of said output current in said section, and
said adjustment unit adjusts magnitude of said modulation current such that said amplitude measured by said measurement unit attains to a target value.

9. The optical communication module according to claim 7, further comprising a pilot current generation unit for generating a pilot current lower than said modulation current and superimposing generated said pilot current on a point of influence influencing said output current, wherein
said adjustment unit adjusts magnitude of said modulation current based on relation between said point of influence and a result of measurement by said measurement unit.

10. The optical communication module according to claim 9, further comprising a bias current supply circuit for supplying a bias current to said light-emitting element, wherein
said adjustment unit further adjusts magnitude of said bias current based on a result of measurement of said output current by said measurement unit,
said measurement unit further measures said bias current,
said pilot current generation unit superimposes said pilot current on said output current as said point of influence, and
said adjustment unit adjusts magnitude of said modulation current such that variation in said bias current corresponding to variation in said output current attains to a target value.

11. The optical communication module according to claim 9, further comprising a bias current supply circuit for supplying a bias current to said light-emitting element, wherein
said pilot current generation unit superimposes said pilot current on said bias current as said point of influence, and
said adjustment unit adjusts magnitude of said modulation current such that variation in said output current corresponding to variation in said pilot current attains to a target value.

12. The optical communication module according to claim 9, wherein
said pilot current generation unit superimposes said pilot current on said modulation current as said point of influence, and
said adjustment unit adjusts magnitude of said modulation current such that variation in said output current corresponding to variation in said pilot current attains to a target value.

13. The optical communication module according to claim 9, wherein
said measurement unit measures amplitude of said output current in said section, and
said pilot current generation unit generates a pilot current having a frequency lower than a modulation rate of said burst optical signal and having amplitude smaller than amplitude of said modulation current by a prescribed ratio or higher.

14. The optical communication module according to claim 13, wherein
the frequency of said pilot current is higher than a reciprocal of a length of said section.

15. The optical communication module according to claim 9, wherein
said measurement unit measures a DC level of said output current in said section, and
said pilot current generation unit generates a pilot current having a current value smaller than amplitude of said modulation current and varies a current value of said pilot current supplied to said point of influence, with said burst optical signal being defined as a unit.

16. The optical communication module according to claim 7, wherein
said measurement timing is first timing included in the section of said fixed bit string in said burst optical signal and second timing after timing of start of supply of said modulation current.

17. The optical communication module according to claim 16, wherein
said measurement unit measures a peak level of said output current in the section of said prescribed bit string at said first timing and measures a DC level of said output current in a section of a payload at said second timing, and
said adjustment unit adjusts magnitude of said modulation current such that said DC level of said output current measured at said second timing is a prescribed number of times as high as said peak level of said output current measured at said first timing.

18. The optical communication module according to claim 1, further comprising:
a bias current supply circuit for supplying a bias current to said light-emitting element; and
a current/voltage conversion unit converting said output current to a voltage, wherein
said measurement unit measures said output current by measuring an output voltage from said current/voltage conversion unit.

19. The optical communication module according to claim 18, wherein
said modulation current supply circuit starts supply of said modulation current after said bias current supply circuit starts supply of said bias current, and
said measurement timing is timing after timing of issuance of an instruction for permitting transmission of said burst optical signal and within a prescribed time period before timing of start of supply of said modulation current.

20. The optical communication module according to claim 18, wherein
said measurement timing is first timing after timing of start of supply of said bias current and within a prescribed time period before timing of start of supply of said modulation current and second timing after the timing of start of supply of said modulation current.

21. The optical communication module according to claim 18, further comprising a voltage/current conversion unit converting the voltage from said current/voltage conversion unit to a second output current, wherein
said adjustment unit adjusts magnitude of said bias current based on said second output current from said voltage/current conversion unit.

22. The optical communication module according to claim 1, further comprising a storage unit for storing information representing a ratio between magnitude of said output current and magnitude of said modulation current, wherein
said adjustment unit adjusts magnitude of said modulation current by using said information.

23. The optical communication module according to claim 1, further comprising:
a storage unit for storing correspondence between an ambient temperature of said optical communication module and an initial value for said modulation current; and
an initial value updating unit for changing said initial value corresponding to the detected ambient temperature of said optical communication module to currently measured amplitude of said output current in said correspondence when an amount of change to currently measured amplitude of said output current from amplitude of said output current previously measured by said measurement unit is smaller than a prescribed value.

24. An optical communication module, comprising:
a modulation current supply circuit for supplying to a light-emitting element for transmitting a burst optical signal, a modulation current having magnitude in accordance with a logical value of data to be transmitted;

a light-receiving element for monitoring, for outputting an output current in accordance with intensity of light received from said light-emitting element;

a measurement unit for measurement of the output current from said light-receiving element for monitoring at set measurement timing;

an adjustment unit for adjusting magnitude of said modulation current based on a result of the measurement of said output current by said measurement unit; and a measurement timing setting unit for setting said measurement timing based on a control signal for controlling transmission of said burst optical signal, said measurement unit including a sample-and-hold circuit sampling said output current or a value corresponding to said output current within said measurement timing set by said measurement timing setting unit and holding a sampled value outside said measurement timing, said measurement timing setting unit including a delay circuit generating said measurement timing from said control signal, and said measurement timing including non-transmission timing at which said burst optical signal is not transmitted.

25. The optical communication module according to claim 24, wherein said adjustment unit obtains an offset value for said light-receiving element for monitoring or said measurement unit based on said output current measured at said non-transmission timing, and adjusts magnitude of said modulation current by using said offset value.

26. An optical network unit for transmitting and receiving an optical signal to and from an optical line terminal, comprising:

a light-emitting element for transmitting a burst optical signal;

a modulation current supply circuit for supplying to said light-emitting element, a modulation current having magnitude in accordance with a logical value of data to be transmitted;

a light-receiving element for monitoring, for outputting an output current in accordance with intensity of light received from said light-emitting element;

a measurement unit for measurement of the output current from said light-receiving element for monitoring at set measurement timing;

an adjustment unit for adjusting magnitude of said modulation current based on a result of the measurement of said output current by said measurement unit;

a measurement timing setting unit for setting said measurement timing; and a control unit for controlling an optical communication module including at least said light-emitting element and said light-receiving element for monitoring, said control unit outputting a control signal for controlling transmission of said burst optical signal to said optical communication module, said measurement timing setting unit setting said measurement timing based on said control signal, said measurement unit including a sample-and-hold circuit sampling said output current or a value corresponding to said output current within said measurement timing set by said measurement timing setting unit and holding a sampled value outside said measurement timing, said measurement timing setting unit including a delay circuit generating said measurement timing from said control signal, and said measurement timing being included at least in part in a prescribed section in which said modulation current is not supplied to said light-emitting element.

27. An optical network unit for transmitting and receiving an optical signal to and from an optical line terminal, comprising:

a light-emitting element for transmitting a burst optical signal;

a modulation current supply circuit for supplying to said light-emitting element, a modulation current having magnitude in accordance with a logical value of data to be transmitted;

a light-receiving element for monitoring, for outputting an output current in accordance with intensity of light received from said light-emitting element;

a measurement unit for measurement of the output current from said light-receiving element for monitoring at set measurement timing;

an adjustment unit for adjusting magnitude of said modulation current based on a result of the measurement of said output current by said measurement unit;

a measurement timing setting unit for setting said measurement timing; and a control unit for controlling an optical communication module including at least said light-emitting element and said light-receiving element for monitoring, said control unit outputting a control signal for controlling transmission of said burst optical signal to said optical communication module, said measurement timing setting unit setting said measurement timing based on said control signal, said measurement unit including a sample-and-hold circuit sampling said output current or a value corresponding to said output current within said measurement timing set by said measurement timing setting unit and holding a sampled value outside said measurement timing, said measurement timing setting unit including a delay circuit generating said measurement timing from said control signal, and said measurement timing being included at least in part in a section of a fixed bit string in said burst optical signal.

28. A method of controlling a light-emitting element, comprising the steps of:

setting measurement timing to measure an output current from a light-receiving element for monitoring, which outputs a current in accordance with intensity of light received from a light-emitting element for transmitting a burst optical signal, based on a delay circuit and a control signal for controlling transmission of said burst optical signal;

measuring said output current at said measurement timing;

sampling said output current or a value corresponding to said output current within said set measurement timing and holding a sampled value outside said measurement timing; and adjusting, by an adjustment unit, magnitude of a modulation current which is to be supplied to said light-emitting element and has magnitude in accordance with a logical value of data to be transmitted, based on a result of measurement of said output current, said measurement timing being included at least in part in a prescribed section in which said modulation current is not supplied to said light-emitting element.

29. A method of controlling a light-emitting element, comprising the steps of:
setting measurement timing to measure an output current from a light-receiving element for monitoring, which outputs a current in accordance with intensity of light received from a light-emitting element for transmitting a burst optical signal, based on a delay circuit and a control signal for controlling transmission of said burst optical signal;
measuring said output current at said measurement timing;
sampling said output current or a value corresponding to said output current within said set measurement timing and holding a sampled value outside said measurement timing; and
adjusting, by an adjustment unit, magnitude of a modulation current which is to be supplied to said light-emitting element and has magnitude in accordance with a logical value of data to be transmitted, based on a result of measurement of said output current,
said measurement timing being included at least in part in a section of a fixed bit string in said burst optical signal.

30. An optical network unit for transmitting and receiving an optical signal to and from an optical line terminal, comprising:
a light-emitting element for transmitting a burst optical signal;
a modulation current supply circuit for supplying to said light-emitting element, a modulation current having magnitude in accordance with a logical value of data to be transmitted;
a light-receiving element for monitoring, for outputting an output current in accordance with intensity of light received from said light-emitting element;
a measurement unit for measurement of the output current from said light-receiving element for monitoring at set measurement timing;
an adjustment unit for adjusting magnitude of said modulation current based on a result of the measurement of said output current by said measurement unit;
a measurement timing setting unit for setting said measurement timing; and
a control unit for controlling an optical communication module including at least said light-emitting element and said light-receiving element for monitoring,
said control unit outputting a control signal for controlling transmission of said burst optical signal to said optical communication module,
said measurement timing setting unit setting said measurement timing based on said control signal,
said measurement unit including a sample-and-hold circuit sampling said output current or a value corresponding to said output current within said measurement timing set by said measurement timing setting unit and holding a sampled value outside said measurement timing,
said measurement timing setting unit including a delay circuit generating said measurement timing from said control signal, and
said measurement timing including non-transmission timing at which said burst optical signal is not transmitted.

31. A method of controlling a light-emitting element, comprising the steps of:

setting measurement timing to measure an output current from a light-receiving element for monitoring, which outputs a current in accordance with intensity of light received from a light-emitting element for transmitting a burst optical signal, based on a delay circuit and a control signal for controlling transmission of said burst optical signal;
measuring said output current at said measurement timing;
sampling said output current or a value corresponding to said output current within said set measurement timing and holding a sampled value outside said measurement timing; and
adjusting, by an adjustment unit, magnitude of a modulation current which is to be supplied to said light-emitting element and has magnitude in accordance with a logical value of data to be transmitted, based on a result of measurement of said output current,
said measurement timing including non-transmission timing at which said burst optical signal is not transmitted.

32. The optical communication module according to claim 1, wherein
said burst optical signal has a bit rate higher than 2.5 gigabits/second.

33. The optical communication module according to claim 1, wherein
said burst optical signal has a bit rate higher than a speed of response of said measurement unit to said output current.

34. The optical network unit according to claim 26, wherein
said burst optical signal has a bit rate higher than 2.5 gigabits/second.

35. The optical network unit according to claim 26, wherein
said burst optical signal has a bit rate higher than a speed of response of said measurement unit to said output current.

36. The method of controlling a light-emitting element according to claim 28, wherein
said burst optical signal has a bit rate higher than 2.5 gigabits/second.

37. The method of controlling a light-emitting element according to claim 28, wherein
said burst optical signal has a bit rate higher than a speed of response of a measurement unit to said output current.

38. The optical communication module according to claim 24, wherein
said burst optical signal has a bit rate higher than 2.5 gigabits/second.

39. The optical communication module according to claim 24, wherein
said burst optical signal has a bit rate higher than a speed of response of said measurement unit to said output current.

40. The optical network unit according to claim 27, wherein
said burst optical signal has a bit rate higher than 2.5 gigabits/second.

41. The optical network unit according to claim 27, wherein
said burst optical signal has a bit rate higher than a speed of response of said measurement unit to said output current.

42. The method of controlling a light-emitting element according to claim 29, wherein said burst optical signal has a bit rate higher than 2.5 gigabits/second.

43. The method of controlling a light-emitting element according to claim 29, wherein
said burst optical signal has a bit rate higher than a speed of response of a measurement unit to said output current.

44. The optical network unit according to claim 30, wherein
said burst optical signal has a bit rate higher than 2.5 gigabits/second.

45. The optical network unit according to claim 30, wherein
said burst optical signal has a bit rate higher than a speed of response of said measurement unit to said output current.

46. The method of controlling a light-emitting element according to claim 31, wherein
said burst optical signal has a bit rate higher than 2.5 gigabits/second.

47. The method of controlling a light-emitting element according to claim 31, wherein
said burst optical signal has a bit rate higher than a speed of response of a measurement unit to said output current.

* * * * *